United States Patent
Yu et al.

(10) Patent No.: US 11,637,569 B2
(45) Date of Patent: Apr. 25, 2023

(54) APPARATUS AND METHOD FOR POLAR CODING AND DECODING FOR CHANNELS ASSOCIATED WITH COMPLEMENTARY INDEX SETS

(71) Applicant: Huawei Technologies Co., Ltd., Shenzhen (CN)

(72) Inventors: Tianhang Yu, Hangzhou (CN); Gongzheng Zhang, Hangzhou (CN); Rong Li, Hangzhou (CN); Zhaoyang Zhang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/378,140

(22) Filed: Jul. 16, 2021

(65) Prior Publication Data
US 2021/0344355 A1   Nov. 4, 2021

Related U.S. Application Data

(63) Continuation of application No. PCT/CN2019/127801, filed on Dec. 24, 2019.

(30) Foreign Application Priority Data

Jan. 17, 2019 (CN) .......................... 201910044760.5

(51) Int. Cl.
*H03M 13/13* (2006.01)
*H03M 13/00* (2006.01)
*H04L 1/00* (2006.01)

(52) U.S. Cl.
CPC .......... *H03M 13/13* (2013.01); *H04L 1/0057* (2013.01)

(58) Field of Classification Search
CPC ............................ H03M 13/13; H04L 1/0057
See application file for complete search history.

(56) References Cited

U.S. PATENT DOCUMENTS 10,666,391 B2   5/2020   Xu et al.
10,958,374 B2 *  3/2021  Wang .................... H04L 1/0057
(Continued)

FOREIGN PATENT DOCUMENTS

| CN | 108365921 A | 8/2018 |
| CN | 108650053 A | 10/2018 |

(Continued)

OTHER PUBLICATIONS

"3rd Generation Partnership Project; Technical Specification Group Radio Access Network; NR; Multiplexing and channel coding (Release 15)," 3GPP TS 38.212 V15.4.0, Dec. 2018, 100 pages.
(Continued)

*Primary Examiner* — Justin R Knapp
(74) *Attorney, Agent, or Firm* — Slater Matsil, LLP

(57) ABSTRACT

This application provides a polar coding method, a polar decoding method, and an apparatus. A transmit end obtains K to-be-coded bits and an index set including K polar channels, where a value set of K1 indexes in the set of the K indexes or a value set of K2 indexes in the set of the K indexes is determined based on a value set of K2 of the K to-be-coded bits, and the value set of the K1 indexes and the value set of the K2 indexes are complementary sets of each other; and performs polar coding on K1 to-be-coded bits. In comparison with a conventional polar coding method and a conventional polar decoding method, the polar coding method and the polar decoding method provided in this application can achieve an effect of reducing a bit rate. A simulation result indicates that the method has better performance.

20 Claims, 24 Drawing Sheets

(56) References Cited

U.S. PATENT DOCUMENTS

| | | | |
|---|---|---|---|
| 10,992,318 B2 | 4/2021 | Wang et al. | |
| 11,082,067 B1* | 8/2021 | Ruan | G06F 1/03 |
| 11,239,954 B2* | 2/2022 | Noh | H03M 13/6306 |
| 2018/0367250 A1 | 12/2018 | Li et al. | |
| 2018/0375526 A1 | 12/2018 | Feygin et al. | |
| 2019/0165884 A1* | 5/2019 | Koike-Akino | H03M 13/13 |
| 2019/0215720 A1* | 7/2019 | Li | H04L 69/22 |
| 2019/0312676 A1* | 10/2019 | Jeong | H04L 1/0057 |

FOREIGN PATENT DOCUMENTS

| | | |
|---|---|---|
| CN | 108809500 A | 11/2018 |
| CN | 108880743 A | 11/2018 |
| CN | 109075806 A | 12/2018 |
| CN | 109150384 A | 1/2019 |
| CN | 109194337 A | 1/2019 |
| WO | 2018232562 A1 | 12/2018 |

OTHER PUBLICATIONS

Guoying, C., "Coding and Decoding of Polar Codes," Nanjing University of Technology, 2014, 2 pages (Abstract Only).

Mahdavifar, H. et al., "Polar Coding for Bit-Interleaved Coded Modulation," IEEE Transactions on Vehicular Technology, vol. 65, No. 5, May 2016, 13 pages.

* cited by examiner $$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

104

200 → $x = [0\ 0\ 0\ u_3\ 0\ u_5\ u_6\ u_7] G_2^{\otimes 3}$

APPARATUS AND METHOD FOR POLAR CODING AND DECODING FOR CHANNELS ASSOCIATED WITH COMPLEMENTARY INDEX SETS

CROSS-REFERENCE TO RELATED APPLICATIONS

This application is a continuation of International Application No. PCT/CN2019/127801, filed on Dec. 24, 2019, which claims priority to Chinese Patent Application No. 201910044760.5, filed on Jan. 17, 2019. The disclosures of the aforementioned applications are hereby incorporated by reference in their entireties.

TECHNICAL FIELD

This application relates to the field of communications technologies, and more specifically, to a polar coding method, a polar decoding method, and an apparatus.

BACKGROUND

As a most basic wireless access technology, channel coding plays a critical role in ensuring reliable data transmission. In an existing wireless communications system, channel coding is usually performed by using a turbo code, a low-density parity-check (LDPC) code, and a polar code. A turbo code cannot support information transmission with an excessively low or high code rate. For transmission of medium/short packets, because of coding and decoding characteristics of a turbo code and an LDPC code, it is difficult for the two types of codes to achieve ideal performance with a limited code length. In regard to implementation, a turbo code and an LDPC code have comparatively high computational complexity during implementation of coding and decoding. A polar code is theoretically proved to be capable of obtaining a Shannon capacity, and has comparatively low coding and decoding complexity. Therefore, a polar code becomes more widely applied. However, with rapid evolution of a wireless communications system, these communication scenarios require higher performance of a polar code.

SUMMARY

This application provides a polar coding method, a polar decoding method, and an apparatus. The method and apparatus can reduce a code rate, thereby improving data transmission reliability. A simulation experiment verifies that a higher performance gain can be obtained by using the method.

According to a first aspect, a polar coding method is provided, where the method includes obtaining K to-be-coded bits and an index set, where the index set includes indexes of K polar channels, a polar channel corresponding to K1 indexes in the index set is used to place K1 of the K to-be-coded bits, a polar channel corresponding to K2 indexes in the index set is used to place K2 preset bits, K=K1+K2, a value set of the K1 indexes or a value set of the K2 indexes is determined based on a value set of K2 of the K to-be-coded bits, and the value set of the K1 indexes and the value set of the K2 indexes are complementary sets of each other, and performing polar coding on the K1 to-be-coded bits to obtain a polar-coded codeword.

K, K1, and K2 are all positive integers, K is less than or equal to N, N is a length of the polar-coded codeword, and N is a positive integral power of 2.

A correspondence between the index set and a value of the K2 to-be-coded bits is established, and a channel index set for placing the K1 to-be-coded bits is used to represent the value of the K2 to-be-coded bits, so as to reduce a code rate.

According to a second aspect, a coding apparatus is provided, including an obtaining unit, configured to obtain K to-be-coded bits and an index set, where the index set includes indexes of K polar channels, a polar channel corresponding to K1 indexes in the index set is used to place K1 of the K to-be-coded bits, a polar channel corresponding to K2 indexes in the index set is used to place K2 preset bits, K=K1+K2, a value set of the K1 indexes or a value set of the K2 indexes is determined based on a value set of K2 of the K to-be-coded bits, and the value set of the K1 indexes and the value set of the K2 indexes are complementary sets of each other, a processing unit, configured to perform polar coding on the K1 to-be-coded bits to obtain a polar-coded codeword, and an output unit, configured to output the polar-coded codeword.

K, K1, and K2 are all positive integers, K is less than or equal to N, N is a length of the polar-coded codeword, and N is a positive integral power of 2.

According to a third aspect, a coding apparatus is provided, including an input interface, configured to obtain K to-be-coded bits and an index set, where the index set includes indexes of K polar channels, a polar channel corresponding to K1 indexes in the index set is used to place K1 of the K to-be-coded bits, a polar channel corresponding to K2 indexes in the index set is used to place K2 preset bits, K=K1+K2, a value set of the K1 indexes or a value set of the K2 indexes is determined based on a value set of K2 of the K to-be-coded bits, and the value set of the K1 indexes and the value set of the K2 indexes are complementary sets of each other, a coding circuit, configured to perform polar coding on the K1 to-be-coded bits to obtain a polar-coded codeword, and an output interface, configured to output the polar-coded codeword.

K, K1, and K2 are all positive integers, K is less than or equal to N, N is a length of the polar-coded codeword, and N is a positive integral power of 2.

According to a fourth aspect, a coding apparatus is provided, including a unit or means (means) configured to obtain K to-be-coded bits and an index set, where the index set includes indexes of K polar channels, a polar channel corresponding to K1 indexes in the index set is used to place K1 of the K to-be-coded bits, a polar channel corresponding to K2 indexes in the index set is used to place K2 preset bits, K=K1+K2, a value set of the K1 indexes or a value set of the K2 indexes is determined based on a value set of K2 of the K to-be-coded bits, and the value set of the K1 indexes and the value set of the K2 indexes are complementary sets of each other, a unit or means configured to perform polar coding on the K1 to-be-coded bits to obtain a polar-coded codeword, and a unit or means configured to output the polar-coded codeword.

K, K1, and K2 are all positive integers, K is less than or equal to N, N is a length of the polar-coded codeword, and N is a positive integral power of 2.

With reference to the first aspect, the second aspect, the third aspect, or the fourth aspect, in some implementations, there are $2^{K2}$ value sets of the K2 of the K to-be-coded bits, and each value set of the K2 to-be-coded bits corresponds to at least one value set of the K1 indexes, or each value set of the K2 to-be-coded bits corresponds to at least one value set of the K2 indexes. A quantity of value cases of the K2 to-be-coded bits is first considered. A quantity of types of index sets should be greater than or equal to the quantity of value cases of the K2 to-be-coded bits, to ensure that at least one type of value set corresponds to one value set of the K2 to-be-coded bits. The channel index set for placing the K1 to-be-coded bits is used to represent the value of the K2 to-be-coded bits, so as to reduce a code rate.

With reference to the first aspect, the second aspect, the third aspect, or the fourth aspect, in some implementations, the K to-be-coded bits include M parity-check bits, and the K1 of the K to-be-coded bits include the M parity-check bits. A location selection bit (the K2 of the K to-be-coded bits) cannot be selected from PC bits, because a PC bit value is determined in real time during polar coding, and a PC bit cannot be used as a bit with a known value. If a PC bit occurs, the PC bit is always used as a non-location-selection bit.

With reference to the first aspect, the second aspect, the third aspect, or the fourth aspect, in some implementations, the K to-be-coded bits include a distributed cyclic redundancy check (CRC) bit whose length is L, where L is a positive integer. A preset rule enables at least C CRC bits to check at least one of the K2 to-be-coded bits, and an index sequence number corresponding to the at least C CRC bits is less than a largest index sequence number in the set of the K indexes, where C is an integer greater than or equal to 1.

With reference to the first aspect, the second aspect, the third aspect, or the fourth aspect, in some implementations, a value of C indexes corresponding to a polar channel on which the at least C CRC bits are placed is less than a value of (L−C) indexes corresponding to a polar channel on which other (L−C) CRC bits are placed.

During CRC bit interleaving, a segment of CRC bits for checking one or more location selection bits and the corresponding location selection bit are placed at the first decoding location, so as to reduce decoding workload of a receiving device, and terminate, in advance, continued decoding of to-be-decoded information corresponding to one or more information bit patterns that fail to pass CRC. A distributed CRC technology is applied to embodiments of this application, so that decoding for an erroneous pattern may be terminated in advance, thereby reducing complexity of blind detection performed by a receive end.

With reference to the first aspect, the second aspect, the third aspect, or the fourth aspect, in some implementations, K2=1 or K2=2.

With reference to the first aspect, the second aspect, the third aspect, or the fourth aspect, in some implementations, the K2 indexes are K2 indexes that are in the index set and that correspond to a polar channel with comparatively low reliability.

With reference to the first aspect, in some implementations of the first aspect, the method further includes obtaining a first bit sequence, where the first bit sequence includes p sub-segments, and p is an integer greater than or equal to 2.

The $i^{th}$ sub-segment corresponds to Si to-be-coded bits, and the K to-be-coded bits are the Si to-be-coded bits of the $i^{th}$ sub-segment. K=Si, i is an integer greater than or equal to 2 and less than or equal to p, and Si is a positive integer.

Implementing a solution idea of this application by segment helps bring into play an advantage of this solution in obtaining a better effect in a case of a short code.

With reference to the first aspect, in some implementations of the first aspect, the K2 indexes are K2 indexes that are in the index set and that correspond to a polar channel with comparatively low reliability.

With reference to the first aspect, in some implementations of the first aspect, the method further includes determining a value of K2 based on an indication flag S, where each value of the indication flag S corresponds to one or more values of K2.

With reference to the first aspect, in some implementations of the first aspect, the indication flag S is a first value, and K2 is an integer greater than 0 and less than K.

With reference to the first aspect, in some implementations of the first aspect, the method further includes determining a value of K1 based on an indication flag S, where each value of the indication flag S corresponds to one or more values of K1.

With reference to the first aspect, in some implementations of the first aspect, the indication flag S is a first value, and K1 is an integer greater than 0 and less than K.

With reference to the first aspect, in some implementations of the first aspect, the method further includes determining a value of K1 or K2 based on a value range of a preset parameter, where the preset parameter includes one of the following: a user equipment category, the length N of the polar-coded codeword, a length K of the to-be-coded bits, and a code rate R, or the preset parameter includes two of the following: a user equipment category, the length N of the polar-coded codeword, a length K of the to-be-coded bits, and a code rate R, or the preset parameter includes three of the following: a user equipment category, the length N of the polar-coded codeword, a length K of the to-be-coded bits, and a code rate R, or the preset parameter includes a user equipment category, the length N of the polar-coded codeword, a length K of the to-be-coded bits, and a code rate R.

With reference to the first aspect, the second aspect, the third aspect, or the fourth aspect, in some implementations, the preset parameter includes a result of a function F (factor 1, factor 2, . . . ) of an influence parameter, and the influence parameter includes the length of the polar-coded codeword, a length of the to-be-coded bits, and a code rate. An effect of the influence parameter on K2 is comprehensively considered.

With reference to the first aspect, the second aspect, the third aspect, or the fourth aspect, in some implementations, the correspondence is a correspondence in one or more rows in Table 2 or Table 3 in the specification.

With reference to the first aspect, the second aspect, the third aspect, or the fourth aspect, a value of an indication flag is determined based on a value range of a preset parameter, and if the indication flag S is a first value, K2 is an integer greater than 0 and less than K. Optionally, the first value is 1 or 0.

With reference to the first aspect, the second aspect, the third aspect, or the fourth aspect, in some implementations, the preset parameter is the user equipment category, and if the user category is one of categories 2 to 12, K2>0. Optionally, if the user category is any one of categories 2 to 4, K2=1, or if the user category is any one of categories 5 to 7 or 9 to 12, K2=2. If the user category is a category 8, K2≥3.

With reference to the first aspect, the second aspect, the third aspect, or the fourth aspect, in some implementations, the preset parameter is the user equipment category, and if the user category is one of categories 3 to 12, K2>0. Optionally, if the user category is either of categories 3 and 4, K2=1, or if the user category is any one of categories 5 to 7 or 9 to 12, K2=2. If the user category is a category 8, K2≥4.

With reference to the first aspect, the second aspect, the third aspect, or the fourth aspect, in some implementations, the preset parameter is the length N of the polar-coded codeword, and if the code length N≤512, S=1 or K2>0. Optionally, if 128≤N≤512, K2=2, or if N<128, K2=1.

With reference to the first aspect, the second aspect, the third aspect, or the fourth aspect, in some implementations, the preset parameter is a quantity K of the to-be-coded bits, and if the code length K≤256, S=1 or K2>0. Optionally, if 64≤K≤256, K2=2, or if K<64, K2=1.

With reference to the first aspect, the second aspect, the third aspect, or the fourth aspect, in some implementations, the preset parameter is the code rate R, and if R≤½, S=1 or K2>0. Optionally, if ¼≤R≤½, K2=1, or if 0≤R≤¼, K2=1 or K2=2.

With reference to the first aspect, the second aspect, the third aspect, or the fourth aspect, in some implementations, the indication flag is sent. The receive end may determine the value of K2 or K1 by receiving the indication flag sent by a transmit end.

With reference to the first aspect, the second aspect, the third aspect, or the fourth aspect, in some implementations, the polar-coded codeword is sent.

With reference to the first aspect, the second aspect, the third aspect, or the fourth aspect, in some implementations, before sending the polar-coded codeword, the transmit end performs rate matching on the polar-coded codeword based on a target code length.

With reference to the second aspect, in some implementations of the second aspect, the obtaining unit is further configured to obtain a first bit sequence, where the first bit sequence includes p sub-segments, and p is an integer greater than or equal to 2. The $i^{th}$ sub-segment corresponds to Si to-be-coded bits, and the K to-be-coded bits are the Si to-be-coded bits of the $i^{th}$ sub-segment. K=Si, i is an integer greater than or equal to 2 and less than or equal to p, and Si is a positive integer.

With reference to the second aspect, in some implementations of the second aspect, the coding apparatus further includes a first unit, configured to determine a value of K2 based on an indication flag S, where each value of the indication flag S corresponds to one or more values of K2.

With reference to the second aspect, in some implementations of the second aspect, the indication flag S is a first value, and K2 is an integer greater than 0 and less than K.

With reference to the second aspect, in some implementations of the second aspect, the coding apparatus further includes a second unit, configured to determine a value of K1 based on an indication flag S, where each value of the indication flag S corresponds to one or more values of K1.

With reference to the second aspect, in some implementations of the second aspect, the indication flag S is a second value, and K1 is equal to K, or the indication flag S is a first value, and K1 is an integer greater than 0 and less than K.

With reference to the second aspect, in some implementations of the second aspect, the coding apparatus further includes a third unit, configured to determine a value of K1 or K2 based on a value range of a preset parameter, where the preset parameter includes one of the following: a user equipment category, the length N of the polar-coded codeword, a length K of the to-be-coded bits, and a code rate R, or the preset parameter includes two of the following: a user equipment category, the length N of the polar-coded codeword, a length K of the to-be-coded bits, and a code rate R, or the preset parameter includes three of the following: a user equipment category, the length N of the polar-coded codeword, a length K of the to-be-coded bits, and a code rate R, or the preset parameter includes a user equipment category, the length N of the polar-coded codeword, a length K of the to-be-coded bits, and a code rate R.

With reference to the second aspect, in some implementations of the second aspect, the coding apparatus further includes a sending unit, configured to send the indication flag.

With reference to the third aspect, in some implementations, the coding circuit is further configured to determine a value of K1 based on an indication flag S, where each value of the indication flag S corresponds to one or more values of K1.

With reference to the third aspect, in some implementations, the input interface is further configured to obtain a first bit sequence, where the first bit sequence includes p sub-segments, and p is an integer greater than or equal to 2. The $i^{th}$ sub-segment corresponds to Si to-be-coded bits, and the K to-be-coded bits are the Si to-be-coded bits of the $i^{th}$ sub-segment. K=Si, i is an integer greater than or equal to 2 and less than or equal to p, and Si is a positive integer.

With reference to the fourth aspect, in some implementations of the fourth aspect, the indication flag S is a first value, and K2 is an integer greater than 0 and less than K.

With reference to the third aspect, in some implementations, the output interface is further configured to output the indication flag.

With reference to the fourth aspect, in some implementations, the coding apparatus further includes a unit or means configured to determine a value of K1 based on an indication flag S, where each value of the indication flag S corresponds to one or more values of K1.

With reference to the fourth aspect, in some implementations, the indication flag S is a second value, and K2 is equal to 0, or the indication flag S is a first value, and K2 is an integer greater than 0 and less than K.

With reference to the fourth aspect, in some implementations, the coding apparatus further includes a unit or means configured to send the indication flag.

With reference to the fourth aspect, in some implementations, the coding apparatus further includes a unit or means configured to obtain a first bit sequence, where the first bit sequence includes p sub-segments, and p is an integer greater than or equal to 2. The $i^{th}$ sub-segment corresponds to Si to-be-coded bits, and the K to-be-coded bits are the Si to-be-coded bits of the $i^{th}$ sub-segment. K=Si, i is an integer greater than or equal to 2 and less than or equal to p, and Si is a positive integer.

According to a fifth aspect, a coding apparatus is provided. The apparatus has a function of implementing the method according to any one of the first aspect or the possible implementations of the first aspect. The function may be implemented by hardware, or may be implemented by executing corresponding software by hardware. The hardware or software includes one or more modules corresponding to the foregoing function.

With reference to the fifth aspect, in some implementations, the coding apparatus includes a processor, configured to perform the method according to any one of the first aspect or the possible implementations of the first aspect.

Optionally, the coding apparatus further includes a storage unit, configured to store data generated or used in a process in which the processor performs the method according to any one of the first aspect or the possible implementations of the first aspect.

Optionally, the storage unit may be located outside the coding apparatus, may be a physically independent unit, or may be a storage space or network disk on a cloud server.

Optionally, the coding apparatus may be a chip or an integrated circuit.

With reference to the fifth aspect, in some implementations, when a part or all of the function is implemented by hardware, the coding apparatus includes an input interface, configured to obtain a to-be-coded bit, a circuit, configured to perform the method according to any one of the first aspect or the possible designs of the first aspect, and an output interface, configured to output a coded bit sequence.

Optionally, the coding apparatus may be a chip or an integrated circuit.

With reference to the fifth aspect, in some implementations, when a part or all of the function is implemented by software, the coding apparatus includes: a memory, configured to store a program, and a processor, configured to execute the program stored in the memory. When the program is executed, the coding apparatus can implement the method according to any one of the first aspect or the possible designs of the first aspect.

Optionally, the memory may be a physically independent unit, or may be integrated with the processor.

Optionally, the coding apparatus may be a chip or an integrated circuit, for example, a microprocessor, a DSP, or a baseband chip.

In a possible design, when a part or all of the function is implemented by software, the coding apparatus includes a processor. A memory configured to store a program is located outside the coding apparatus. The processor is connected to the memory by using a circuit/wire, and is configured to read and execute the program stored in the memory.

Optionally, the chip or the integrated circuit in this application may be a programmable device or an FPGA.

According to a sixth aspect, a polar decoding method is provided, where the method includes obtaining decoding information of K to-be-decoded bits and an index set, where the index set includes indexes of K polar channels, a polar channel corresponding to K1 indexes in the index set is used to carry K1 of the K to-be-decoded bits, a polar channel corresponding to K2 indexes in the index set is used to carry K2 preset bits, K=K1+K2, and the K1 indexes or the K2 indexes are determined based on a value of K2 of the K to-be-decoded bits, determining a decoding result of the K2 to-be-decoded bits based on the K1 indexes or the K2 indexes, performing polar decoding on decoding information of the K1 to-be-decoded bits to obtain a decoding result of the K1 to-be-decoded bits, and outputting a decoding result, where the decoding result includes the decoding result of the K1 to-be-decoded bits and the decoding result of the K2 to-be-decoded bits.

According to a seventh aspect, a decoding apparatus is provided, including an obtaining unit, configured to obtain decoding information of K to-be-decoded bits and an index set, where the index set includes indexes of K polar channels, a polar channel corresponding to K1 indexes in the index set is used to carry K1 of the K to-be-decoded bits, a polar channel corresponding to K2 indexes in the index set is used to carry K2 preset bits, K=K1+K2, and the K1 indexes or the K2 indexes are determined based on a value of K2 of the K to-be-decoded bits, a processing unit, configured to determine a decoding result of the K2 to-be-decoded bits based on the K1 indexes or the K2 indexes, where the processing unit is further configured to perform polar decoding on decoding information of the K1 to-be-decoded bits to obtain a decoding result of the K1 to-be-decoded bits, and an output unit, configured to output a decoding result, where the decoding result includes the decoding result of the K1 to-be-decoded bits and the decoding result of the K2 to-be-decoded bits.

With reference to the sixth aspect or the seventh aspect, in some implementations of the sixth aspect or the seventh aspect, there are $2^{K2}$ value sets of the K2 of the K to-be-decoded bits, and each value set of the K2 to-be-decoded bits corresponds to at least one value set of the K1 indexes, or each value set of the K2 to-be-decoded bits corresponds to at least one value set of the K2 indexes.

With reference to the sixth aspect or the seventh aspect, in some implementations, K2=1 or K2=2.

With reference to the sixth aspect or the seventh aspect, in some implementations, the K to-be-decoded bits include M parity-check bits, and the K1 of the K to-be-decoded bits include the M parity-check bits.

With reference to the sixth aspect or the seventh aspect, in some implementations, a value of K1 or a value of K2 is determined based on a received indication flag S. Each value of the indication flag S corresponds to one or more values of K2, or each value of the indication flag S corresponds to one or more values of K1.

When the indication flag S is a first value, K2 is greater than 0, or K1 is less than K.

According to an eighth aspect, a decoding apparatus is provided, including the following.

The apparatus has a function of implementing the method according to any one of the fifth aspect or the possible implementations of the fifth aspect. The function may be implemented by hardware, or may be implemented by executing corresponding software by hardware. The hardware or software includes one or more modules corresponding to the foregoing function.

With reference to the eighth aspect, in some implementations, the decoding apparatus includes a processor, configured to perform the method according to any one of the fifth aspect or the possible implementations of the fifth aspect.

Optionally, the decoding apparatus further includes a storage unit, configured to store data generated or used in a process in which the processor performs the method according to any one of the fifth aspect or the possible implementations of the fifth aspect.

Optionally, the storage unit may be located outside the decoding apparatus, may be a physically independent unit, or may be a storage space or network disk on a cloud server.

Optionally, the decoding apparatus may be a chip or an integrated circuit.

With reference to the eighth aspect, in some implementations, when a part or all of the function is implemented by hardware, the decoding apparatus includes an input interface, configured to obtain a to-be-decoded bit, a circuit, configured to perform the method according to any one of the fifth aspect or the possible designs of the fifth aspect, and an output interface, configured to output a decoded bit sequence.

Optionally, the decoding apparatus may be a chip or an integrated circuit.

With reference to the eighth aspect, in some implementations of the eighth aspect, when a part or all of the function is implemented by software, the decoding apparatus includes a memory, configured to store a program, and a processor, configured to execute the program stored in the memory. When the program is executed, the decoding apparatus can implement the method according to any one of the fifth aspect or the possible designs of the fifth aspect.

Optionally, the memory may be a physically independent unit, or may be integrated with the processor.

Optionally, the decoding apparatus may be a chip or an integrated circuit, for example, a microprocessor, a DSP, or a baseband chip.

In a possible design, when a part or all of the function is implemented by software, the decoding apparatus includes a processor. A memory configured to store a program is located outside the decoding apparatus. The processor is connected to the memory by using a circuit/wire, and is configured to read and execute the program stored in the memory.

Optionally, the chip or the integrated circuit in this application may be a programmable device or an FPGA.

According to a ninth aspect, this application provides a computer readable storage medium. The computer readable storage medium stores computer program instructions. When the instructions are run on a computer, the computer is enabled to perform the method according to any one of the first aspect or the possible implementations of the first aspect, or the computer is enabled to perform the method according to any one of the fifth aspect or the possible implementations of the fifth aspect.

According to a tenth aspect, this application provides a computer program product. The computer program product includes computer program code. When the computer program code is run on a computer, the computer is enabled to perform the method according to any one of the first aspect or the possible implementations of the first aspect, or the computer is enabled to perform the method according to any one of the fifth aspect or the possible implementations of the fifth aspect.

According to an eleventh aspect, this application provides a chip, including a memory and a processor. The memory is configured to store a computer program. The processor is configured to invoke the computer program from the memory and run the computer program, to perform the method according to any one of the first aspect or the possible implementations of the first aspect, or the processor performs the method according to any one of the fifth aspect or the possible implementations of the fifth aspect.

Optionally, the chip includes only a processor, and the processor is configured to read and execute a computer program stored in a memory. When the computer program is executed, the processor performs the method according to any one of the first aspect or the possible implementations of the first aspect, or the processor performs the method according to any one of the fifth aspect or the possible implementations of the fifth aspect.

Optionally, the memory and the processor may be units physically independent of each other, or the memory may be integrated with the processor.

According to a twelfth aspect, a communications system is provided, including any coding apparatus and any decoding apparatus provided in the foregoing aspects.

In the embodiments of this application, the transmit end obtains the K to-be-coded bits and the index set, performs polar coding on the K1 of the K to-be-coded bits, and outputs the polar-coded codeword. The polar channel corresponding to the K1 indexes in the index set is used to place the K1 of the K to-be-coded bits, the polar channel corresponding to the K2 indexes in the index set is used to place the K2 preset bits, and the index set is determined based on the value set of the K2 of the K to-be-coded bits. The receive end obtains the decoding information and the index set, where a manner of determining the index set is the same as that used by the transmit end, determines the K2 to-be-decoded bits based on the index set, performs check with reference to the result obtained through polar decoding, and outputs the final decoding result. The polar coding method, the polar decoding method, and the apparatus that are provided in this application can effectively reduce a code rate and enhance polar code performance.

According to a thirteenth aspect, a polar coding method is provided, where the method includes obtaining K to-be-coded bits and an index set, where the index set includes indexes of K polar channels, a polar channel corresponding to K1 indexes in the index set is used to place K1 of the K to-be-coded bits, a polar channel corresponding to K2 indexes in the index set is used to place K2 preset bits, K=K1+K2, a value set of the K1 indexes or a value set of the K2 indexes is determined based on a value set of K2 of the K to-be-coded bits, the value set of the K1 indexes and the value set of the K2 indexes are complementary sets of each other, and if a preset parameter meets a first condition, K2=0, or if a preset parameter meets a second condition, K2 is an integer greater than 0 and less than K, and performing polar coding on the K1 to-be-coded bits to obtain a polar-coded codeword.

K and K1 are positive integers, K is less than or equal to N, N is a length of the polar-coded codeword, and N is a positive integral power of 2.

According to a fourteenth aspect, a polar coding apparatus is provided, where the apparatus includes an obtaining unit, configured to obtain K to-be-coded bits and an index set, where the index set includes indexes of K polar channels, a polar channel corresponding to K1 indexes in the index set is used to place K1 of the K to-be-coded bits, a polar channel corresponding to K2 indexes in the index set is used to place K2 preset bits, K=K1+K2, a value set of the K1 indexes or a value set of the K2 indexes is determined based on a value set of K2 of the K to-be-coded bits, the value set of the K1 indexes and the value set of the K2 indexes are complementary sets of each other, and if a preset parameter meets a first condition, K2=0, or if a preset parameter meets a second condition, K2 is an integer greater than 0 and less than K, a processing unit, configured to perform polar coding on the K1 to-be-coded bits to obtain a polar-coded codeword, and an output unit, configured to output the polar-coded codeword.

K and K1 are positive integers, K is less than or equal to N, N is a length of the polar-coded codeword, and N is a positive integral power of 2.

According to a fifteenth aspect, a coding apparatus is provided, including an input interface, configured to obtain K to-be-coded bits and an index set, where the index set includes indexes of K polar channels, a polar channel corresponding to K1 indexes in the index set is used to place K1 of the K to-be-coded bits, a polar channel corresponding to K2 indexes in the index set is used to place K2 preset bits, K=K1+K2, a value set of the K1 indexes or a value set of the K2 indexes is determined based on a value set of K2 of the K to-be-coded bits, the value set of the K1 indexes and the value set of the K2 indexes are complementary sets of each other, and if a preset parameter meets a first condition, K2=0, or if a preset parameter meets a second condition, K2 is an integer greater than 0 and less than K, a coding circuit, configured to perform polar coding on the K1 to-be-coded bits to obtain a polar-coded codeword, and an output interface, configured to output the polar-coded codeword.

K and K1 are positive integers, K is less than or equal to N, N is a length of the polar-coded codeword, and N is a positive integral power of 2.

According to a sixteenth aspect, a coding apparatus is provided, including a unit or means (means) configured to obtain K to-be-coded bits and an index set, where the index set includes indexes of K polar channels, a polar channel corresponding to K1 indexes in the index set is used to place K1 of the K to-be-coded bits, a polar channel corresponding to K2 indexes in the index set is used to place K2 preset bits, K=K1+K2, a value set of the K1 indexes or a value set of the K2 indexes is determined based on a value set of K2 of the K to-be-coded bits, the value set of the K1 indexes and the value set of the K2 indexes are complementary sets of each other, and if a preset parameter meets a first condition, K2=0, or if a preset parameter meets a second condition, K2 is an integer greater than 0 and less than K, a unit or means configured to perform polar coding on the K1 to-be-coded bits to obtain a polar-coded codeword, and a unit or means configured to output the polar-coded codeword.

K and K1 are positive integers, K is less than or equal to N, N is a length of the polar-coded codeword, and N is a positive integral power of 2.

With reference to the thirteenth aspect, the fourteenth aspect, the fifteenth aspect, or the sixteenth aspect, in some implementations, there are $2^{K2}$ value sets of the K2 of the K to-be-coded bits, and each value set of the K2 to-be-coded bits corresponds to at least one value set of the K1 indexes, or each value set of the K2 to-be-coded bits corresponds to at least one value set of the K2 indexes. A quantity of value cases of the K2 to-be-coded bits is first considered. A quantity of types of index sets should be greater than or equal to the quantity of value cases of the K2 to-be-coded bits, to ensure that at least one type of value set corresponds to one value set of the K2 to-be-coded bits. A channel index set for placing the K1 to-be-coded bits is used to represent a value of the K2 to-be-coded bits, so as to reduce a code rate.

With reference to the thirteenth aspect, the fourteenth aspect, the fifteenth aspect, or the sixteenth aspect, in some implementations, the K to-be-coded bits include M parity-check bits, and the K1 of the K to-be-coded bits include the M parity-check bits. A location selection bit (the K2 of the K to-be-coded bits) cannot be selected from PC bits, because a PC bit value is determined in real time during polar coding, and a PC bit cannot be used as a bit with a known value. If a PC bit occurs, the PC bit is always used as a non-location-selection bit.

With reference to the thirteenth aspect, the fourteenth aspect, the fifteenth aspect, or the sixteenth aspect, in some implementations, the K to-be-coded bits include a distributed CRC bit whose length is L, where L is a positive integer. A preset rule enables at least C CRC bits to check at least one of the K2 to-be-coded bits, and an index sequence number corresponding to the at least C CRC bits is less than a largest index sequence number in the set of the K indexes, where C is an integer greater than or equal to 1.

With reference to the thirteenth aspect, the fourteenth aspect, the fifteenth aspect, or the sixteenth aspect, in some implementations, a value of C indexes corresponding to a polar channel on which the at least C CRC bits are placed is less than a value of (L-C) indexes corresponding to a polar channel on which other (L-C) CRC bits are placed.

With reference to the thirteenth aspect, the fourteenth aspect, the fifteenth aspect, or the sixteenth aspect, in some implementations, during CRC bit interleaving, a segment of CRC bits for checking one or more location selection bits and the corresponding location selection bit are placed at the first decoding location, so as to reduce decoding workload of a receiving device, and terminate, in advance, continued decoding of to-be-decoded information corresponding to one or more information bit patterns that fail to pass CRC check. A distributed CRC technology is applied to embodiments of this application, so that decoding for an erroneous pattern may be terminated in advance, thereby reducing complexity of blind detection performed by a receive end.

With reference to the thirteenth aspect, the fourteenth aspect, the fifteenth aspect, or the sixteenth aspect, in some implementations, K2=1 or K2=2.

With reference to the thirteenth aspect, the fourteenth aspect, the fifteenth aspect, or the sixteenth aspect, in some implementations, the K2 indexes are K2 indexes that are in the index set and that correspond to a polar channel with comparatively low reliability.

With reference to the thirteenth aspect, the method further includes obtaining a first bit sequence, where the first bit sequence includes p sub-segments, and p is an integer greater than or equal to 2.

The $i^{th}$ sub-segment corresponds to Si to-be-coded bits, and the K to-be-coded bits are the Si to-be-coded bits of the $i^{th}$ sub-segment. K=Si, i is an integer greater than or equal to 2 and less than or equal to p, and Si is a positive integer.

Implementing a solution idea of this application by segment helps bring into play an advantage of this solution in obtaining a better effect in a case of a short code.

With reference to the thirteenth aspect, the fourteenth aspect, the fifteenth aspect, or the sixteenth aspect, in some implementations, the K2 indexes are K2 indexes that are in the index set and that correspond to a polar channel with comparatively low reliability.

With reference to the thirteenth aspect, in some implementations, the method further includes determining a value of K2 based on an indication flag S, where each value of the indication flag S corresponds to one or more values of K2.

With reference to the thirteenth aspect, the indication flag S is a first value, and K2 is an integer greater than 0 and less than K.

With reference to the thirteenth aspect, in some implementations of the thirteenth aspect, the method further includes determining a value of K1 based on an indication flag S, where each value of the indication flag S corresponds to one or more values of K1.

With reference to the thirteenth aspect, the indication flag S is a first value, and K1 is an integer greater than 0 and less than K.

With reference to the thirteenth aspect, the fourteenth aspect, the fifteenth aspect, or the sixteenth aspect, in some implementations, the preset parameter includes a result of a function F (factor 1, factor 2, ... ) of an influence parameter, and the influence parameter includes the length of the polar-coded codeword, a length of the to-be-coded bits, and a code rate. An effect of the influence parameter on K2 is comprehensively considered.

With reference to the thirteenth aspect, the fourteenth aspect, the fifteenth aspect, or the sixteenth aspect, in some implementations, a correspondence is a correspondence in one or more rows in Table 2 or Table 3 in the specification.

With reference to the thirteenth aspect, in some implementations, the preset parameter includes one of the following: a user equipment category, the length N of the polar-coded codeword, a length K of the to-be-coded bits, and a code rate R, or the preset parameter includes two of the following: a user equipment category, the length N of the polar-coded codeword, a length K of the to-be-coded bits, and a code rate R, or the preset parameter includes three of the following: a user equipment category, the length N of the polar-coded codeword, a length K of the to-be-coded bits, and a code rate R, or the preset parameter includes a user equipment category, the length N of the polar-coded codeword, a length K of the to-be-coded bits, and a code rate R.

With reference to the thirteenth aspect, the fourteenth aspect, the fifteenth aspect, or the sixteenth aspect, in some implementations, a value of an indication flag is determined based on a value range of the preset parameter, and if the indication flag S is a second value, K2 is equal to 0, or if the indication flag S is a first value, K2 is an integer greater than 0 and less than K. Optionally, if the indication flag S is the first value, K2=1 or K2=2. Optionally, the first value is 1, and the second value is 0, or the first value is 0, and the second value is 1.

With reference to the thirteenth aspect, in some implementations, the preset parameter is the user equipment category, and if the user category is a category 1 (the first condition), K2=0, or if the user category is one of categories 2 to 12 (the second condition), K2>0. Optionally, if the user category is any one of categories 2 to 4, K2=1, or if the user category is any one of categories 5 to 7 or 9 to 12, K2=2. If the user category is a category 8, K2≥3.

With reference to the thirteenth aspect, in some implementations, the preset parameter is the user equipment category, and if the user category is a category 1 or a category 2 (the first condition), K2=0, or if the user category is one of categories 3 to 12 (the second condition), K2>0. Optionally, if the user category is either of categories 3 and 4, K2=1, or if the user category is any one of categories 5 to 7 or 9 to 12, K2=2. If the user category is a category 8, K2≥4.

With reference to the thirteenth aspect, in some implementations, the preset parameter is the length N of the polar-coded codeword, and if the code length N≤512 (the second condition), S=1 or K2>0, or if N>512 (the first condition), S=0 or K2=0. Optionally, if 128≤N≤512, K2=2, or if N<128, K2=1.

With reference to the thirteenth aspect, in some implementations, the preset parameter is a quantity K of the to-be-coded bits, and if the code length K≤256 (the second condition), S=1 or K2>0, or if K>256 (the first condition), S=0 or K2=0. Optionally, if 64≤K≤256, K2=2, or if K<64, K2=1.

With reference to the thirteenth aspect, in some implementations, the preset parameter is the code rate R, and if R≤½ (the second condition), S=1 or K2>0, or if R>½ (the first condition), S=0 or K2=0. Optionally, if ¼≤R≤½, K2=0 or K2=1, or if 0≤R≤¼, K2−1 or K2=2.

BRIEF DESCRIPTION OF THE DRAWINGS

To describe the technical solutions in the embodiments of the present invention more clearly, the following briefly describes the accompanying drawings required for describing the embodiments.

DETAILED DESCRIPTION OF ILLUSTRATIVE EMBODIMENTS

The following clearly describes the technical solutions in the embodiments of this application with reference to the accompanying drawings in the embodiments of this application. In descriptions of this application, "a plurality of" means two or more. In addition, for convenience of clear description of the technical solutions in the embodiments of this application, terms such as "first" and "second" are used in the embodiments of this application to distinguish between same objects or similar objects that have basically same functions and purposes. A person skilled in the art may understand that the terms such as "first" and "second" do not intend to limit a quantity or an execution sequence, and the terms such as "first" and "second" do not indicate a definite difference. Another method may be obtained based on steps and procedures or a combination of some of steps and procedures in content provided in the embodiments of this application. Based on these obtained methods and steps, a corresponding apparatus is provided, including units, modules, means, or a combination thereof configured to perform the methods and steps. A network architecture and a service scenario described in the embodiments of this application are intended to describe the technical solutions in the embodiments of this application more clearly, and do not constitute a limitation on the technical solutions provided in the embodiments of this application. A person of ordinary skill in the art may know that the technical solutions provided in the embodiments of this application are also applicable to similar technical problems as the network architecture evolves and a new service scenario emerges. Before the technical solutions in the embodiments of this application are described, a technical scenario in the embodiments of this application is first described with reference to the accompanying drawings.

The embodiments of this application may be applied to a wireless communications system. Wireless communications systems mentioned in the embodiments of this application include but are not limited to a long term evolution (Long Term Evolution, LTE) system, and three application scenarios of a next-generation 5G mobile communications system: enhanced mobile broadband (eMBB), URLLC, and massive machine type communication (mMTC). Alternatively, the wireless communications system may be a device-to-device (D2D) communications system, another communications system, a future communications system, or the like.

A communications apparatus in this application may be configured in a communications device, and the communications device mainly includes a network device or a terminal device. If a transmit end in this application is a network device, a receive end may be a terminal device. If a transmit end in this application is a terminal device, a receive end may be a network device.

Figure 1A:
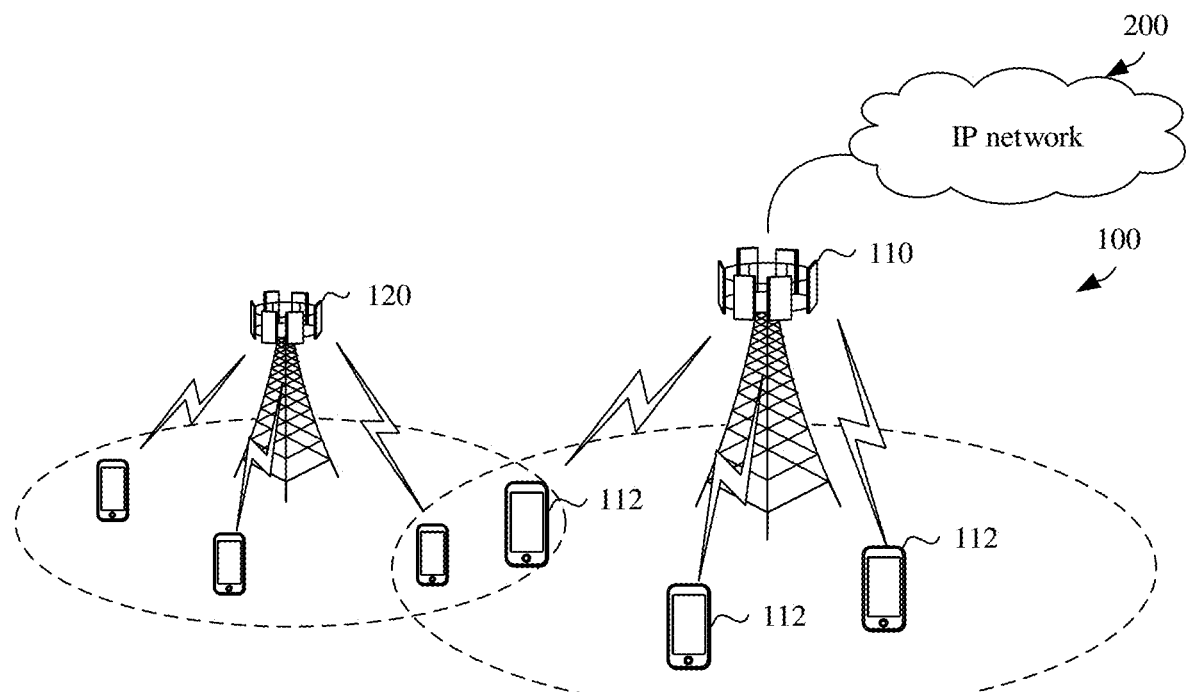
FIG. 1(a) is a schematic diagram of a wireless communications system applied in the embodiments of this application.

A wireless communications system in the embodiments of this application is shown in FIG. 1(a). The wireless communications system too includes a network device 110 and a terminal 112. When a wireless communications system too includes a core network, the network device 110 may be further connected to the core network. The network device 110 may further communicate with an IP network 200, for example, the Internet (internet), a private IP network, or another data network. A network device provides a service for a terminal that is in a coverage area. For example, referring to FIG. 1(a), the network device 110 provides wireless access for one or more terminals that are in a coverage area of the network device 110. In addition, there may be an overlapping area between coverage areas of network devices, for example, the network device 110 and a network device 120. Network devices may further communicate with each other. For example, the network device 110 may communicate with the network device 120.

Figure 1B:
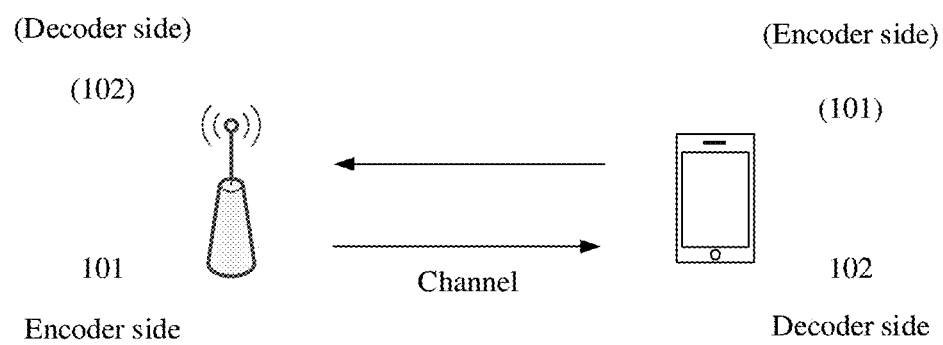
FIG. 1(b) is a simplified schematic diagram of a wireless communications system applied in the embodiments of this application.

When the network device 110 or the terminal 112 sends information or data, a coding method described in the embodiments of this application may be used. For ease of description, in the embodiments of this application, the communications system too is simplified to a system that includes a transmit end 101 and a receive end 102 and that is shown in FIG. 1(b). The transmit end 101 may be the network device 110, and the receive end 102 is the terminal 112. Alternatively, the transmit end 101 is the terminal 112, and the receive end 102 is the network device 110. The network device 110 may be a device configured to communicate with a terminal device. For example, the network device 110 may be an evolved NodeB (eNB or eNodeB) in an LTE system, a network-side device in a 5G network, a network-side device that communicates with a terminal in another network, or a network-side device in a future network. Alternatively, the network device may be a relay station, an access point, a vehicle-mounted device, or the like. In a device-to-device (D2D) communications system, the network device may alternatively be a terminal that functions as a base station. In addition, the network device may include a baseband unit (BBU) and a remote radio unit (RRU). The BBU and the RRU may be placed in different places. For example, the RRU may be remotely placed in a high-traffic area, and the BBU may be placed in a central equipment room. Alternatively, the BBU and the RRU may be placed in a same equipment room. Alternatively, the BBU and the RRU may be different components at a same rack.

The terminal device may include a handheld device, a vehicle-mounted device, a wearable device, or a computing device that has a wireless communication function, another processing device connected to a wireless modem, user equipment (UE) in various forms, a mobile station (MS), or the like.

Figures 2, 3:
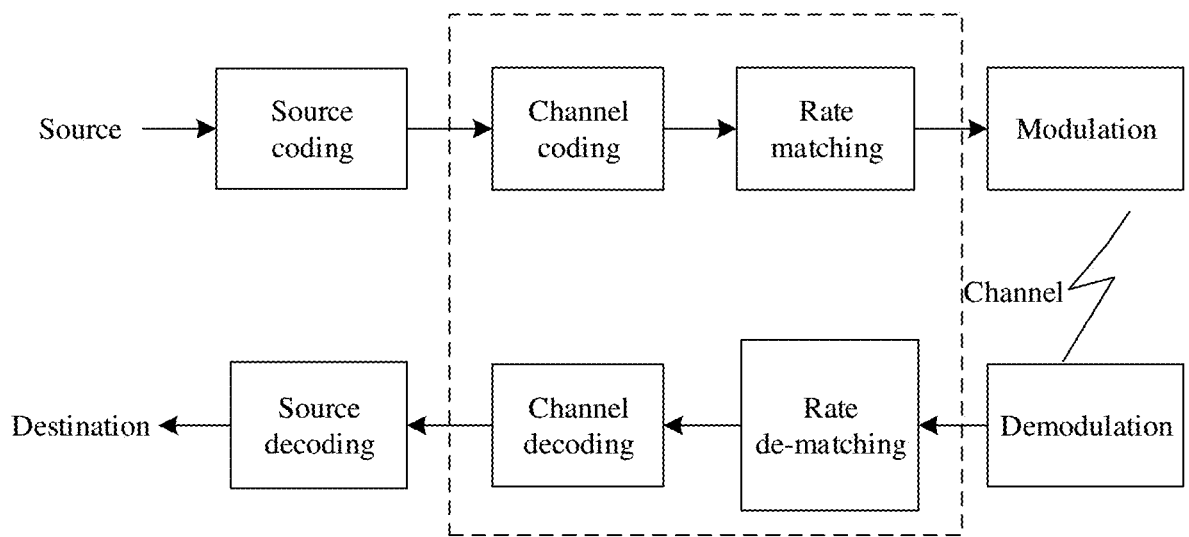
FIG. 2 is a schematic flowchart of wireless communication.
FIG. 3 is an example diagram of generating a codeword whose length is 8 by using a Kronecker product matrix $G_2^{\otimes 3}$.

FIG. 2 is a schematic flowchart of wireless communication. As shown in FIG. 2, at a transmit end, a source sends information after sequentially performing source coding, channel coding, rate matching (an optional step), and modulation. At a receive end, after demodulation, rate de-matching (an optional step), channel decoding, and source decoding are sequentially performed on the information, the information is output to a destination. The embodiments of this application relate to channel coding and channel decoding (channel coding and decoding for short). A channel coding module may use a polar coding method described in the embodiments of this application. A channel decoding part of the receive end may use a decoding method provided in the embodiments of this application. Coding and decoding methods and apparatuses provided in this application are applicable to both a control channel and a data channel, and are applicable to both uplink and downlink.

E. Arikan proposed a novel channel coding manner, namely, a polar code (Polar code), based on a channel polarization theory. In E. Arikan's "Channel Polarization: A Method for Constructing Capacity-Achieving Codes for Symmetric Binary-Input Memoryless Channels", IEEE Transactions on Information Theory, Vol. 55, No. 7 (July 2009) [Arikan], a theory related to "channel polarization" of a polar code is proved in part IV. Channel polarization is the following operation: N "synthetic" channels are generated based on N independent copies of a binary-input discrete memoryless channel (B-DMC), so that as a value of N increases, a new synthetic channel is polarized in a sense that mutual information of the new synthetic channel is close to 0 (completely noisy channel) or close to 1 (perfectly noiseless channel). In other words, some bit locations of an input vector provided for an encoder are to experience a completely noisy channel, that is, when considered independently of another synthetic channel, such a channel has comparatively low reliability or a low probability of being correctly decoded, some bit locations of the input vector provided for the encoder are to experience a very clean channel, that is, when considered independently of another synthetic channel, such a channel has a high probability or high reliability of being correctly decoded. In some cases, reliability of a synthetic channel when considered independently of another synthetic channel may be referred to as a "capacity" of the synthetic channel.

A purpose of channel coding is to improve data transmission reliability and ensure communication quality. A polar code is a coding manner that can achieve a Shannon capacity limit and that has low coding and decoding complexity in theory, and may be used for channel coding. A polar code is a linear block code. For a binary discrete memoryless channel, when a polar code length tends to be infinite, a polar code can approach a theoretical channel capacity by using a successive-cancellation (SC) decoding method.

A polar code is designed based on channel polarization. Capacities and error probabilities of two equivalent channels are respectively polarized to be better and worse. Through multi-level channel polarization, capacities of some channels approach 1, and such channels are referred to as "good" channels, capacities of some channels approach 0, and such channels are referred to as "poor" channels. A basic idea of a polar code is to place valid information on a "good" channel, and place, on a "poor" channel, a bit known to both an encoder and a decoder. A bit corresponding to a channel on which valid information is placed is referred to as an information bit, and a bit corresponding to a channel on which a known bit is placed is referred to as a frozen bit. In conventional application, values of frozen bits are all set to zero. In a coding policy of a polar code, a "good" noiseless channel is used to transmit wanted information of a user, and a "poor" completely noisy channel is used to transmit agreed information or no information.

A coding matrix of a polar code is $G_N$, and a coding process is $x_1^N = u_1^N G_N$, where $u_1^N = (u_1, u_2, \ldots, u_N)$ is a binary row vector whose length is N. $G_N$ is a matrix of N×N, and $G_N = F_2^{\otimes(\log_2(N))}$. $x_1^N$ is a binary row vector whose length is N, and may also be referred to as a coded sequence, an output sequence, or a codeword. The codeword or sequence that is obtained through polar coding and whose length is N is also referred to as a mother code. In this case, N may also be referred to as a mother code length or a code length of the mother code, and N is a positive integral power of 2, for example, 4, 8, 16, 32, 64, 128, 512, 1024, 2048, or 4096. $F_2^{\otimes(\log_2(N))}$ is defined as a Kronecker (Kronecker) product of $\log_2 N$ matrices $F_2$. The matrix $$F_2 = \begin{bmatrix} 1 & 0 \\ 1 & 1 \end{bmatrix}.$$

Another form of $G_N$ is $G_N = B_N F_2^{\otimes(\log_2(N))}$. That is, $F_2^{\otimes(\log_2(N))}$ is multiplied by a transposed matrix $B_N$, for example, a bit reversal (Bit Reversal) matrix. The coding matrix is based on a $\log_2 N$ Kronecker product power of the specific matrix $F_2$. Use of the coding matrix leads to channel polarization. More generally, any coding matrix that generates a channel polarization effect may be referred to as a polar code coding matrix.

In the polar code coding process, some bits in $u_1^N$ are used to carry information, and are referred to as an information bit set or an information bit sequence. An index set of these bits may be referred to as an information bit index set or an information bit location set, and is denoted by A. Some other bits are set to fixed values agreed in advance by a receive end and a transmit end, and these bits are referred to as frozen bits or a frozen bit set. An index set corresponding to these frozen bits may be referred to as a frozen bit index set or a frozen bit location set, and is represented by using a complementary set $A^c$ of A. The frozen bits are also referred to as fixed bits, indicating that these locations are used to place fixed bits and are not used to place information. The polar code coding process is equivalent to $x_1^N = u_A G_N(A) \oplus u_{A^c} G_N(A^c)$. Herein, $G_N(A)$ is a sub matrix that is in $G_N$ and that is obtained from rows corresponding to indexes in the set A, and $G_N(A^c)$ is a submatrix that is in $G_N$ and that is obtained from rows corresponding to indexes in the set $A^c$. It can be learned that indexes of elements in $u_1^N$ are in one-to-one correspondence with row vectors of the coding matrix. $u_A$ is an information bit set in $u_1^N$, and a quantity of bits thereof is K. The information bit set generally includes but is not limited to various check bits including a cyclic redundancy check (Cyclic Redundancy Check, CRC for short) bit and a parity-check (Parity Check, PC for short) bit. $u_{A^c}$ is a fixed-bit set in $u_1^N$, and a quantity of bits thereof is (N−K), where the bits are known bits. These fixed bits are usually set to 0, but the fixed bits may be set to any value provided that the value is agreed in advance by the receive end and the transmit end. Therefore, a polar code coding output may be simplified to $x_1^N = u_A G_N(A)$. Herein, $u_A$ is the information bit set in $u_1^N$, $u_A$ is a row vector with a length K, that is, $|A| = K$, where $|\cdot|$ represents a quantity of elements in a set, and K is a size of a to-be-coded bit, $G_N(A)$ is the sub matrix that is in the matrix $G_N$ and that is obtained from the rows corresponding to the indexes in the set A, and $G_N(A)$ is a matrix of K×N.

Selection of the set A determines polar code performance. Usually, based on the mother code length N, it can be learned that there are a total of N polar channels, respectively corresponding to N rows of the coding matrix. An index of K polar channels with comparatively high reliability is used as an element of the set A, and an index corresponding to remaining (N−K) polar channels is used as an element of the fixed-bit index set $A^c$. The set A determines an information bit location, and the set $A^c$ determines a fixed-bit location. A polar channel sequence number is also referred to as a polar channel index, and may be from 0 to (N−1) or from 1 to N in a natural arrangement order. Location indexes (location sequence numbers) of $u_1^N$ are in one-to-one correspondence with the N rows of the coding matrix, and also correspond to the N polar channels. The $i^{th}$ bit in $u_1^N$ corresponds to the $i^{th}$ row of the coding matrix. Sequence numbers (also referred to as indexes) of $u_1^N$ correspond to indexes of the N polar channels, or may be from 0 to (N−1) or from 1 to N in a natural arrangement order. A location set of the information bits in $u_1^N$ is represented as the index set A. A location set of the frozen bits in $u_1^N$ is represented as the index set $A^c$.

Elements of the set A include the index of the K polar channels with comparatively high reliability. To be specific, the index set may be an index set of the first K polar channels that are arranged based on reliability and that have comparatively high reliability in the N polar channels. However, it does not mean that this is a mandatory condition. Provided that reliability of a polar channel corresponding to the index set A is comparatively high, it does not necessarily mean that reliability of a polar channel corresponding to each of remaining "N−K" indexes is lower than that of the K polar channels corresponding to the index set A.

There are a plurality of methods that may be used to measure reliability of a location at which a bit is placed or reliability of a corresponding polar channel. Common methods include a method based on a polarization weight (PW), a method based on Gaussian approximation (GA), and a combination of these methods. Polar channel reliability is measured, so that reliability of each polar channel can be represented. The N polar channels are arranged based on reliability, to obtain a polar sequence. Elements of the sequence are sequence numbers of the corresponding polar channels arranged based on reliability. The polar channels may be arranged in descending order of reliability or in ascending order of reliability.

The following uses a polar code whose mother code length is 8, as an example for description. FIG. 3 shows an example of generating a codeword whose length is 8 by using a Kronecker product matrix $G_2^{\otimes 3}$. As indicated at 200, the codeword x is formed by a product of an input vector $u=[u_0\ u_1\ u_2\ u_3\ u_4\ u_5\ u_6\ u_7]$ used as a row vector and the Kronecker product matrix $G_2^{\otimes 3}$ 104 (alternatively, the codeword x may be formed by a product of a Kronecker product matrix $G_2^{T\otimes 3}$ and an input vector u used as a column vector), that is, $x_1^8 = u_1^8 G_2^{\oplus 3}$. The input vector u is a vector whose length is 8. The input vector u includes four frozen bits and four information bits. Four polar channels with comparatively high reliability are selected to place the information bits, and four corresponding polar channels with comparatively low reliability are used to place the frozen bits (the frozen bit is generally set to a bit known to both an encoder side and a decoder side, for example, set to 0 or 1, in this example, the frozen bit is set to 0). Specifically, in this example, an index set A is [3, 5, 6, 7], and an index set $A^c$ is [0, 1, 2, 4], that is, $u=[0\ 0\ 0\ u_3\ 0\ u_5\ u_6\ u_7]$.

It is assumed that a quantity of to-be-coded bits is K, and a post-coding code length is N. The K to-be-coded bits are valid information and need to be transmitted to a receive end. According to a polar code design method, in N locations, K more "reliable" locations are determined as information bits, and are used to place the K to-be-coded bits. These reliable locations are represented by using an index set, and elements in the set are sequence numbers of polar channels. Remaining (N−K) locations are used for a frozen bit, to place a known value. If a coding scheme relates to a PC bit or a CRC bit, the K to-be-coded bits also include the PC bit or the CRC bit, or include both the PC bit and the CRC bit.

Based on a polar code with (N, K) (a codeword length is N, and a quantity of to-be-coded bits is K), a code rate may be represented as K/N or K/M, where M refers to a length of bits last transmitted by using a physical resource, for example, may be a code length obtained through rate matching. Alternatively, if the to-be-coded bits include a housekeeping bit such as a CRC or PC bit, a code rate may be represented as K'/N or K'/M, where K' refers to a quantity of to-be-coded bits other than the housekeeping bit in the K to-be-coded bits. Sometimes, these to-be-coded bits that do not include the housekeeping bit are referred to as a payload, or are referred to as "information bits", but the "information bit" herein is different from the above-mentioned information bit relative to the frozen bit. Understanding of the term "information bit" should be based on technical essence, and same names shall not be used as an only basis for determining that technical meanings are also the same.

To avoid ambiguity, an information bit in this application is a bit used to place valid information.

According to the polar coding method in this application, a quantity of K to-be-coded bits is reduced during polar coding. For example, it is determined that K2 of the K to-be-coded bits are not placed in an original index set, and an information bit that originally needs to be used to place the K2 to-be-coded bits is used as a frozen bit, and is set to a value known to a transmit end and a receive end. The K2 to-be-coded bits that are not placed at an information bit location may be represented by using a specific polar channel index set pattern. Remaining (K−K2) to-be-coded bits are placed on (K−K2) polar channels other than a polar channel used for K2 frozen bits. The (K−K2) bits may be represented as K1 bits. In other words, the index set includes two parts: K1 indexes and K2 indexes, and the to-be-coded bits also include two parts: the K1 to-be-coded bits and the K2 to-be-coded bits. A polar channel corresponding to the K1 indexes is used to place the K1 to-be-coded bits, and a polar channel corresponding to the K2 indexes is used to place the K2 preset bits, where K=K1+K2. A value set of the K2 to-be-coded bits is determined based on a value set of the K2 indexes. Alternatively, a value set of the K2 to-be-coded bits is determined based on a value set of the K1 indexes.

When values of K1 and K2 are determined, if the K2 indexes are selected from the K indexes, there are $C_K^{K2}$ cases of the value set of the K2 indexes, if the K1 indexes are selected from the K indexes, there are $C_K^{K1}$ cases of the value set of the K1 indexes. The value set of the K1 indexes and the value set of the K2 indexes are complementary sets of each other. Once the value set of the K2 indexes is determined, the value set of the K1 indexes is determined. $C_K^{K2}=C_K^{K1}$, where $C_n^m$ represents a combinatorial number of taking m elements from n different elements. Taking any m (m≤n) elements from n different elements and combining the m elements into a group is referred to as a combination of taking m elements from the n different elements. A quantity of all combinations of taking m (m≤n) elements from n different elements is referred to as a combinatorial number of taking m elements from the n different elements.

One or more value sets of the K2 indexes may correspond to one value set of the K2 to-be-coded bits. Both the transmit end and the receive end know the correspondence, and therefore can perform coding and decoding on the K2 to-be-coded bits by using the correspondence. The transmit end may select the K2 to-be-coded bits from the K to-be-coded bits according to a rule known to both the transmit end and the receive end, and determine, based on the value set of the K2 indexes, a location for placing the K2 to-be-coded bits, instead of placing the K2 to-be-coded bits on a polar channel corresponding to the index set.

A simple example is used for description. For example, N=8, K=4, K2=1, the to-be-coded bits are {b0, b1, b2, b3}, and the index set includes four elements, such as {3, 5, 6, 7}. In this case, there are four cases of selecting the K2 indexes (K2=1) from the index set, that is, one index selected for the frozen bit may be any one of 3, 5, 6, or 7. Assuming that the to-be-coded bit that is not placed at an information bit is b0 (or one of b1, b2, and b3), a correspondence between the value set of the K2 to-be-coded bits (K2=1) and the value set of the K2 indexes may be agreed. If a value of the one to-be-coded bit is 1, and a bit corresponding to the index 3 is the frozen bit, the remaining three indexes {5, 6, 7} are used to place {b1, b2, b3}. If a value of the one to-be-coded bit is 1, and a bit corresponding to the index 5 is the frozen bit, the remaining three indexes {3, 6, 7} are used to place {b1, b2, b3}. Based on the correspondence, it is assumed that the to-be-coded bits {b0, b1, b2, b3} are {1, 0, 0, 1}, and b0 is the K2 to-be-coded bits (K2=1). Because b0=1, the index 3 is selected for the frozen bit, and b1, b2, and b3 whose values are equal to 0, 0, and 1 are placed on polar channels whose indexes are {5, 6, 7}. The correspondence may also be understood as that one value set of the K2 to-be-coded bits corresponds to one index set pattern, and the pattern represents a location relationship between the K1 information bits and the K2 frozen bits in the index set during coding. During decoding, the receive end performs decoding separately based on patterns corresponding to values 1 and 0, and selects, as a final decoding result, a decoding result that is determined as correct through check.

If K2=2, there are six value sets obtained by selecting two indexes from the four indexes, that is, the value set is any one of {3, 5}, {3, 6}, {3, 7}, {5, 6}, {5, 7}, and {6, 7}. For example, {3, 5} is one value set of the K2 indexes, and elements of the set include polar channel sequence numbers 3 and 5, indicating that polar channels whose sequence numbers are 3 and 5 are used to place the known bits. Correspondingly, there are $2^{K2}$ value sets of the K2 to-be-coded bits. For example, if K2=2, there are four value sets of the two to-be-coded bits, namely, {0, 0}, {0, 1}, {1, 0}, and {1, 1}. It is assumed that the to-be-coded bits {b0, b1, b2, b3} are {1, 0, 0, 1}. Because K2=2, indicating two to-be-coded bits, it is assumed that the to-be-coded bits that are not placed at information bits are b0 and b1 (or any two of b0, b1, b2, and b3). In this case, the following correspondence between the value set of the K2 to-be-coded bits (K2=2) and the value set of the K2 indexes may be agreed.

If the value set of the two to-be-coded bits is {0, 0}, bits corresponding to the indexes 3 and 5 are the frozen bits. In this case, bits corresponding to the indexes 6 and 7 are the information bits.

If the value set of the two to-be-coded bits is {0, 1}, bits corresponding to the indexes 3 and 6 are the frozen bits. In this case, bits corresponding to the indexes 5 and 7 are the information bits.

If the value set of the two to-be-coded bits is {1, 0}, bits corresponding to the indexes 3 and 7 are the frozen bits. In this case, bits corresponding to the indexes 5 and 6 are the information bits.

If the value set of the two to-be-coded bits is {1, 1}, bits corresponding to the indexes 5 and 6 are the frozen bits. In this case, bits corresponding to the indexes 3 and 7 are the information bits.

Based on the correspondence, when the to-be-coded bits {b0, b1, b2, b3} are {1, 0, 0, 1}, and b0 and b2 are the K2 to-be-coded bits (K2=2), because values of b0 and b2 are equal to 1 and 0, the indexes 3 and 7 are selected for the frozen bits, and b1 and b3 whose values are equal to 0 and 1 are placed on polar channels corresponding to {5, 6}. The correspondence may also be understood as that one value set of the K2 to-be-coded bits corresponds to one index set pattern, and the pattern represents a location relationship between the K1 information bits and the K2 frozen bits in the index set during coding. During decoding, the receive end performs decoding separately based on patterns corresponding to values 0 and 0, 0 and 1, 1 and 0, and 1 and 1, and selects a correct decoding result as a final decoding result.

A correspondence between the value set of the K2 to-be-coded bits and an index set pattern may be agreed in advance. During coding, an index set pattern is determined based on an actual value set of the K2 to-be-coded bits, to determine the K1 indexes corresponding to the polar channel on which the K1 to-be-coded bits are placed, and determine the K2 indexes corresponding to the channel on which the known bit is placed. The receive end performs decoding separately for each pattern in a blind detection manner, determines, based on the pattern on which the decoding is based, a value corresponding to the K2 coded bits, determines the value set of the K1 indexes, and obtains a value of the K1 bits through decoding. Different decoding results are obtained based on a plurality of patterns, and one correct decoding result in the decoding results is selected as the final decoding result.

A polar coding manner in the solutions can reduce a polar-code code rate to some extent. A simulation experiment verifies that the technical solutions in this application can effectively improve decoding performance, thereby further improving polar code performance.

In this application, a channel index set may also be referred to as an information bit index set or an information bit set, and these names are not distinguished from each other in the following embodiments, and may be used interchangeably.

Figure 4:
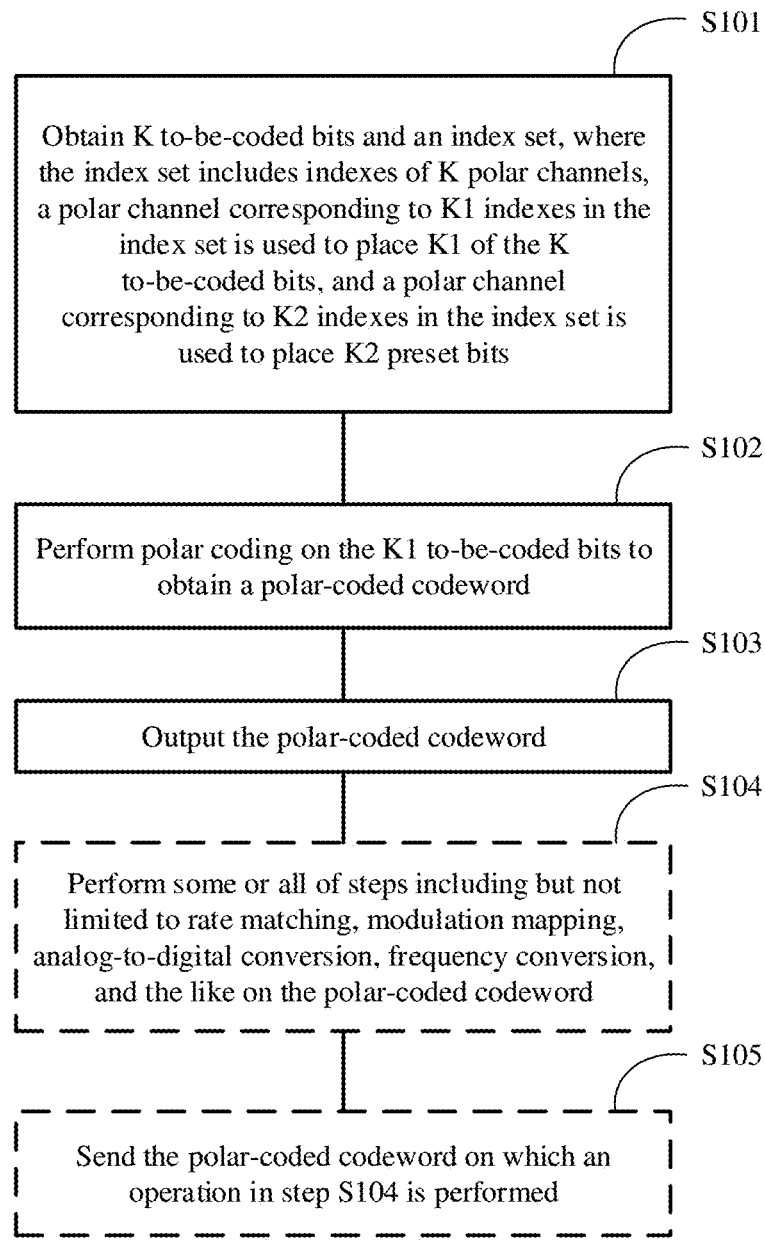
FIG. 4 is a schematic flowchart of a polar coding method according to an embodiment of this application.

FIG. 4 is a schematic flowchart of a polar coding method according to an embodiment of this application. The method is performed by a transmit end. The method may include the following steps.

S101: Obtain K to-be-coded bits and an index set, where the index set includes indexes of K polar channels, a polar channel corresponding to K1 indexes in the index set is used to place K1 of the K to-be-coded bits, a polar channel corresponding to K2 indexes in the index set is used to place K2 preset bits, K=K1+K2, a value set of the K1 indexes or a value set of the K2 indexes is determined based on a value set of K2 of the K to-be-coded bits, and the value set of the K1 indexes and the value set of the K2 indexes are complementary sets of each other.

S102: Perform polar coding on the K1 to-be-coded bits to obtain a polar-coded codeword.

S103: Output the polar-coded codeword.

Optionally, the method further includes S104: Perform some or all of steps including but not limited to rate matching, modulation mapping, analog-to-digital conversion, frequency conversion, and the like on the polar-coded codeword.

Optionally, the method further includes S105: Send the polar-coded codeword on which an operation in step S104 is performed.

Specifically, in step S101, the transmit end obtains the K to-be-coded bits (also referred to as a to-be-coded sequence whose length is K), and knows that a length of the polar-coded codeword is N. The K to-be-coded bits are divided into two parts: the K1 to-be-coded bits and the K2 to-be-coded bits, where K=K1+K2. The transmit end determines a set including N channel indexes, where the set of the N channel indexes further includes the indexes of the K polar channels, and the indexes of the K polar channels are used to place a to-be-coded bit (an information bit) and a preset bit (a frozen bit). The polar channel corresponding to the K1 indexes in the index set is used to place the K1 of the K to-be-coded bits, and the polar channel corresponding to the K2 indexes in the index set is used to place the K2 preset bits. The index set may be prestored at the transmit end, to be directly invoked. K and N are positive integers. There are a plurality of methods for determining an arrangement order of the channel index set. For example, the indexes of channels (locations at which bits are placed) may be arranged based on channel reliability according to a theory related to channel polarization, to determine the channel index set. Such a method is related to a quantity of channels. Therefore, the following uses a specific example for detailed description. Details about a selection method are not described below.

It may be understood that, in step S102, a pattern of the index set refers to a selected set of K channel indexes, or may refer to a selected set of N channel indexes if channel integrity is considered, where (N−K) channels are used to place a frozen bit. There are $2^{K2}$ value cases of the K2 of the K to-be-coded bits. For example, for values of two to-be-coded bits, there are four cases, such as 0 and 0, 0 and 1, 1 and 0, and 1 and 1. Each value case corresponds to at least one index set. The index set includes the K1 indexes and the K2 indexes. The polar channel corresponding to the K1 indexes is used to transmit an information bit (if there is a CRC bit, the information bit may also include the CRC bit, that is, the information bit includes a payload (payload), or a payload (payload) and a CRC bit). The polar channel corresponding to the K2 indexes is used to transmit a frozen bit (the preset bit).

In step S103, the transmit end may use an existing polar coding method as a method for performing polar coding on the K1 to-be-coded bits, and details are not described herein.

In step S104, the rate matching step is optional. The code length of the polar-coded codeword (mother code) is an integral power of 2. In actual application, a polar code with any code length needs to be implemented through rate matching. Certainly, if the code length of the polar-coded codeword is the same as a code length of a target code, rate matching does not need to be performed. Because a focus of this embodiment of the present invention is not on step S104, details are not described herein. For example, in a possible implementation, a person skilled in the art may also make reference to a method in the prior art.

In a specific embodiment in which segmentation of to-be-coded bits is considered, the transmit end obtains Ks to-be-coded bits and a polar channel index set. The Ks to-be-coded bits may be divided into p sub-segments of to-be-coded bits, where p is a positive integer greater than or equal to 2. A maximum value of a codeword length obtained through polar coding of all the sub-segments of to-be-coded bits is Nmax. Steps S101 to S103 are performed on each sub-segment, codewords obtained through polar coding of all the sub-segments are combined, and then the operation in step S104 is performed on a codeword obtained through the combination.

Figure 5:
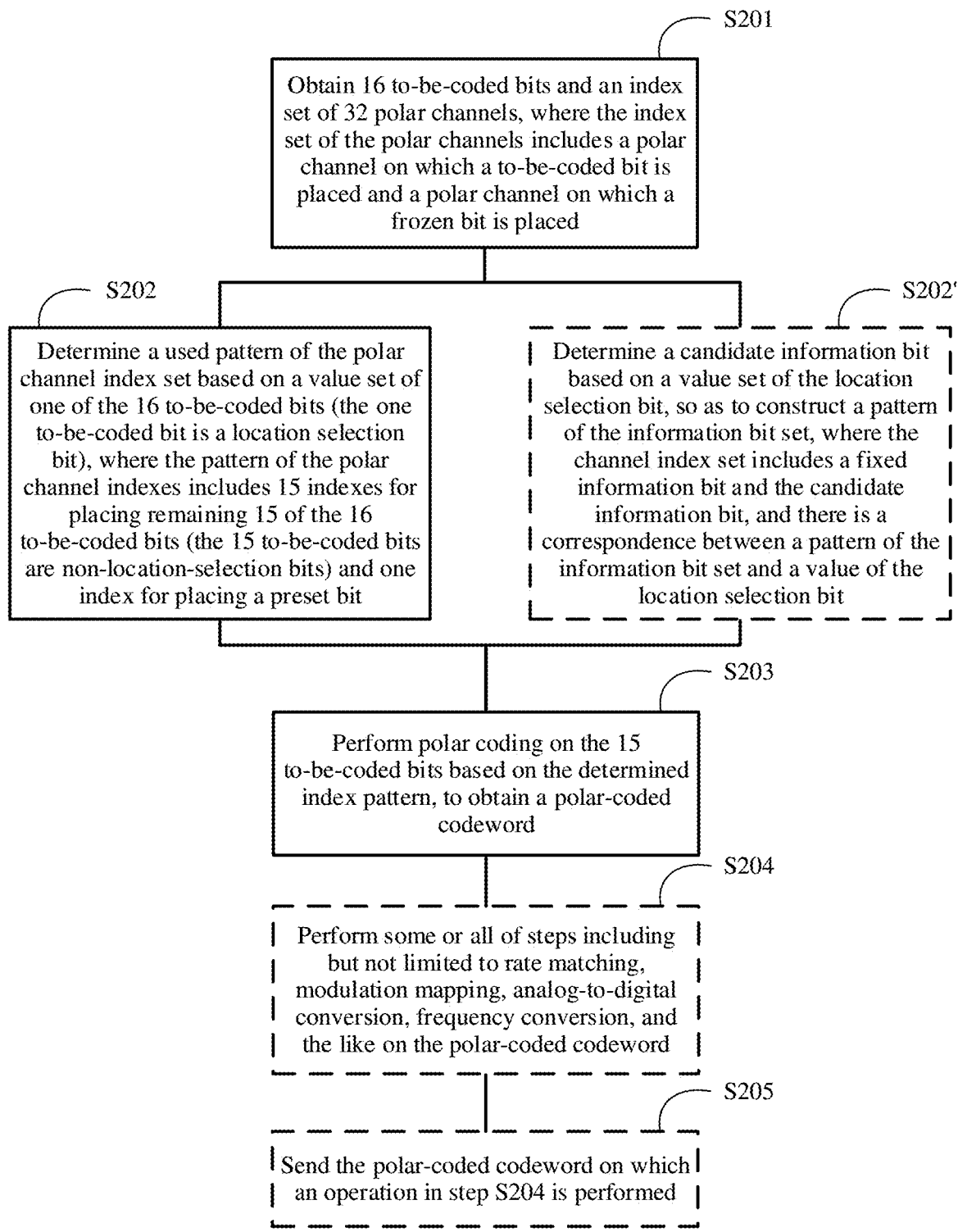
FIG. 5 is a schematic flowchart of using a polar coding method according to an embodiment of this application.

FIG. 5 shows a specific embodiment of using a polar coding method according to an embodiment of this application. This embodiment is performed by a transmit end. This embodiment is for a polar code with (32, 16) for which K2=1 and to-be-coded bits do not need to be segmented. The method may include the following steps.

S201: Obtain 16 to-be-coded bits and an index set of 32 polar channels, where the index set of the polar channels includes a polar channel on which a to-be-coded bit is placed and a polar channel on which a frozen bit is placed.

A length K of the to-be-coded bits obtained by the transmit end is 16, K1=15, K2=1, and it is known that a length of a polar-coded codeword is 32 (such a codeword is simply referred to as a polar code with (32, 16) below, which is noted herein and is not repeated below). The 16 to-be-coded information bits are denoted by $b_1^{16}$=$[b_1, b_2, \ldots, b_{16}]$. Optionally, the information bits may include eight cyclic redundancy check (CRC) bits. In this application, an information bit and a to-be-coded bit are not distinguished from each other, and may be used interchangeably. This is also applicable to related embodiments of this application, and details are not described again.

Based on a subchannel reliability sequence in the technical specification TS38.212 released by the 3rd Generation Partnership Project (3GPP), an obtained set of channel indexes arranged based on reliability is [32, 31, 30, 28, 24, 16, 29, 23, 26, 27, 22, 15, 14, 20, 12, 8]. Elements in the channel index set are sequence numbers of channels. An information bit is placed at a more reliable location in channel transmission. The set of the listed channel indexes is used to place to-be-sent information bits. A preset bit is placed at a more unreliable location in channel transmission. Unlisted channel indexes are used to place frozen bits (that is, bits known to both an encoder and a decoder). The foregoing channel indexes start from 1 to the channel sequence number 32. Certainly, the channel indexes may alternatively start from 0 to the channel sequence number 31. In this case, the foregoing channel index set is [31, 30, 29, 27, 23, 15, 28, 22, 25, 26, 21, 14, 13, 19]. A channel index arrangement method is not limited in this embodiment of this application.

Optionally, the channel indexes may be arranged based on reliability, but are not necessarily arranged strictly in descending order of reliability or ascending order of reliability. Due to impact of factors such as rate matching, consideration of sequence nesting, and the like, reliability of some channels may not strictly comply with this arrangement criterion. Reliability-based arrangement in the specification of this application is not necessarily arrangement that is strictly in descending order of reliability or ascending order of reliability, but an overall change trend of reliability is definite.

S202: Determine a used pattern of the polar channel index set based on a value set of one of the 16 to-be-coded bits (the one to-be-coded bit may also be referred to as a location selection bit), where the pattern of the polar channel index set includes 15 indexes for placing remaining 15 of the 16 to-be-coded bits (the 15 to-be-coded bits may also be referred to as non-location-selection bits) and one index for placing a preset bit.

For ease of description, the K2 of the K to-be-coded bits are referred to as the location selection bit, and the K1 of the K to-be-coded bits are referred to as the non-location-selection bits. This is not repeated below. If the sixteenth information bit $b_{16}$ is selected as the location selection bit, there are two cases for $b_{16}$: $b_{16}$=0 or $b_{16}$=1. Determining of the location selection bit is not limited. Theoretically, any one of the information bits may be selected as the location selection bit, or any one of the cyclic redundancy check bits may be selected as the location selection bit.

For a polar coding manner concatenated with a parity check (PC) bit, a value of the PC bit may be determined in real time during polar coding. In this case, the location selection bit does not include the PC bit. Therefore, optionally, if the K to-be-coded bits include M parity-check bits, the K1 of the K to-be-coded bits include the M parity-check bits. In other words, no PC bit may become the location selection bit.

When a PC bit occurs in the to-be-coded bits, a remaining to-be-coded bit may be selected. In a specific embodiment, N=32, K=16+5=21 (16 information bits and five PC bits), and K2=1. In this case, a location selection bit may be selected from the 16 information bits. First, 21 subchannel locations are selected from 32 subchannels as an information bit set. Two information bit patterns are selected by using one location selection bit. Each pattern includes 20 information bits for placing remaining 15 information bits and the five PC bits. A current information bit pattern is determined based on the location selection bit, locations of the five PC bits are selected from current 20 information bits, and remaining 15 information bits are placed at remaining locations.

Figure 6A:
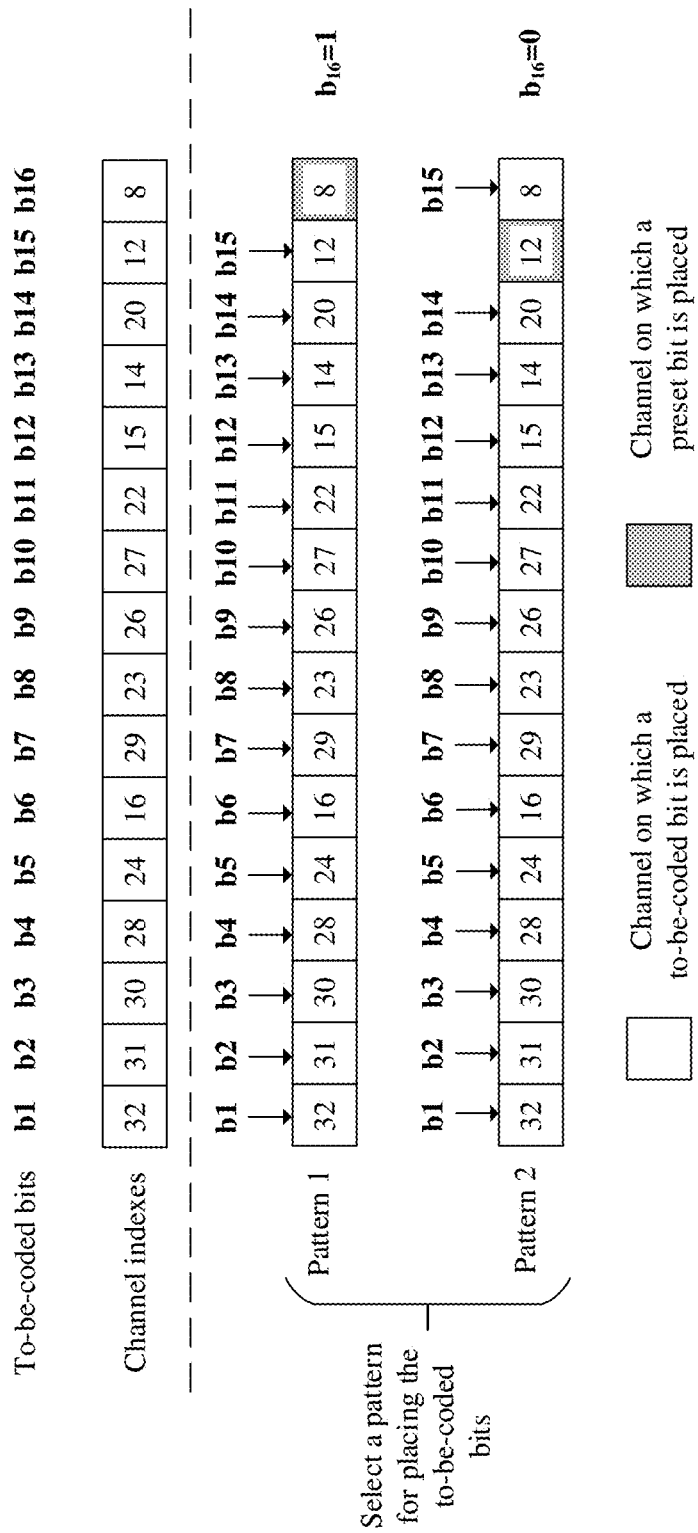
FIG. 6(a) is a schematic diagram of a polar channel index set pattern for a polar code with (32, 16) for which K2=1 according to an embodiment of this application.

After the value set of the location selection bit is determined, as shown in FIG. 6(a), the pattern of the polar channel index set is set as follows.

When $b_{16}=1$, [32, 31, 30, 28, 24, 16, 29, 23, 26, 27, 22, 15, 14, 20, 12] are used for the information bits, the 15 information bits are placed on polar channels corresponding to these indexes, and an index [8] is set to place the frozen bit. Such an information bit set pattern represents $b_{16}=1$.

When $b_{16}=0$, [32, 31, 30, 28, 24, 16, 29, 23, 26, 27, 22, 15, 14, 20, 8] are used for the information bits, the 15 information bits are placed on polar channels corresponding to these indexes, and an index [12] is set to place the frozen bit. Such an information bit set pattern represents $b_{16}=0$.

As an alternative manner of step 202, in step S202', the channel index set includes a fixed information bit and a candidate information bit, and the candidate information bit is determined based on a value set of the location selection bit, so as to construct a pattern of the information bit set. There is a correspondence between a pattern of the information bit set and a value of the location selection bit.

For ease of clear description, the channel index set is first divided into two parts: the fixed information bit and the candidate information bit. The fixed information bit means that each location thereof is determined as a location used to place an information bit. The candidate information bit means that some of information bits in the set are used to place an information bit, and another information bit in the set is used to place the preset bit (for example, the frozen bit). In the embodiments of this application, meanings of a candidate information bit and a fixed information bit are the same as those described above, and details are not described again. In this embodiment, an information bit index set [32, 31, 30, 28, 24, 16, 29, 23, 26, 27, 22, 15, 14, 20] is set for fixed information bits, and is used to place the K1 information bits. It may be understood that the set of the channel location indexes may be arranged from 0 or may be arranged from 1. This is not limited in any embodiment of this application. In the foregoing embodiment, the indexes are arranged from 1 to 32. If the indexes are arranged from 0, the information bit set is [31, 30, 29, 27, 23, 15, 28, 22, 25, 26, 21, 14, 13, 19]. The fixed information bit is set as an information bit that is fixedly used to place a to-be-sent information bit, and it may be considered that the fixed information bit does not participate in information bit pattern construction. This reduces a quantity of elements of the set, and facilitates pattern construction.

Optionally, K2 polar channels with comparatively low reliability are selected from the index set to place the K2 preset bits.

In consideration of channel reliability, two bits corresponding to [12, 8] are set as candidate information bits to construct an information bit set pattern. In one case, the subchannel index [8] may be used for the frozen bit, to place the frozen bit, and [12] is used for an information bit, to place an information bit $b_{15}$. Such an information bit set pattern represents $b_{16}=1$. In another case, the subchannel index [8] is used for an information bit, to place an information bit $b_{15}$, and [12] is used for the frozen bit, to place the frozen bit. Such an information bit set pattern represents $b_{16}=0$.

Figure 6B:
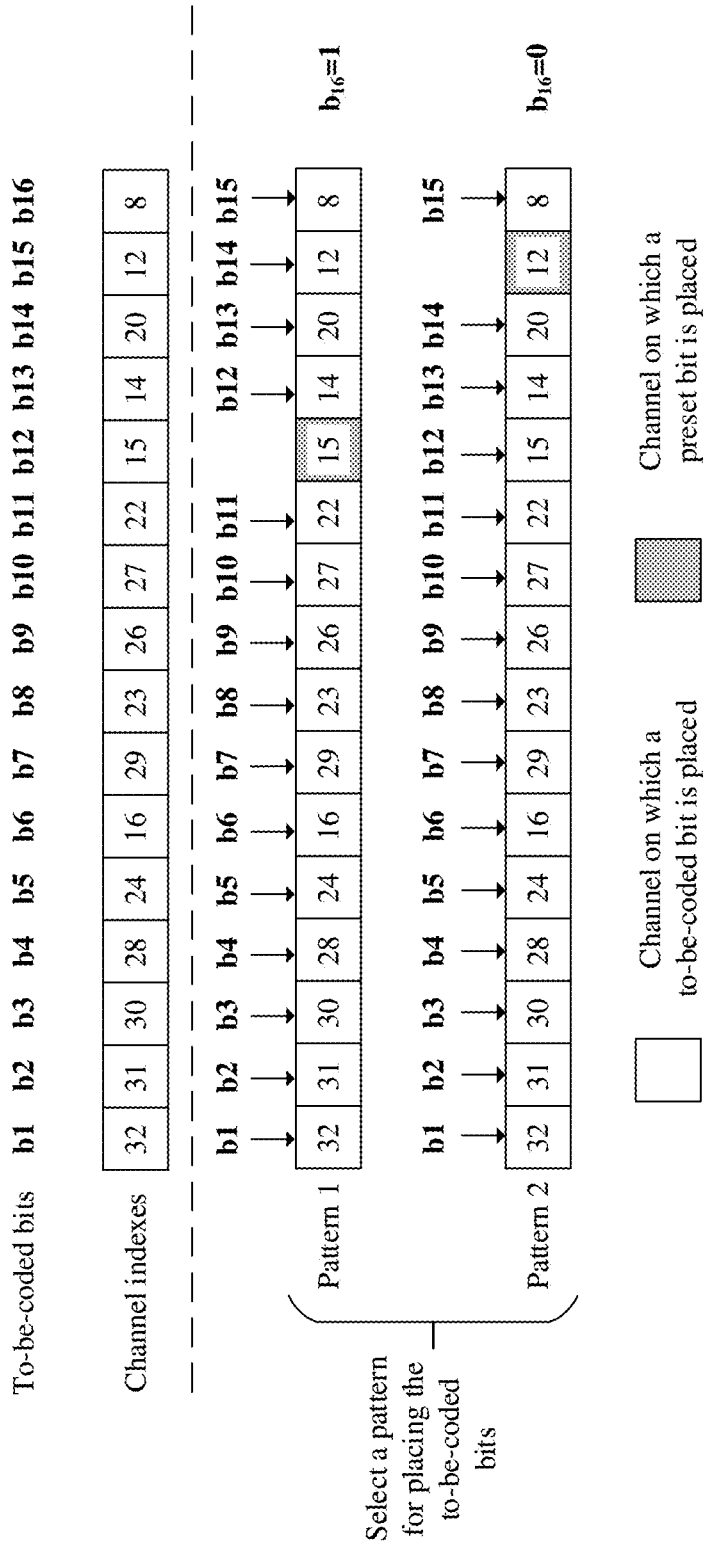
FIG. 6(b) is a schematic diagram of another polar channel index set pattern for a polar code with (32, 16) for which K2=1 according to an embodiment of this application.
Figure 6C:
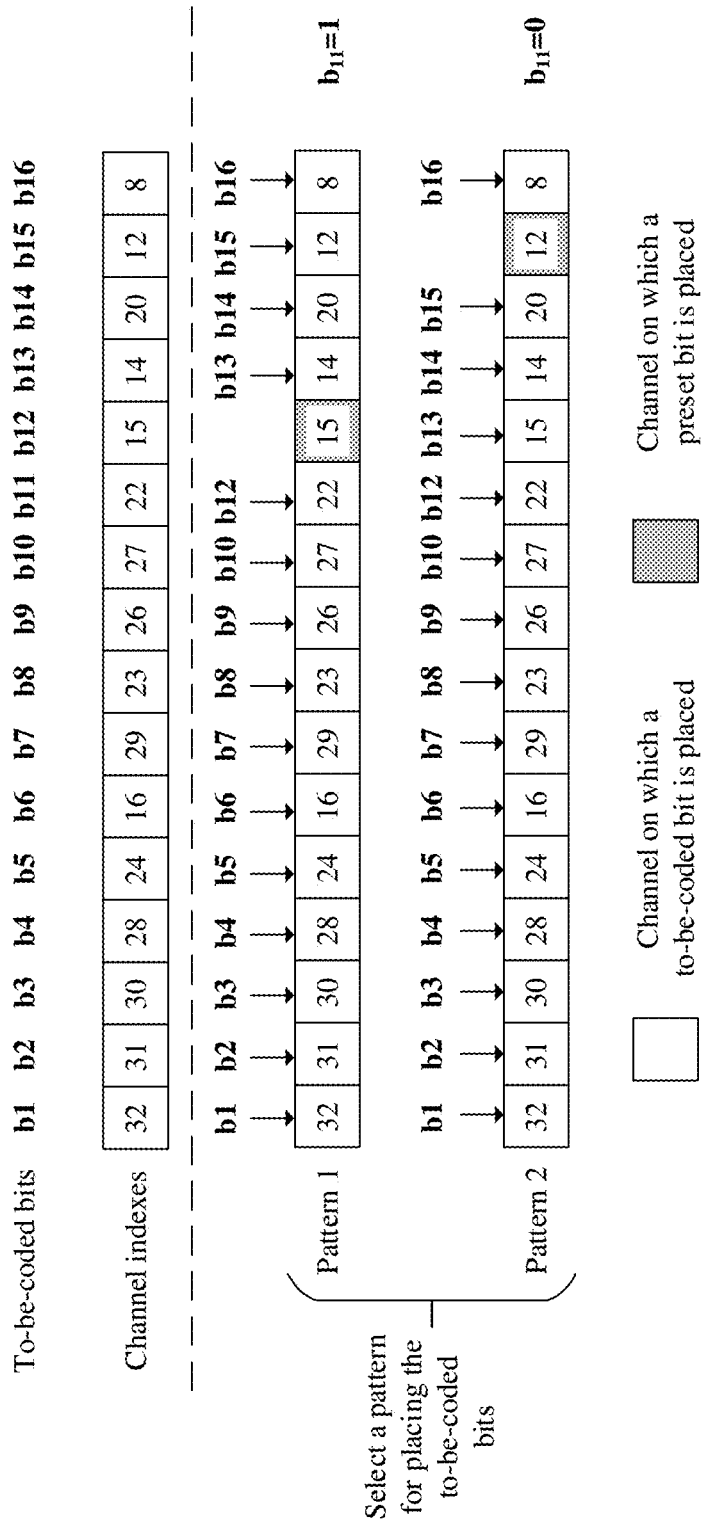
FIG. 6(c) is a schematic diagram of another polar channel index set pattern for a polar code with (32, 16) for which K2=1 according to an embodiment of this application.

Optionally, in another possible embodiment of this case, still for a polar code with (32, 16) for which K2=1, two information bits (or information bit indexes) may be selected, as candidate information bits, from the set of all the information bits according to a determined rule or a random rule, or a channel on which the frozen bit is placed is selected from all the information bits, to construct an information bit set pattern. Another polar channel index set pattern for a polar code with (32, 16) for which K2=1 is shown in FIG. 6(b). The location selection bit remains unchanged, and is still $b_{16}$. A channel on which the frozen bit is placed changes. [32, 31, 30, 28, 24, 16, 29, 23, 27, 22, 14, 20, 12, 8] and [32, 31, 30, 28, 24, 16, 29, 23, 26, 27, 22, 15, 14, 20, 8] are used for the information bits. In addition, alternatively, any information bit may be selected as the location selection bit, for example, $b_{11}$. Another polar channel index set pattern for a polar code with (32, 16) for which K2=1 is shown in FIG. 6(c). Compared with FIG. 6(b), channel indexes for the information bits remain unchanged, and the location selection bit changes from $b_{16}$ to $b_{11}$. In embodiments of all cases of this application, neither a method for constructing an information bit set pattern nor determining of a location selection bit is limited or agreed. The foregoing implementations are merely examples for description. Any method for constructing an information bit set pattern and any bit selection method that are obtained by a person skilled in the art under enlightenment by the embodiments of this application do not exceed the scope of the specification of this application.

It may be understood that essence of this solution is constructing different information bit patterns to represent different combinations for the location selection bit. Division into a candidate information bit helps determine an information bit pattern, but is not a mandatory feature. In another implementation, a candidate information bit may not be constructed, and different information bit patterns are directly used to correspond to different values of the location selection bit.

Optionally, a correspondence between an information bit pattern and a location selection bit value may be directly stored in storage units of a sending device and a receiving device, and a processor unit of the sending device or the receiving device invokes stored data and directly uses the data, with no need of a construction process. Such a method in which the correspondence is prestored may be used in all the embodiments of this application. Details are not described in other embodiments again.

S203: Perform polar coding on the 15 to-be-coded bits based on the determined index set pattern, to obtain the polar-coded codeword.

S204 (optional step): Perform some or all of steps including but not limited to rate matching, modulation mapping, analog-to-digital conversion, frequency conversion, and the like on the polar-coded codeword.

S205 (optional step): Send the polar-coded codeword on which an operation in step S204 is performed.

Figure 7:
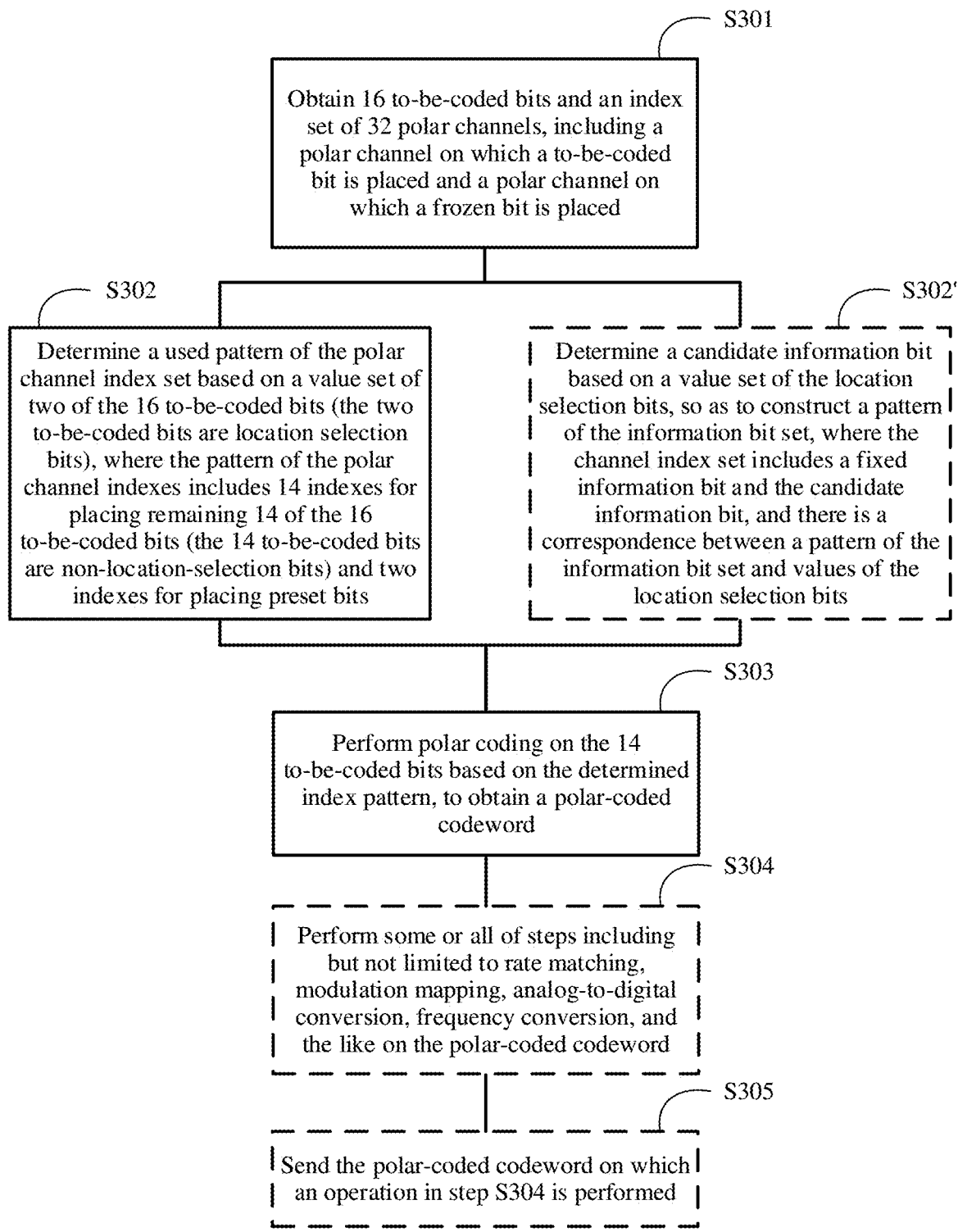
FIG. 7 is a schematic flowchart of a polar coding method according to an embodiment of this application.

FIG. 7 shows a specific embodiment of using a polar coding method according to an embodiment of this application. This embodiment is performed by a transmit end. This embodiment is for a polar code with (32, 16) for which K2=2 and to-be-sent to-be-coded bits do not need to be segmented. The method may include the following steps.

S301: Obtain 16 to-be-coded bits and an index set of 32 polar channels, including a polar channel on which a to-be-coded bit is placed and a polar channel on which a frozen bit is placed.

The transmit end constructs a polar code with (32, 16), a length K of the obtained to-be-sent to-be-coded bits is 16, K1=14, and K2=2. The 16 to-be-sent information bits are denoted by $b_1^{16}=[b_1, b_2, \ldots, b_{16}]$. Optionally, the information bits may include eight cyclic redundancy check (CRC) bits, or may not include any CRC bit, but all are information bits, or include an information bit and a PC bit. A channel index set is [32, 31, 30, 28, 24, 16, 29, 23, 26, 27, 22, 15, 14, 20, 12, 8]. The channel index set is the same as that in the foregoing embodiment, and details about a specific construction process are not described again.

S302: Determine a used pattern of the polar channel index set based on a value set of two of the 16 to-be-coded bits (the two to-be-coded bits are location selection bits), where the pattern of the polar channel indexes includes 14 indexes for placing remaining 14 of the 16 to-be-coded bits (the 14 to-be-coded bits are non-location-selection bits) and two indexes for placing preset bits.

Figure 8A:
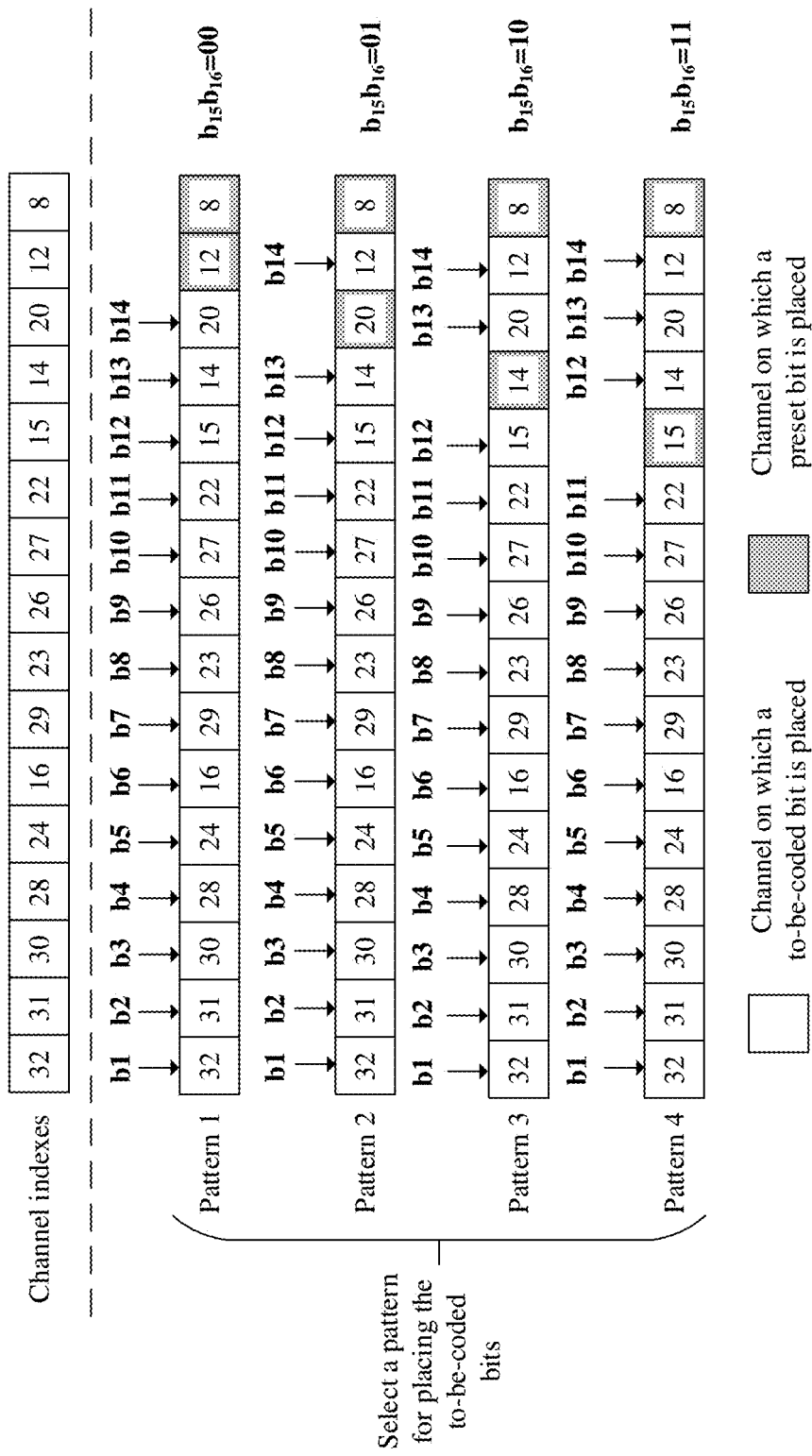
FIG. 8(a) is a schematic diagram of a polar channel index set pattern for a polar code with (32, 16) for which K2=2 according to an embodiment of this application.

In a specific embodiment, a case in which there are two location selection bits is considered. For a polar code with (32, 16), a quantity K2 of the location selection bits is 2, and a quantity K1 of the non-location-selection bits is 14. A polar channel index set pattern for a polar code with (32, 16) for which K2=2 is shown in FIG. 8(a). The fifteenth information bit $b_{15}$ and the sixteenth information bit $b_{16}$ are selected as the location selection bits. In this case, for values of [$b_{15}$, $b_{16}$], there are four cases: $b_{15}b_{16}$=00, $b_{15}b_{16}$=01, $b_{15}b_{16}$=10, or $b_{15}b_{16}$=11. Therefore, at least $2^2$ information bit patterns are needed.

Optionally, three locations may be selected from four candidate information bits to place information bits, and a frozen bit is placed at remaining one location. Because $C_4^3=4=2^2$, a requirement on a quantity of information bit patterns for two location selection bits is just satisfied.

The following is set.

When $b_{15}b_{16}$=00, [32, 31, 30, 28, 24, 16, 29, 23, 26, 27, 22, 15, 14, 20] are used for the information bits, the 14 information bits are placed on polar channels corresponding to these indexes, and polar channels corresponding to indexes [12, 8] are set to place frozen bits. Such an information bit set pattern represents $b_{15}b_{16}$=00.

When $b_{15}b_{16}$=01, [32, 31, 30, 28, 24, 16, 29, 23, 26, 27, 22, 15, 14, 12] are used for the information bits, the 14 information bits are placed on polar channels corresponding to these indexes, and polar channels corresponding to indexes [20, 8] are set to place frozen bits. Such an information bit set pattern represents $b_{15}b_{16}$=01.

When $b_{15}b_{16}$=10, [32, 31, 30, 28, 24, 16, 29, 23, 26, 27, 22, 15, 20, 12] are used for the information bits, the 14 information bits are placed on polar channels corresponding to these indexes, and polar channels corresponding to indexes [14, 8] are set to place frozen bits. Such an information bit set pattern represents $b_{15}b_{16}$=10.

When $b_{15}b_{16}$=11, [32, 31, 30, 28, 24, 16, 29, 23, 26, 27, 22, 14, 20, 12] are used for the information bits, the 14 information bits are placed on polar channels corresponding to these indexes, and polar channels corresponding to indexes [15, 8] are set to place frozen bits. Such an information bit set pattern represents $b_{15}b_{16}$=11.

As an alternative step of step S302, in step S302', the channel index set includes a fixed information bit and a candidate information bit, and the candidate information bit is determined based on a value set of the location selection bits, so as to construct a pattern of the information bit set. There is a correspondence between a pattern of the information bit set and values of the location selection bits.

Optionally, an information bit index set [32, 31, 30, 28, 24, 16, 29, 23, 26, 27, 22] is set for fixed information bits, and is used to place the first 11 information bits. An information bit index set [15, 14, 20, 12] is set for candidate information bits, to construct an information bit pattern. Channels corresponding to three indexes in the set are selected to place information bits, and a frozen bit is placed on a channel corresponding to remaining one index. Optionally, in consideration of reliability, one frozen bit is placed on a polar channel corresponding to an index [8]. The following is set.

When $b_{15}b_{16}$=00, [15, 14, 20] are used for the information bits, the three information bits are placed on polar channels corresponding to these indexes, and a polar channel corresponding to an index [12] is set to place the frozen bit. Such an information bit set pattern represents $b_{15}b_{16}$=00.

When $b_{15}b_{16}$=01, [15, 14, 12] are used for the information bits, the three information bits are placed on polar channels corresponding to these indexes, and a polar channel corresponding to an index [20] is set to place the frozen bit. Such an information bit set pattern represents $b_{15}b_{16}$=01.

When $b_{15}b_{16}$=10, [15, 20, 12] are used for the information bits, the three information bits are placed on polar channels corresponding to these indexes, and a polar channel corresponding to an index [14] is set to place the frozen bit. Such an information bit set pattern represents $b_{15}b_{16}$=10.

When $b_{15}b_{16}$=11, [14, 20, 12] are used for the information bits, the three information bits are placed on polar channels corresponding to these indexes, and a polar channel corresponding to an index [15] is set to place the frozen bit. Such an information bit set pattern represents $b_{15}b_{16}$=11.

Optionally, three locations may be alternatively selected from five candidate information bits to place information bits, and frozen bits are placed at remaining two locations. Because $C_5^3=10 \geq 2^2$, a requirement on a quantity of information bit patterns for two location selection bits is also satisfied. An extra information bit pattern may not be used, or a value of one location selection bit corresponds to a plurality of information bit patterns. The foregoing solution is merely an example for description. A quantity of candidate information bits and a construction manner are not limited in this application.

Figure 8B:
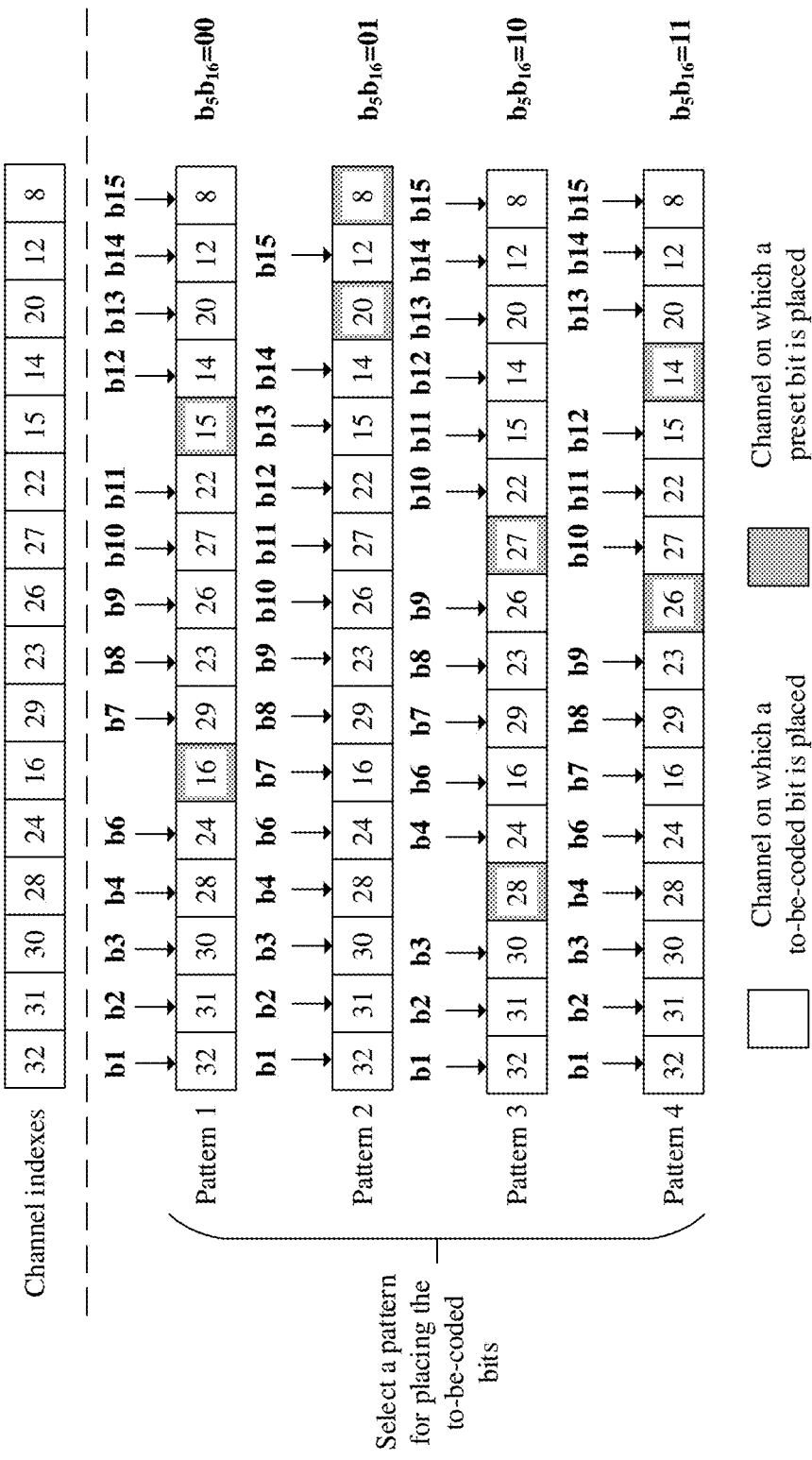
FIG. 8(b) is a schematic diagram of another polar channel index set pattern for a polar code with (32, 16) for which K2=2 according to an embodiment of this application.

Optionally, in another possible embodiment of this application, still for a polar code with (32, 16) for which K2=2, sufficient information bits may be selected, as candidate information bits, from the set of all information bits according to a determined rule or a random rule, to construct an information bit set pattern. Alternatively, a channel on which a frozen bit is placed is selected from all information bits, to construct an information bit set pattern. Determining of the location selection bits is also not limited. Another polar channel index set pattern for a polar code with (32, 16) for which K2=2 is shown in FIG. 8(b). The following is set.

When $b_5b_{16}$=00, polar channels corresponding to indexes [16, 15] are set to place frozen bits, and information bits are placed on polar channels corresponding to remaining indexes. Such an information bit set pattern represents $b_5b_{16}$=00.

When $b_5b_{16}$=01, polar channels corresponding to indexes [20, 8] are set to place frozen bits, and information bits are placed on polar channels corresponding to remaining indexes. Such an information bit set pattern represents $b_5b_{16}$=01.

When $b_5b_{16}$=10, polar channels corresponding to indexes [28, 27] are set to place frozen bits, and information bits are placed on polar channels corresponding to remaining indexes. Such an information bit set pattern represents $b_5b_{16}$=10.

When $b_5b_{16}$=11, polar channels corresponding to indexes [26, 14] are set to place frozen bits, and information bits are placed on polar channels corresponding to remaining indexes. Such an information bit set pattern represents $b_5b_{16}$=11.

Figure 8C:
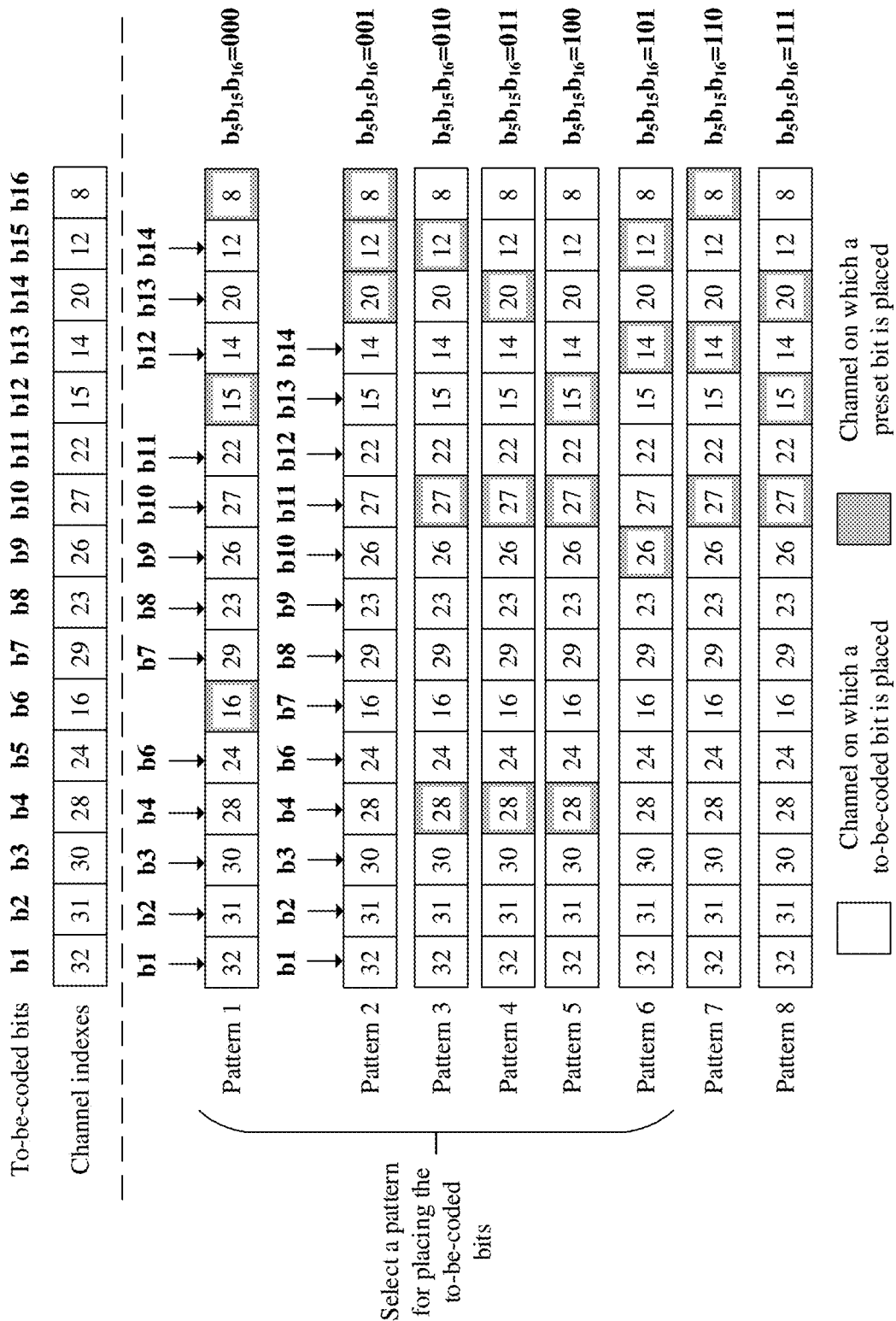
FIG. 8(c) is a schematic diagram of a polar channel index set pattern for a polar code with (32, 16) for which K2=3 according to an embodiment of this application.

Optionally, a quantity of bits that are not directly sent is not limited in this solution. A polar channel index set pattern for a polar code with (32, 16) for which K2=3 is shown in FIG. 8(c). Three bits $b_5b_{15}b_{16}$ are selected as bits that are not directly sent, and eight value sets of $b_5 b_{15} b_{16}$ represented by eight information bit patterns shown in FIG. 8(c).

S303: Perform polar coding on the 14 to-be-coded bits based on the determined index pattern, to obtain a polar-coded codeword.

Optionally, the method farther includes S304: Perform some or all of steps including but not limited to rate matching, modulation mapping, analog-to-digital conversion, frequency conversion, and the like on the polar-coded codeword.

Optionally, the method further includes S305: Send the polar-coded codeword on which an operation in step S304 is performed.

Figure 9:
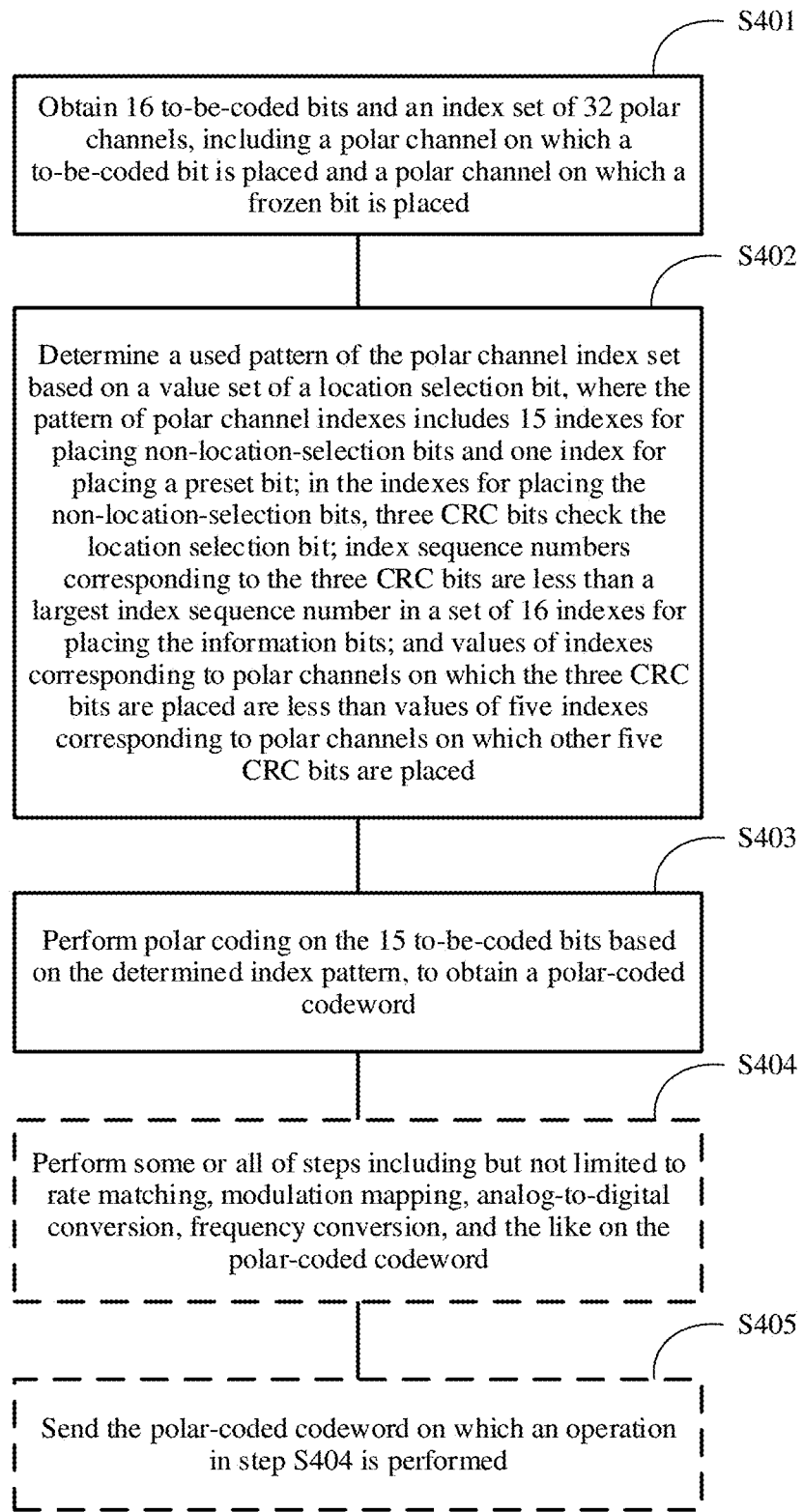
FIG. 9 is a schematic flowchart of a polar coding method according to an embodiment of this application.

FIG. 9 shows a specific embodiment of using a polar coding method according to an embodiment of this application. This embodiment is performed by a transmit end. This embodiment is for a polar code with (32, 16) for which a quantity K2 of location selection bits is 1, to-be-sent to-be-coded bits include a distributed cyclic redundancy check bit, and the to-be-coded bits are segmented. The method may include the following steps.

S401: Obtain 16 to-be-coded bits and an index set of 32 polar channels, including a polar channel on which a to-be-coded bit is placed and a polar channel on which a frozen bit is placed, where the to-be-coded bits include a distributed CRC bit.

The transmit end constructs a polar code with (32, 16), a length K of the obtained to-be-coded bits is 16, K1=15, and K2=1. The 16 to-be-sent information bits are denoted by $b_1^{16} = [b_1, b_2, \ldots, b_{16}]$. The information bits may include distributed cyclic redundancy check (CRC) bits whose length L is 8. A channel index set is [32, 31, 30, 28, 24, 16, 29, 23, 26, 27, 22, 15, 14, 20, 12, 8]. The channel index set is the same as that in the foregoing embodiment, and details about a specific construction process are not described again.

S402: Determine a used pattern of the polar channel index set based on a value set of the location selection bit. The pattern of the polar channel indexes includes 15 indexes for placing non-location-selection bits and one index for placing a preset bit. In the indexes for placing the non-location-selection bits, three CRC bits check the location selection bit. Index sequence numbers corresponding to the three CRC bits are less than a largest index sequence number in the set of the 16 indexes for placing the information bits. Values of indexes corresponding to polar channels on which the three CRC bits are placed are less than values of five indexes corresponding to polar channels on which other five CRC bits are placed.

Optionally, the K to-be-coded bits include a distributed CRC bit whose length is L, where L is a positive integer. At least C CRC bits check at least one of the K2 to-be-coded bits, and an index sequence number corresponding to the at least C CRC bits is less than a largest index sequence number in the set of the K indexes, where C is an integer greater than or equal to 1. In this specific embodiment, K=16, L=8, K2=1, and C is a positive integer not greater than 4.

Specifically, a value of C indexes corresponding to a polar channel on which the at least C CRC bits are placed is less than a value of (L−C) indexes corresponding to a polar channel on which other (L−C) CRC bits are placed. In this specific embodiment, (L−C) is a positive integer within a range from 4 to 7.

Figure 10:
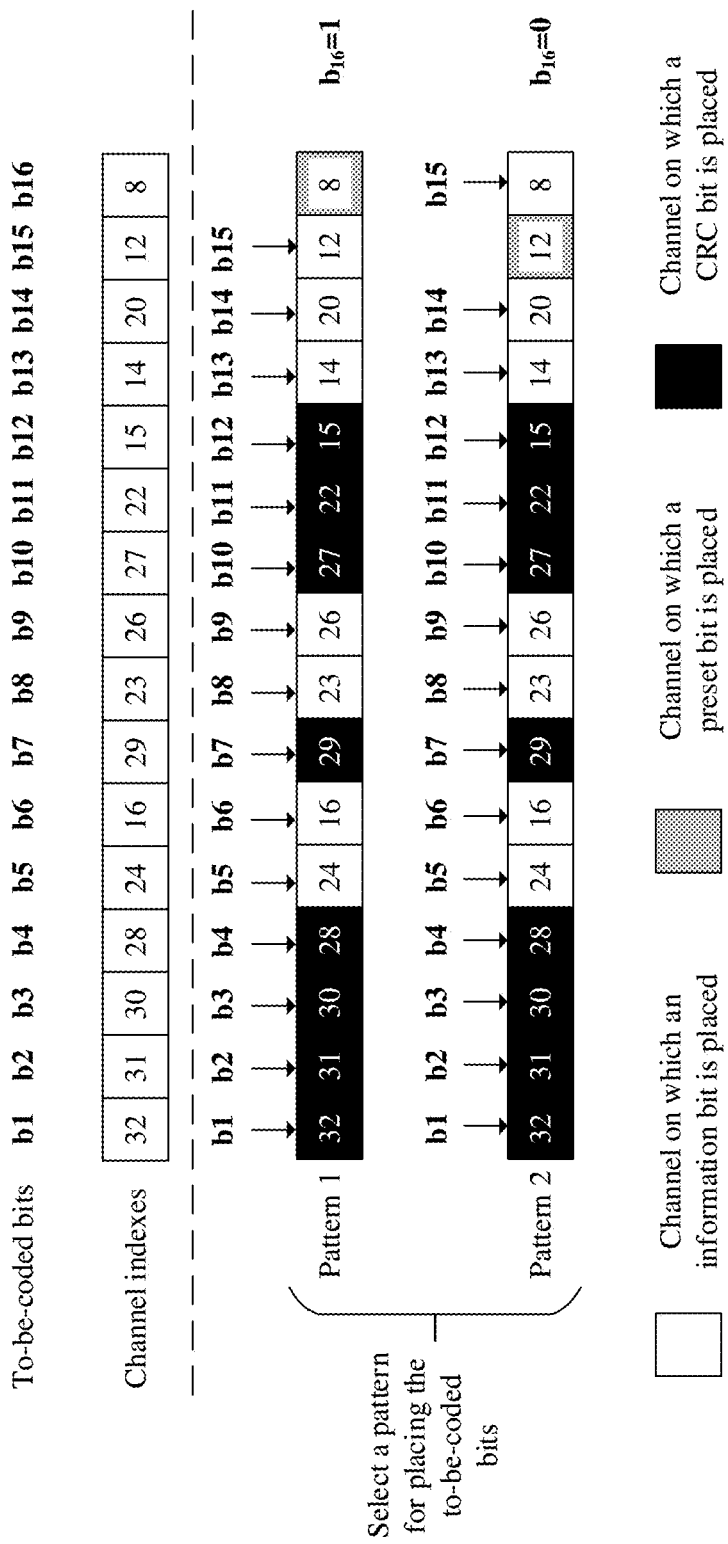
FIG. 10 is a schematic diagram of a polar channel index set pattern for a polar code with (32, 16) for which DCRC is used and K2=1 according to an embodiment of this application.

In a specific embodiment, a DCRC (distributed CRC) solution is considered for use for to-be-coded bits. FIG. 10 shows a polar channel index set pattern for a polar code with (32, 16) for which K2=1 and DCRC is used. As shown in the figure, a quantity K2 of location selection bits is 1, the sixteenth information bit $b_{16}$ is selected as the location selection bit, one information bit is selected from information bits 12 and 8 to place $b_{15}$, and remaining candidate information bits are used for frozen bits, to place frozen bits. For $b_{16}$, there are two cases: $b_{16}=0$ and $b_{16}=1$, respectively corresponding to two information bit patterns shown in FIG. 10. In FIG. 10, black filled blocks represent channels on which CRC bits are placed. There are eight CRC bits in total. Indexes of information bits at which the CRC bits are located are [32, 31, 30, 28, 29, 27, 22, 15]. A manner of placing other bits is the same as that in the foregoing embodiment.

CRC bits placed on polar channels corresponding to indexes [27, 22, 15] are used to check information bits placed on polar channels corresponding to indexes [14, 20, 12, 8]. The CRC bits placed on the polar channels corresponding to the indexes [27, 22, 15] are used as the first segment of decoded CRC bits. The information bits placed on the polar channels corresponding to the indexes [14, 20, 12, 8] are used as the first segment of decoded information bits. After the first segment of CRC bits and the first segment of information bits are decoded, the CRC bits check the information bits. $b_{16}$ is the location selection bit, and checks the information bits including $b_{16}$. Therefore, an erroneous information bit pattern can be identified, to give up decoding to-be-decoded information corresponding to the erroneous information bit pattern or erroneous information bit patterns.

Optionally, in another possible embodiment of this case, still for a polar code with (32, 16) for which K2=1, two information bits (or information bit indexes) may be selected, as candidate information bits, from the set of all information bits according to a determined rule or a random rule, or a channel on which a frozen bit is placed is selected from all information bits, to construct an information bit set pattern. During CRC bit interleaving, a segment of CRC bits for checking one or more location selection bits and the corresponding location selection bit are placed at the first decoding location, so as to reduce decoding workload of a receiving device, and terminate, in advance, continued decoding of to-be-decoded information corresponding to one or more information bit patterns that fail to pass CRC check. A distributed CRC technology is applied to the embodiments of this application, so that decoding for an erroneous pattern may be terminated in advance, thereby reducing complexity of blind detection performed by a receive end.

S403: Perform polar coding on the 15 to-be-coded bits based on the determined index pattern, to obtain a polar-coded codeword.

Optionally, the method farther includes S404: Perform some or all of steps including but not limited to rate matching, modulation mapping, analog-to-digital conversion, frequency conversion, and the like on the polar-coded codeword.

Optionally, the method further includes S405: Send the polar-coded codeword on which an operation in step S404 is performed.

Figure 11:
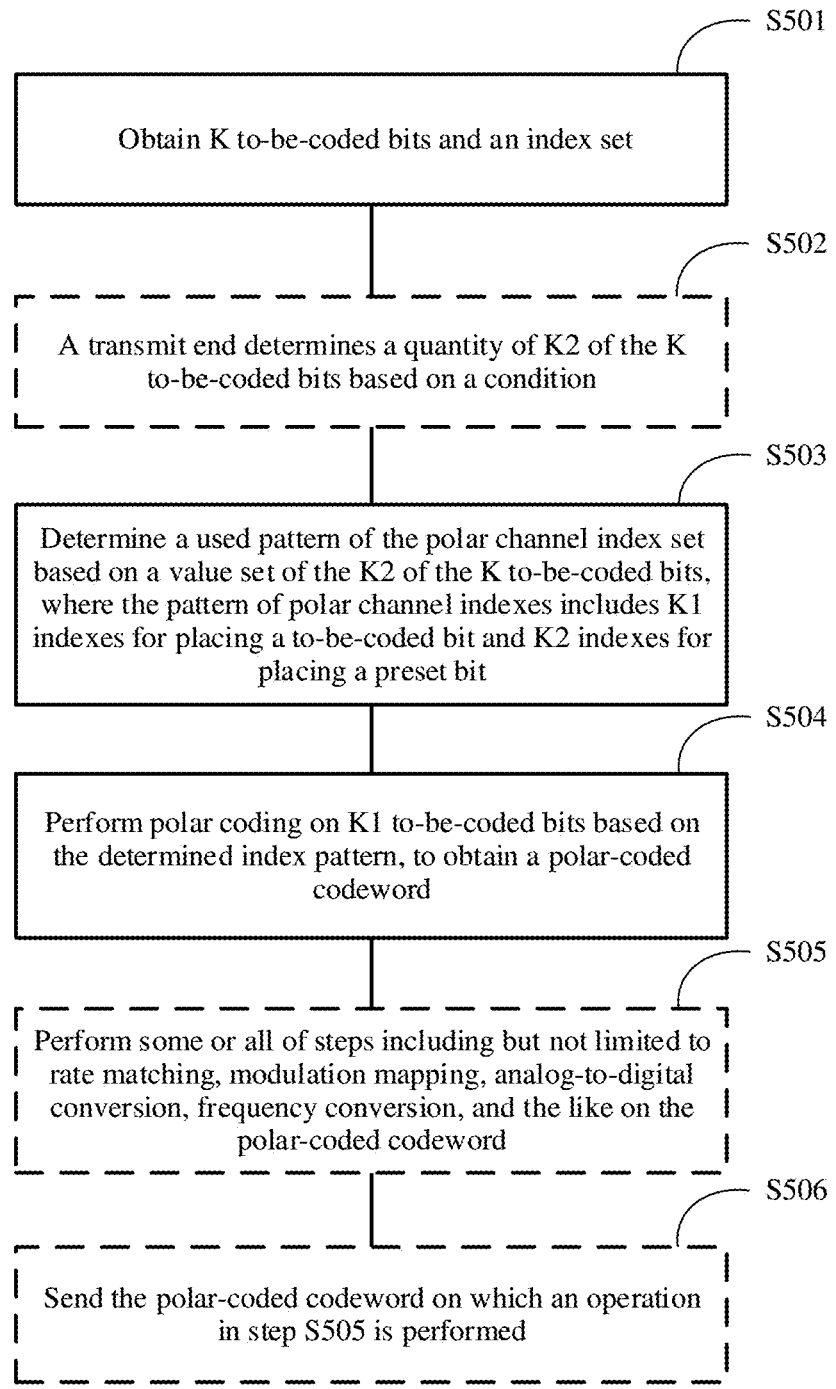
FIG. 11 is a schematic flowchart of a polar coding method according to an embodiment of this application.

FIG. 11 shows a specific embodiment of using a polar coding method according to an embodiment of this application. This embodiment is performed by a transmit end. This embodiment mainly discusses a condition that needs to be met for using the technical solution in this application, and how to determine a quantity K2 of location selection bits. The method may include the following steps.

S501: Obtain K to-be-coded bits and an index set.

S502 (optional step): The transmit end determines a quantity of K2 of the K to-be-coded bits based on a condition.

Optionally, a value of an indication flag is determined based on a value range of a preset parameter, and the indication flag is used to determine a value of K1 or a value of K2.

A decoder side needs to perform decoding based on correspondences between a plurality of information bit patterns and the location selection bit. Therefore, a calculation amount significantly increases. In addition, considering that an effect of this technical solution is better when a code length is comparatively small (reference may be made to a simulation result described below), adjusting the quantity K2 of location selection bits based on a preset parameter of actual communication can effectively improve an effect of the technical solution of this application, so that an advantage of the technical solution of this application can be brought into full play. The following describes the preset parameter in detail.

Optionally, the value of K2 is determined based on the indication flag S, where each value of the indication flag S corresponds to one or more values of K2.

Specifically, the indication flag S is a second value, and K2 is equal to 0, or the indication flag S is a first value, and K2 is an integer greater than 0 and less than K.

Optionally, the value of K1 is determined based on the indication flag S, where each value of the indication flag S corresponds to one or more values of K1.

Specifically, the indication flag S is a second value, and K1 is equal to K, or the indication flag S is a first value, and K1 is an integer greater than 0 and less than K.

In a specific embodiment, S is used to represent the indication flag (flag) for using the technical solution of this application. When the indication flag S is equal to 1 (or the first value), it indicates that the technical solution of this application is used (that is, the quantity K2 of location selection bits is greater than 0). When the indication flag S is equal to 0 (or the second value), it indicates that the technical solution of this application is not used (that is, the quantity K2 of location selection bits is equal to 0).

Details are as follows.

When the indication flag is the first value, K2 is greater than 0, or K1 is less than K.

When the indication flag is the second value, K2=0 or K1=K.

Optionally, the transmit end may send the indication flag. The transmit end directly sends the indication flag S to a receive end, so that the receive end learns whether this technical solution is used and the value of the quantity K2 of location selection bits.

Optionally, a value of K1 or K2 is determined based on a value range of a preset parameter, where the preset parameter includes one of the following: a user equipment category, a length N of a polar-coded codeword, a quantity K of the to-be-coded bits, and a code rate R, or the preset parameter includes two of the following: a user equipment category, a length N of a polar-coded codeword, a quantity K of the to-be-coded bits, and a code rate R, or the preset parameter includes three of the following: a user equipment category, a length N of a polar-coded codeword, a quantity K of the to-be-coded bits, and a code rate R, or the preset parameter includes a user equipment category, a length N of a polar-coded codeword, a quantity K of the to-be-coded bits, and a code rate R.

Specifically, the preset parameter includes the user equipment category. The user equipment category indicates an information processing capability of a terminal, and there is a correspondence between the user equipment category and K2. The transmit end may determine the quantity of location selection bits in the to-be-coded bits based on the user equipment category or another parameter that is in a user equipment capability (UE Capability) and that indicates the information processing capability of the terminal.

The terminal device capability (UE Capability) includes the user equipment category (UE Category), a packet data convergence protocol (PDCP) parameter, a radio link control (RLC) parameter, a physical layer parameter, a radio frequency (RF) parameter, and the like. The user equipment category (UE Category, UE Cat) can represent a level of a highest rate that can be reached in downloading and uploading by the terminal device, and indicate a data processing capability, maximum spatial multiplexing, a modulation and coding capability, and the like supported by the terminal. The terminal device capability is determined by performance of a communications chip of the terminal device. When communicating with a network device, the terminal device reports UE capability information of the terminal device, so that the network device can learn of the user equipment category of the terminal device. In a specific embodiment, the quantity K2 of location selection bits in the to-be-coded bits may be determined based on the terminal device capability. The technical specification TS36.306 R15 released by the 3GPP provides 12 levels of user equipment categories and uplink and downlink parameters of a user equipment category of each level. For a downlink physical layer user equipment category parameter value setting table, refer to Table 1. In this technical solution, K2 is determined based on a maximum number of downlink shared channel (DL-SCH) transport block bits received within a transmission time interval (TTI) (that is, a maximum download rate of the terminal device) in the table. A higher download rate may match a larger quantity of location selection bits, so as to match a calculation amount caused by blind detection performed by the decoder side on different information bit patterns. Table 2 and Table 3 each provide an example of correspondences between 12 UE category levels and K2. When K2=0, it indicates that an original polar code solution is used. K1=K−K2. It may be understood that, when a value of K is determined, Table 2 and Table 3 may also be equivalent to relationships between UE category levels and K1. In another possible implementation case, K2 may be determined based on another indication parameter (for example, a maximum number of bits of a DL-SCH transport block received within a TTI) of the terminal device. This is not limited in this application. The foregoing examples do not constitute a limitation on this application, either. In a future standard version, there may be a new manner of division into user equipment categories. A person skilled in the art may adaptively adjust a specific implementation method based on a solution idea of this application.

TABLE 1

Downlink physical layer user equipment category parameter value setting table
(Downlink physical layer parameter values set by the field UE-Category)

| UE category | Maximum number of DL-SCH transport block bits received within a TTI (Note 1) | Maximum number of bits of a DL-SCH transport block received within a TTI | Total number of soft channel bits | Maximum number of supported layers for spatial multiplexing in DL |
|---|---|---|---|---|
| Category 1 | 10296 | 10296 | 250368 | 1 |
| Category 2 | 51024 | 51024 | 1237248 | 2 |
| Category 3 | 102048 | 75376 | 1237248 | 2 |
| Category 4 | 150752 | 75376 | 1827072 | 2 |
| Category 5 | 299552 | 149776 | 3667200 | 4 |
| Category 6 | 301504 | 149776 (4 layers, 64QAM) 75376 (2 layers, 64QAM) | 3654144 | 2 or 4 |
| Category 7 | 301504 | 149776 (4 layers, 64QAM) 75376 (2 layers, 64QAM) | 3654144 | 2 or 4 |
| Category 8 | 2998560 | 299856 | 35982720 | 8 |
| Category 9 | 452256 | 149776 (4 layers, 64QAM) 75376 (2 layers, 64QAM) | 5481216 | 2 or 4 |
| Category 10 | 452256 | 149776 (4 layers, 64QAM) 75376 (2 layers, 64QAM) | 5481216 | 2 or 4 |
| Category 11 | 603008 | 149776 (4 layers, 64QAM) 195816 (4 layers, 256QAM) 75376 (2 layers, 64QAM) 97896 (2 layers, 256QAM) | 7308288 | 2 or 4 |
| Category 12 | 603008 | 149776 (4 layers, 64QAM) 195816 (4 layers, 256QAM) 75376 (2 layers, 64QAM) 97896 (2 layers, 256QAM) | 7308288 | 2 or 4 |

TABLE 2

Correspondence between a user equipment category and K2

| UE category | K2 |
|---|---|
| Category 1 | 0 |
| Category 2 | 1 |
| Category 3 | 1 |
| Category 4 | 1 |
| Category 5 | 2 |
| Category 6 | 2 |
| Category 7 | 2 |
| Category 8 | ≥3 |
| Category 9 | 2 |
| Category 10 | 2 |
| Category 11 | 2 |
| Category 12 | 2 |

TABLE 3

Correspondence between a user equipment category and K2

| UE category | K2 |
|---|---|
| Category 1 | 0 |
| Category 2 | 0 |
| Category 3 | 1 |
| Category 4 | 1 |
| Category 5 | 2 |
| Category 6 | 2 |
| Category 7 | 2 |
| Category 8 | ≥4 |
| Category 9 | 2 |
| Category 10 | 2 |
| Category 11 | 3 |
| Category 12 | 3 |

Optionally, if the preset parameter meets a first condition, K2=0, or if the preset parameter meets a second condition, K2 is an integer greater than 0 and less than K. Specifically, the preset parameter includes the length (code length) N of the polar-coded codeword, the length K of the to-be-coded bits (information bits), and the code rate R.

The transmit end may further determine, based on parameter information such as the code length, the code rate, and the information bit length or based on a combination of all the foregoing parameter information (including the terminal device category), whether to use the technical solution of this application (whether the quantity K2 of location selection bits is 0). The value of K2 is comprehensively considered. For example, the quantity of location selection bits is determined based on whether parameters such as the code length, the information bit sequence length, and the terminal device capability meet specified thresholds.

In an embodiment, S is used to represent the flag for using the technical solution of this application. "S=1" is used to indicate that the technical solution of this application is used (that is, the quantity K2 of location selection bits is greater than 0). "S=0" is used to indicate that the technical solution of this application is not used. Specifically, there may be one or a combination of more than one of the following plurality of solutions.

(1) The quantity K2 of location selection bits is selected based on the code length.

If the code length N≤512 (the second condition), S=1 or K2>0, or if N>512 (the first condition), S=0 or K2=0.

If N≤512 may be further divided, if 128≤N≤512, K2=2, or if N<128, K2=1.

(2) The quantity K2 of location selection bits is selected based on a quantity K of the to-be-coded bits.

If the quantity of the to-be-coded bits K≤256 (the second condition), S=1 or K2>0, or if K>256 (the first condition), S=0 or K2=0.

This may be further divided. If 64≤K≤256, K2=2, or if K<64, K2=1.

(3) The quantity K2 of location selection bits is selected based on the code rate.

If the code rate R≤½ (the second condition), S=1 or K2>0, or if R>½ (the first condition), S=0 or K2=0.

This may be further divided. If ¼≤R≤½, K2=0 or K2=1, or if 0≤R≤¼, K2=1 or K2=2.

The code rate herein may be a mother-code code rate K/N or an actual transmission code rate K/E, where E is an actually transmitted bit length or a length obtained through rate matching.

(4) The quantity K2 of location selection bits is selected based on the user equipment category, for example, a correspondence in any one or more rows in Table 2 or Table 3.

For example, according to Table 2, if the user category is the category 1 (the first condition), K2=0, or if the user category is one of the categories 2 to 12 (the second condition), K2>0. Optionally, if the user category is any one of the categories 2 to 4, K2=1, or if the user category is any one of the categories 5 to 7 or 9 to 12, K2=2. If the user category is the category 8, K2≥3.

For example, according to Table 3, if the user category is the category 1 or the category 2 (the first condition), K2=0, or if the user category is one of the categories 3 to 12 (the second condition), K2>0. Optionally, if the user category is either of the categories 3 and 4, K2=1, or if the user category is any one of the categories 5 to 7 or 9 to 12, K2=2. If the user category is the category 8, K2≥4.

(5) The values of the indication flag S and K2 are determined by comprehensively considering the foregoing factors.

When the user equipment category UECategory=9, N≤512, and 64≤K≤256, S=1, and K2 may be 1 or 2.

When the user equipment category UECategory=9 and ¼≤R≤½, S=1, and K2 may be 1.

When the user equipment category UECategory=9, N<128, K<64, and 0≤R≤¼, S=1, and K2 may be 1.

The foregoing preset parameters and specific conditions are merely examples. In each specific condition in the whole specification of this application, "equal to" may be placed in a condition of "greater than or equal to", or may be placed in a condition of "less than or equal to". This is not limited in this application provided that they do not conflict with each other. For example, in the case (1), "if the code length N≤512, S=1 or K>0, or if N>512, S=0 or K2=0" may be changed to "if the code length N<512, S=1 or K2>0, or if N≥512, S=0 or K2=0". Other cases may be deduced by analogy, and are not described herein one by one.

It may be understood that the indication flag (flag) S in the technical solution of this application may not be used, and the quantity K2 of location selection bits may be directly configured based on a status of meeting a specified threshold.

S503: Determine a used pattern of the polar channel index set based on a value set of the K2 of the K to-be-coded bits, where the pattern of the polar channel indexes includes K1 indexes for placing a to-be-coded bit and K2 indexes for placing a preset bit.

S504: Perform polar coding on the K1 to-be-coded bits based on the determined index pattern, to obtain the polar-coded codeword.

S505: Perform some or all of steps including but not limited to rate matching, modulation mapping, analog-to-digital conversion, frequency conversion, and the like on the polar-coded codeword.

S506: Send the polar-coded codeword on which an operation in step S505 is performed.

Figure 12:
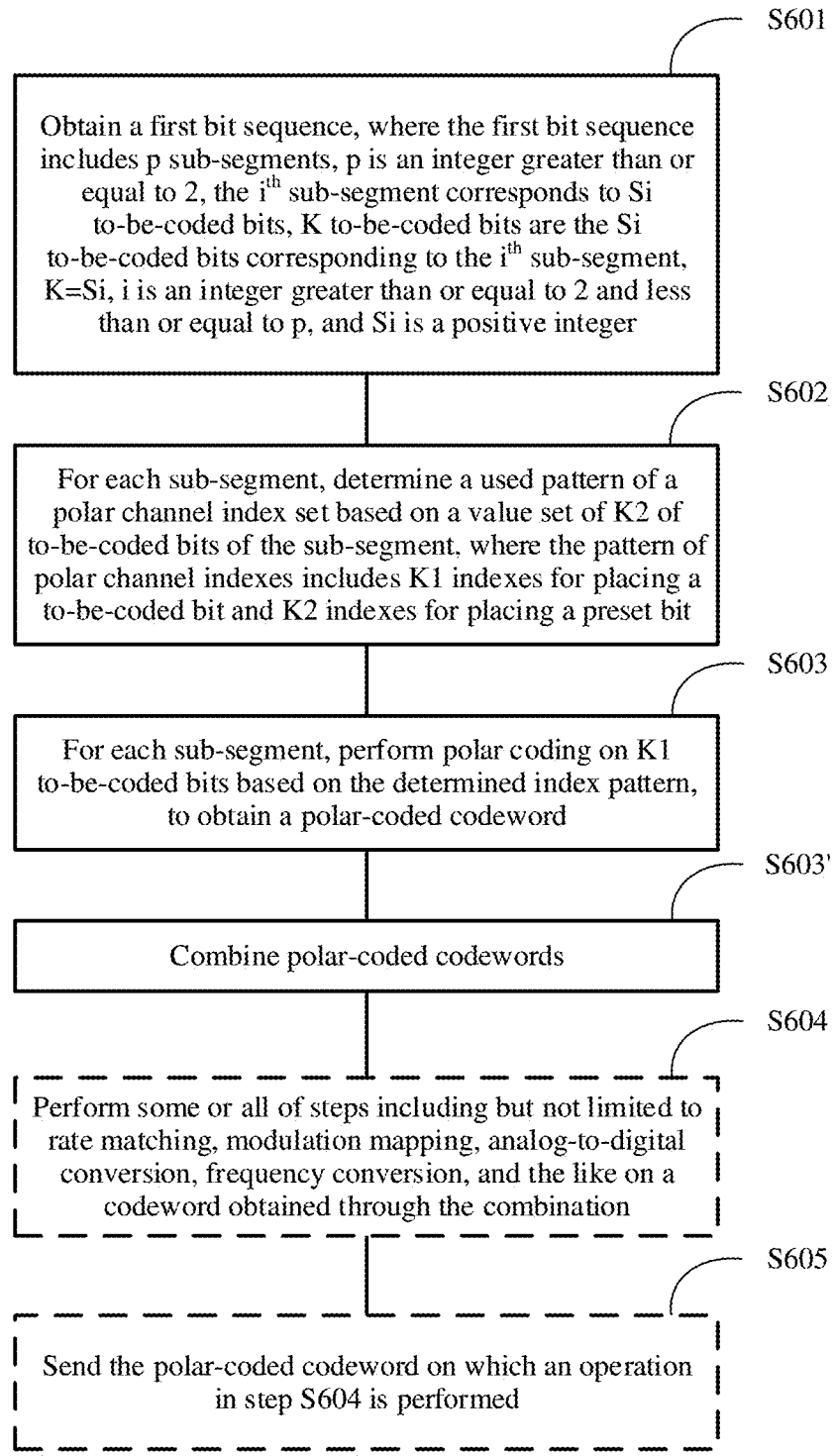
FIG. 12 is a schematic flowchart of a polar coding method according to an embodiment of this application.

FIG. 12 shows a specific embodiment of using a coding method according to an embodiment of this application. This embodiment is performed by a transmit end. In this embodiment, a length of to-be-transmitted bits (referred to as a first bit sequence below) is comparatively large. (The to-be-coded bits may be payload payload bits, or a payload payload bit and a CRC bit, or a payload payload bit, a CRC bit, and a PC bit. This is described below with reference to specific cases.) The to-be-transmitted bits may be segmented, and lengths of all sub-segments obtained through segmentation may be equal or unequal. The coding method in the foregoing embodiment is performed for each sub-segment. The method may include the following steps.

S601: Obtain the first bit sequence, where the first bit sequence includes p sub-segments, and p is an integer greater than or equal to 2.

The $i^{th}$ sub-segment corresponds to Si to-be-coded bits. For coding of the $i^{th}$ segment, K to-be-coded bits are the Si to-be-coded bits corresponding to the $i^{th}$ sub-segment. K=Si, i is an integer greater than or equal to 2 and less than or equal to p, and Si is a positive integer. A quantity of Si to-be-coded bits corresponding to each sub-segment herein is not necessarily equal to a length of the sub-segment. For pure polar coding, that is, polar coding not concatenated with CRC, PC, or the like, after the first bit sequence is divided into the p sub-segments, a length of each sub-segment is a quantity of to-be-coded bits corresponding to the sub-segment. However, for polar coding concatenated with CRC or PC, segmentation may be performed before concatenation with a CRC check bit or a PC bit. In this case, to-be-coded bits corresponding to each sub-segment include a CRC check bit or a PC bit. Alternatively, concatenation with a CRC check bit or a PC bit may be performed before segmentation. In this case, to-be-coded bits corresponding to each sub-segment may also include a CRC check bit or a PC bit.

Optionally, the first bit sequence is payload payload bits, and the first bit sequence is first segmented, for example, divided into two segments. In a specific case, an objective is to divide the first bit sequence into two segments with equal lengths. If a bit quantity of the first bit sequence is an even number, the first bit sequence is evenly divided into two segments. If a bit quantity of the first bit sequence is an odd number, the first bit sequence is divided into a segment of $$\left\lceil \frac{K_s}{2} \right\rceil$$

bits and a segment of $$\left\lfloor \frac{K_s}{2} \right\rfloor$$

bits. Ks is a length of the first bit sequence, $$\left\lceil \frac{K_s}{2} \right\rceil$$

represents rounding up to a maximum integer, and $$\left\lfloor \frac{K_s}{2} \right\rfloor$$

represents rounding down to a maximum integer. For example, $\lceil 4.9 \rceil = 5$, and $\lfloor 4.9 \rfloor = 4$. For the sub-segment whose length is $\lfloor \frac{K_s}{2} \rfloor$, zero-fill (fill) is performed at an end or a start of the sequence. Optionally, if the bit quantity of the first bit sequence is an odd number, zero-fill (fill) may be performed at the end or start of the first bit sequence, so that the bit quantity of the first bit sequence becomes an even number, and then the first bit sequence is evenly divided into two segments. CRC coding or PC coding is performed on each sub-segment after segmentation is completed. In this case, the Si to-be-coded bits corresponding to the $i^{th}$ (i=1 or i=2) sub-segment include a payload payload bit, and further include a CRC bit if CRC coding is performed, or further include a PC bit if PC coding is performed, or farther include a CRC bit and a PC bit if both CRC coding and PC coding are performed.

Optionally, the first bit sequence is payload payload bits. CRC coding, PC coding, or both CRC coding and PC coding is/are first performed on the first bit sequence, and then the first bit sequence is segmented. For a segmentation method, refer to the foregoing content. In this case, the Si to-be-coded bits corresponding to the $i^{th}$ sub-segment may include some of payload payload bits, some of CRC bits (if CRC coding is performed), and some of PC bits (if PC coding is performed).

After segmentation is completed, the Si to-be-coded bits of the $i^{th}$ sub-segment may be considered as the K to-be-coded bits in the coding method in the foregoing embodiment. Then, another step in the technical solution of this application continues to be performed.

It may be understood that a trailing bit in this example is 0, or may actually be 1.

During segmentation, a codeword length N and a length K of to-be-coded bits, or a length of to-be-coded bits and a code rate R are mainly considered. For example, preferably, when 32≤Ks≤256 and R≤½, to-be-coded bits may be divided into two segments.

When 256<Ks≤1024 and R≤½, the to-be-coded bits may be divided into two segments, three segments, or four segments.

For example, Ks is an even number, and the to-be-coded bits are divided into two segments. In this case, to-be-coded bits of each sub-segment are divided into two parts: K1 to-be-coded bits and K2 to-be-coded bits, where KS/2=K1+K2. The transmit end determines a set including M channel indexes. The index set includes indexes of Ks/2 polar channels for placing a to-be-coded bit and a preset bit. A polar channel corresponding to K1 indexes in the index set is used to place the K1 of the Ks/2 to-be-coded bits. A polar channel corresponding to K2 indexes in the index set is used to place K2 preset bits. The index set may be prestored at the transmit end, to be directly used. Ks, K1, K2, and M are positive integers.

S602: For each sub-segment, determine a used pattern of a polar channel index set based on a value set of K2 of to-be-coded bits of the sub-segment, where the pattern of polar channel indexes includes K1 indexes for placing a to-be-coded bit and K2 indexes for placing a preset bit.

S603: For each sub-segment, perform polar coding on K1 to-be-coded bits based on the determined index pattern, to obtain a polar-coded codeword.

Optionally, the method farther includes S603': Combine polar-coded codewords.

Optionally, the method further includes S604: Perform some or all of steps including but not limited to rate matching, modulation mapping, analog-to-digital conversion, frequency conversion, and the like on a codeword obtained through the combination.

Optionally, the method further includes S605: Send the polar-coded codeword on which an operation in step S604 is performed.

In a specific embodiment, a length Ks of the to-be-coded bits obtained by the transmit end is 32, and the to-be-coded bits are divided into two sub-segments with equal lengths, that is, a length of to-be-coded bits of the sub-segment is 16. Each sub-segment includes an equal quantity of location selection bits. K=15, and K2=1. A length N of a codeword obtained through polar coding of each sub-segment is 32. The 16 to-be-coded information bits of each sub-segment are denoted by $b_1^{16}=[b_1, b_2, \ldots, b_{16}]$. Channel index sets of both the sub-segments are also the same as each other. The channel index set of the sub-segment is [32, 31, 30, 28, 24, 16, 29, 23, 26, 27, 22, 15, 14, 20, 12, 8]. Details about a specific construction process are not described again.

For each sub-segment, the sixteenth information bit $b_{16}$ is selected as the location selection bit. In this case, there are two cases for $b_{16}$: $b_{16}=0$ or $b_{16}=1$. It may be understood that the location selection bit in each sub-segment is not necessarily the last bit, but may be any to-be-coded bit. This is not limited in this embodiment of this application. The pattern of the polar channel index set of each sub-segment is set to be the same as that shown in FIG. 6(a).

When $b_{16}=1$, [32, 31, 30, 28, 24, 16, 29, 23, 26, 27, 22, 15, 14, 20, 12] are used for information bits, the 15 information bits are placed on polar channels corresponding to these indexes, and an index [8] is set to place a frozen bit. Such an information bit set pattern represents $b_{16}=1$.

When $b_{16}=0$, [32, 31, 30, 28, 24, 16, 29, 23, 26, 27, 22, 15, 14, 20, 8] are used for information bits, the 15 information bits are placed on polar channels corresponding to these indexes, and an index [12] is set to place a frozen bit. Such an information bit set pattern represents $b_{16}=0$.

The pattern of the polar channel index set of each sub-segment is selected based on the to-be-coded bits of the sub-segment. The to-be-coded bits of each sub-segment are placed at a corresponding channel location. Polar coding is performed on the 15 to-be-coded bits of each sub-segment, to obtain the polar-coded codewords of the two sub-segments.

After the codewords obtained through polar coding of the two sub-segments are combined, some or all of steps including but not limited to rate matching, modulation mapping, analog-to-digital conversion, frequency conversion, and the like are performed. Finally, the codeword is sent.

Figure 13:
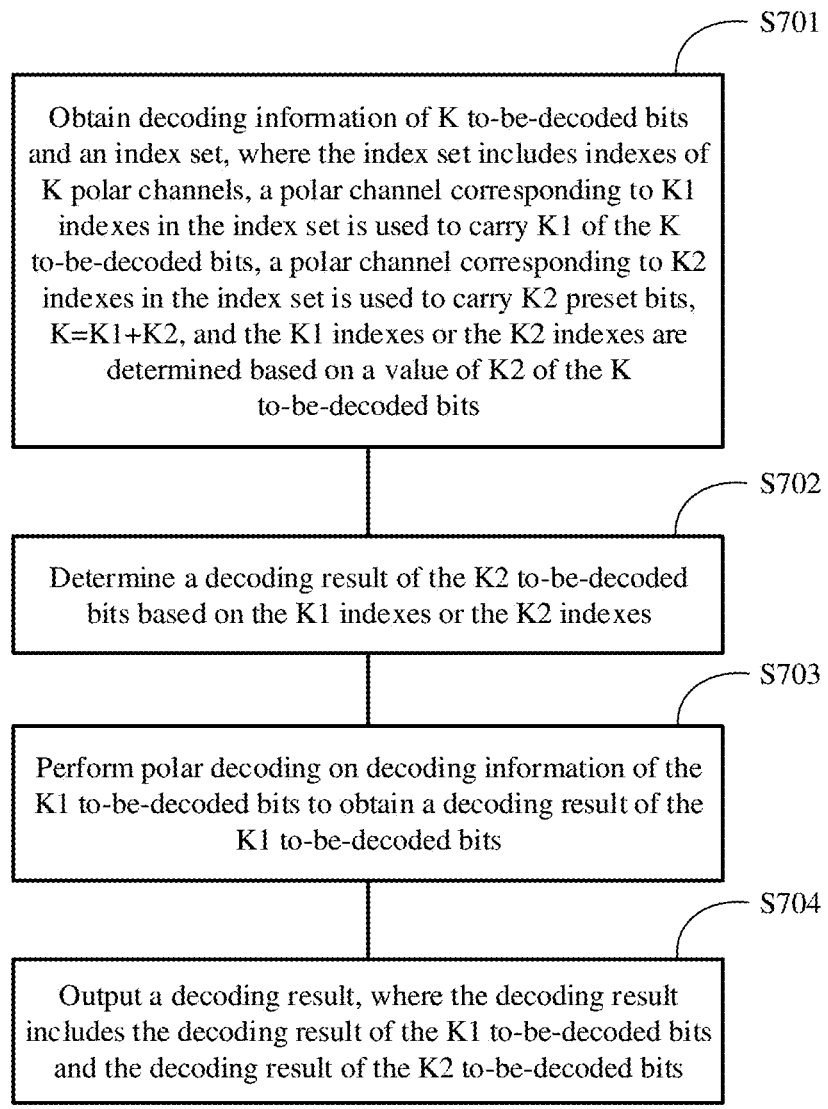
FIG. 13 is a schematic flowchart of a polar decoding method according to an embodiment of this application.

FIG. 13 is a flowchart of a polar code decoding method according to an embodiment of this application. This embodiment is performed by a receive end. The method may include the following steps.

S701: Obtain decoding information of K to-be-decoded bits and an index set, where the index set includes indexes of K polar channels, a polar channel corresponding to K1 indexes in the index set is used to carry K1 of the K to-be-decoded bits, a polar channel corresponding to K2 indexes in the index set is used to carry K2 preset bits, K=K1+K2, and the K1 indexes or the K2 indexes are determined based on a value of K2 of the K to-be-decoded bits.

S702: Determine a decoding result of the K2 to-be-decoded bits based on the K1 indexes or the K2 indexes.

S703: Perform polar decoding on decoding information of the K1 to-be-decoded bits to obtain a decoding result of the K1 to-be-decoded bits.

S704: Output a decoding result, where the decoding result includes the decoding result of the K1 to-be-decoded bits and the decoding result of the K2 to-be-decoded bits.

Optionally, in step S701, if a preset parameter meets a first condition, K2=0, or if a preset parameter meets a second condition, K2 is an integer greater than 0 and less than K. For details, refer to the foregoing embodiments.

Specifically, in step S701, there are $2^{K2}$ value sets of the K2 of the K to-be-coded bits, and each value set of the K2 to-be-coded bits corresponds to at least one value set of the K1 indexes, or each value set of the K2 to-be-coded bits corresponds to at least one value set of the K2 indexes.

Optionally, K2=1 or K2=2.

Optionally, the K to-be-coded bits include M parity-check bits, and the K1 of the K to-be-coded bits include the M parity-check bits.

Optionally, a value of K1 or a value of K2 is determined based on a received indication flag. Each value of the indication flag corresponds to one or more values of K2, or each value of the indication flag corresponds to one or more values of K1.

Details are as follows.

When the indication flag is a first value, K2 is greater than 0, or K1 is less than K.

When the indication flag is a second value, K2=0 or K1=K.

For example, decoding is performed in a specific embodiment of distributed CRC. A decoder side has learned of a correspondence between an information bit set pattern and a location selection bit by using a received indication flag or a pre-agreed rule, where the correspondence is shown in FIG. 10. For a polar code with (32, 16), a quantity K2 of location selection bits is 1. If the sixteenth information bit $b_{16}$ is selected as the location selection bit, there are two cases for $b_{16}$: $b_{16}=0$ or $b_{16}=1$. The decoder side has learned of the following.

When $b_{16}=1$, [32, 31, 30, 28, 24, 16, 29, 23, 26, 27, 22, 15, 14, 20, 12] are used for information bits, the 15 information bits are placed on polar channels corresponding to these indexes, and an index [8] is set to place a frozen bit. Such an information bit set pattern represents $b_{16}=1$.

When $b_{16}=0$, [32, 31, 30, 28, 24, 16, 29, 23, 26, 27, 22, 15, 14, 20, 8] are used for information bits, the 15 information bits are placed on polar channels corresponding to these indexes, and an index [12] is set to place a frozen bit. Such an information bit set pattern represents $b_{16}=0$.

In FIG. 10, black filled blocks represent channels on which CRC bits are placed. There are eight CRC bits in total. Indexes of information bits at which the CRC bits are located are [32, 31, 30, 28, 29, 27, 22, 15]. CRC bits placed on polar channels corresponding to indexes [27, 22, 15] are used to check information bits placed on polar channels corresponding to indexes [14, 20, 12, 8].

The receive end starts to perform decoding separately based on two different information bit set patterns.

The CRC bits placed on the polar channels corresponding to the indexes [27, 22, 15] are used as the first segment of decoded CRC bits. The information bits placed on the polar channels corresponding to the indexes [14, 20, 12, 8] are used as the first segment of decoded information bits. After the first segment of CRC bits and the first segment of information bits are decoded, the CRC bits check the information bits. $b_{16}$ is the location selection bit, and checks the information bits including $b_{16}$. Therefore, an erroneous information bit pattern can be identified, to give up decoding to-be-decoded information corresponding to the information bit pattern. This reduces blind detection overheads of the decoder side.

Figure 14:
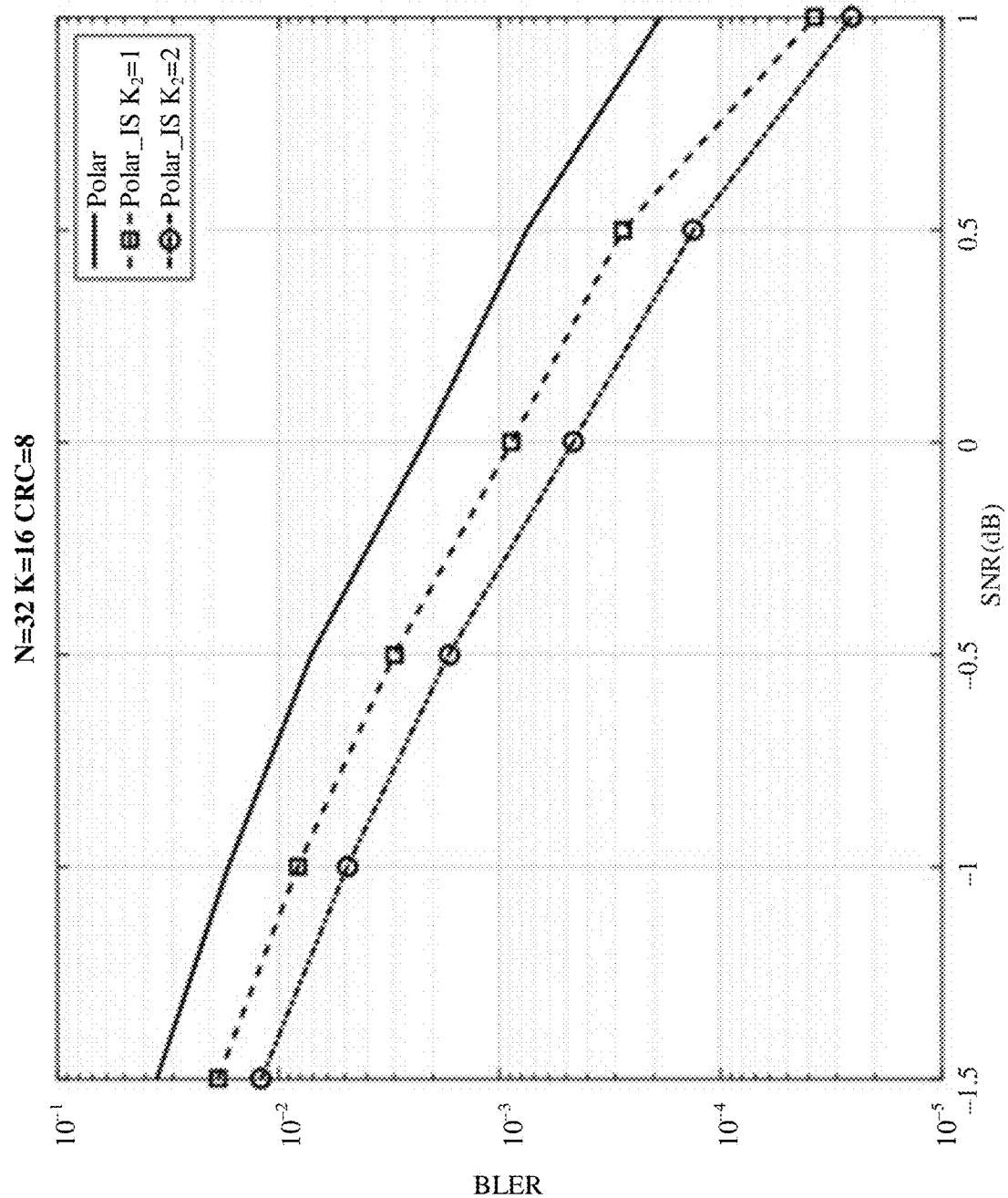
FIG. 14 is a diagram of a performance simulation result of a polar code for which N=32, K=16, and CRC=8 according to this application.
Figure 15:
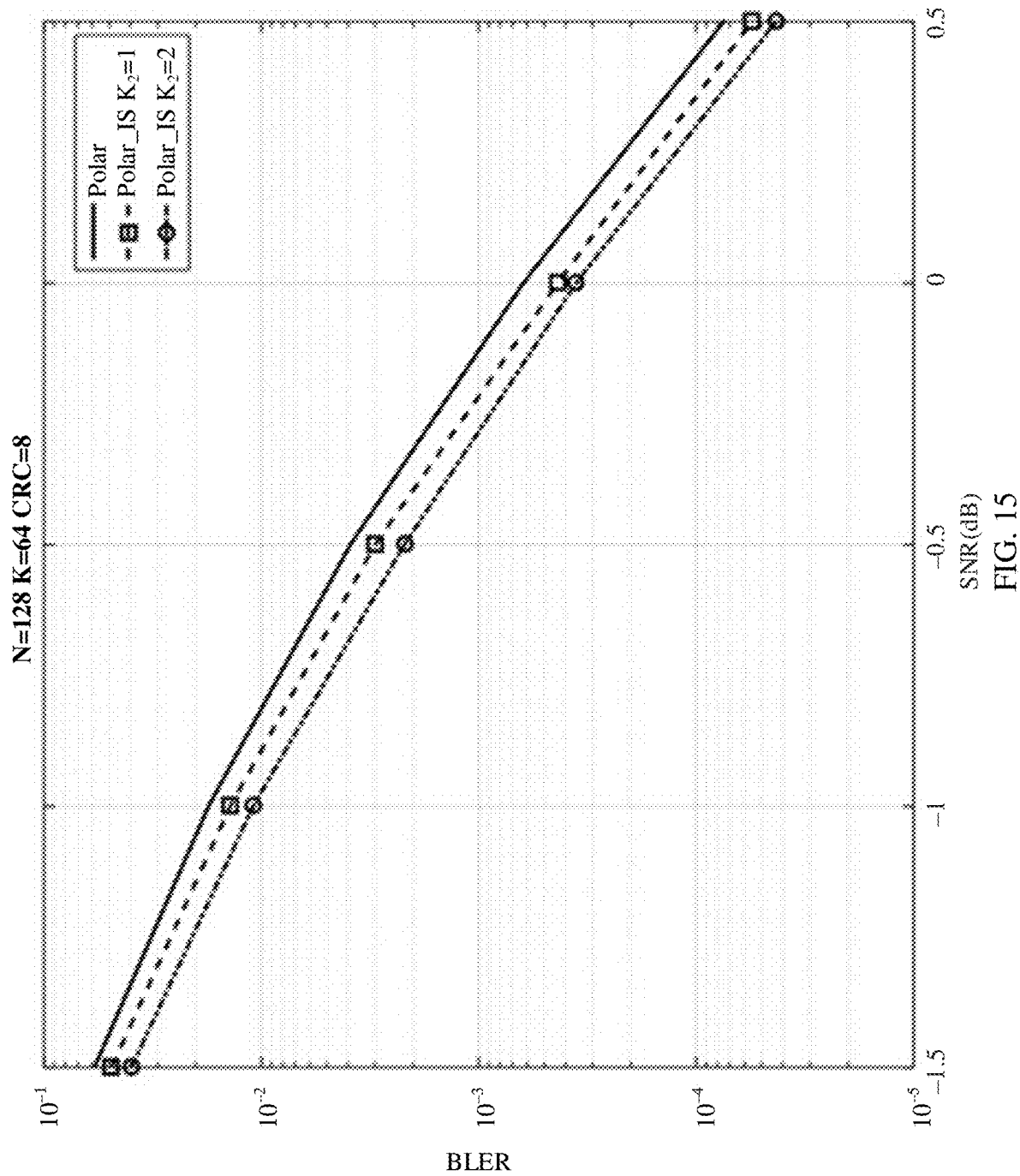
FIG. 15 is a diagram of a performance simulation result of a polar code for which N=128, K=64, and CRC=8 according to this application.
Figure 16:
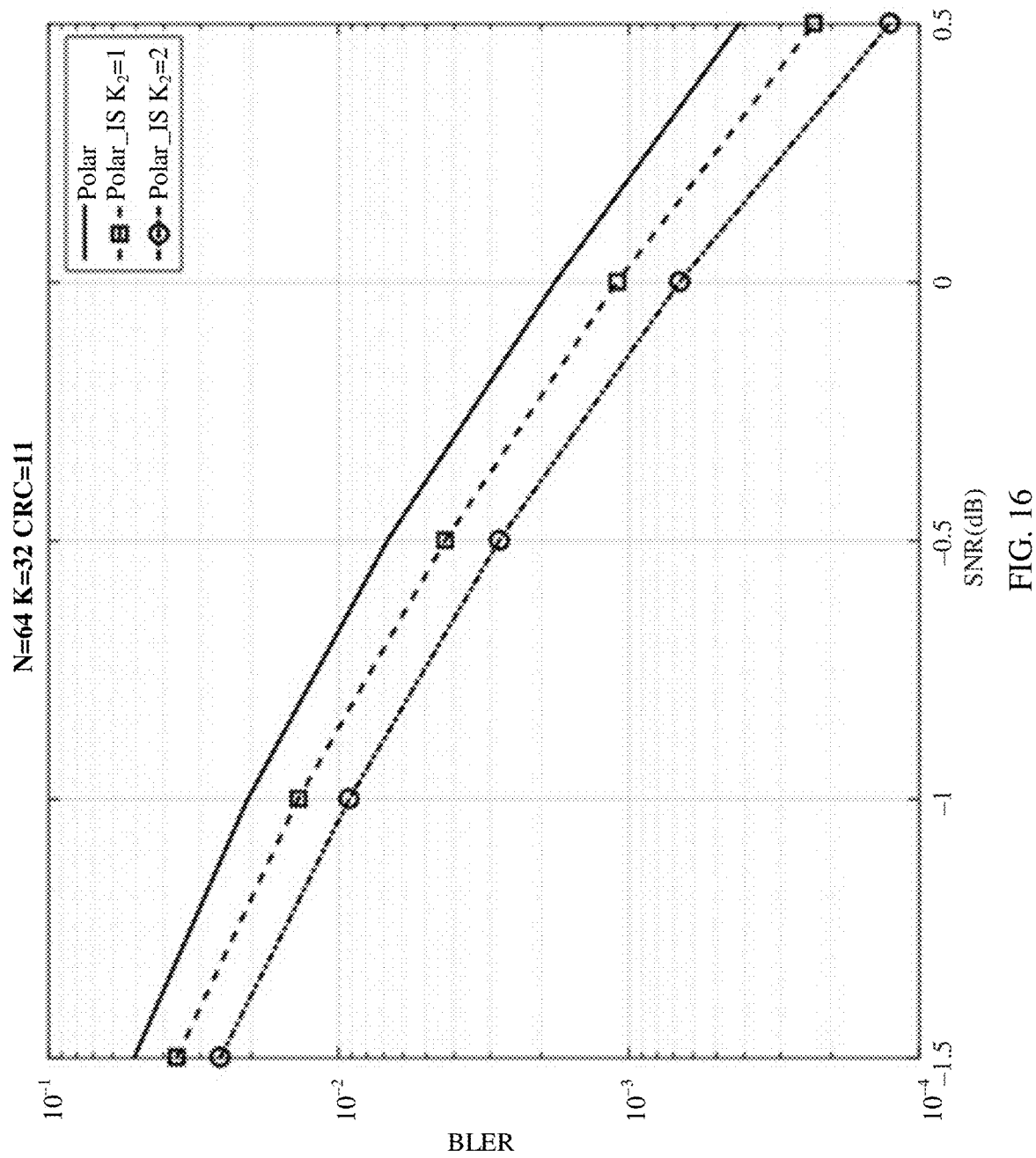
FIG. 16 is a diagram of a performance simulation result of a polar code for which N=64, K=32, and CRC=11 according to this application.
Figure 17:
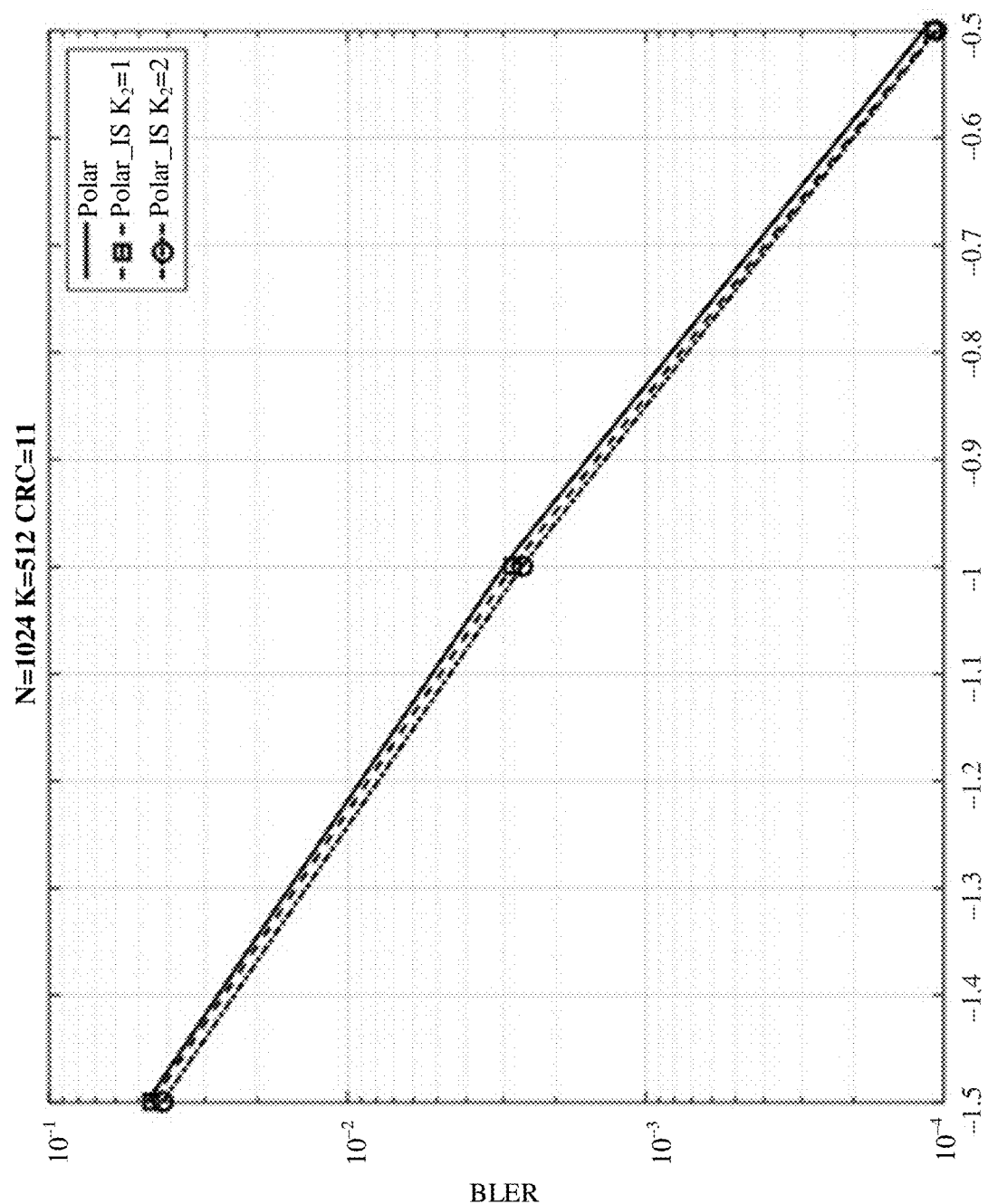
FIG. 17 is a diagram of a performance simulation result of a polar code for which N=1024, K=512, and CRC=11 according to this application.

FIG. 14 is a diagram of a performance simulation result of a polar code for which N=32, K=16, and CRC=8 according to this application. FIG. 15 is a diagram of a performance simulation result of a polar code for which N=128, K=64, and CRC=8 according to this application. FIG. 16 is a diagram of a performance simulation result of a polar code for which N=64, K=32, and CRC=11 according to this application. FIG. 17 is a diagram of a performance simulation result of a polar code for which N=1024, K=512, and CRC=11 according to this application. In each of FIG. 14 to FIG. 17, a case in which K2 is 1 or 2 compared with a conventional polar code solution is considered, and in a case of binary phase shift keying (BPSK) modulation and an additive white Gaussian noise (AWGN) channel, channels are arranged based on subchannel reliability in the standard TS38.212. A CA-SCL decoding algorithm is used as a decoding algorithm, and List=4. In the figures, "Polar" represents original polar code performance, and "Polar_IS" indicates that the technical solution proposed in this application is used. Decoding performance of a conventional polar code and decoding performance of a polar code in the solution of this application under a same control variable are compared. It can be learned from the figures that, under a same control variable, a polar code in the solution of this application has a lower block error rate, especially when a length of a codeword with (N, K) is comparatively small, an effect is more significant. Compared with a conventional polar code solution, the solution of this application provides better performance.

Figure 18:
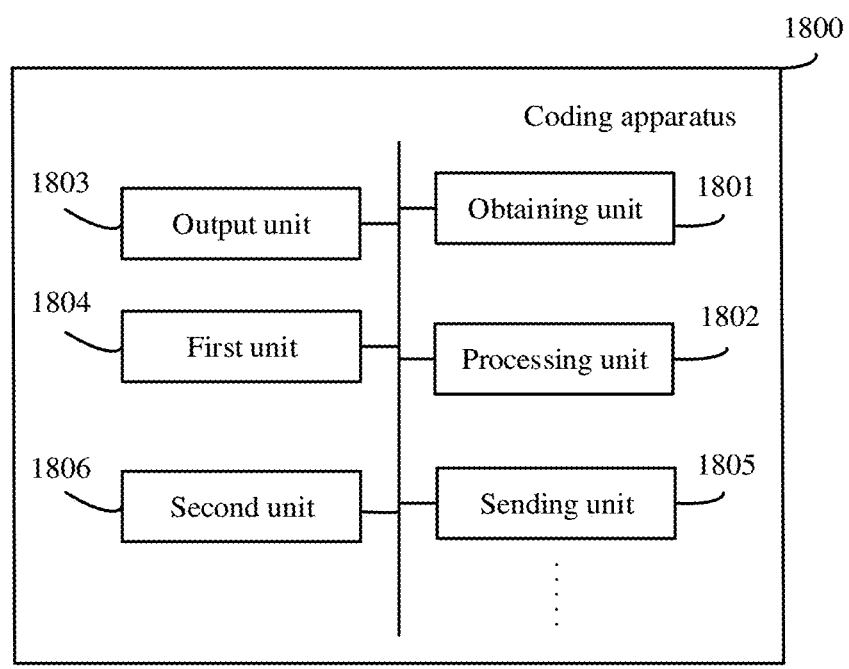
FIG. 18 is a schematic structural diagram of a coding apparatus 1800 according to this application.

FIG. 18 is a schematic structural diagram of a coding apparatus 1800 according to this application. The coding apparatus 1800 includes an obtaining unit 1801, configured to obtain K to-be-coded bits and an index set, where the index set includes indexes of K polar channels, a polar channel corresponding to K1 indexes in the index set is used to place K1 of the K to-be-coded bits, a polar channel corresponding to K2 indexes in the index set is used to place K2 preset bits, K=K1+K2, a value set of the K1 indexes or a value set of the K2 indexes is determined based on a value set of K2 of the K to-be-coded bits, and the value set of the K1 indexes and the value set of the K2 indexes are complementary sets of each other, a processing unit 1802, configured to perform polar coding on the K1 to-be-coded bits to obtain a polar-coded codeword, and an output unit 1803, configured to output the polar-coded codeword.

K, K1, and K2 are all integers, K is less than or equal to N, N is a length of the polar-coded codeword, and N is a positive integral power of 2.

Optionally, if a preset parameter meets a first condition, K2=0, or if a preset parameter meets a second condition, K2 is an integer greater than 0 and less than K. For details, refer to the foregoing embodiments.

Optionally, there are $2^{K2}$ value sets of the K2 of the K to-be-coded bits, and each value set of the K2 to-be-coded bits corresponds to at least one value set of the K1 indexes, or each value set of the K2 to-be-coded bits corresponds to at least one value set of the K2 indexes.

Optionally, K2=1 or K2=2.

Optionally, the K to-be-coded bits include M parity-check bits, and the K1 of the K to-be-coded bits include the M parity-check bits.

Optionally, the coding apparatus further includes a first unit 1804, configured to determine a value of an indication flag based on a value range of a preset parameter, where the indication flag is used to determine a value of K1 or a value of K2.

Specifically, the value of K2 or K1 is determined based on the indication flag, and each value of the indication flag corresponds to one or more values of K2, or each value of the indication flag corresponds to one or more values of K1.

Details are as follows.

When the indication flag is a first value, K2 is greater than 0, or K1 is less than K.

When the indication flag is a second value, K2=0 or K1=K.

Optionally, the coding apparatus further includes a sending unit 1805, configured to send the indication flag.

Optionally, the coding apparatus further includes a second unit 1806, configured to determine a value of K1 or K2 based on a value range of the preset parameter.

Optionally, the preset parameter includes a user equipment category. The user equipment category indicates an information processing capability of a terminal, and there is a correspondence between the user equipment category and K2.

Optionally, the preset parameter includes the length of the polar-coded codeword, a length of the to-be-coded bits, and a code rate.

Optionally, the K to-be-coded bits include a distributed CRC bit whose length is L, where L is a positive integer. A preset rule enables at least C CRC bits to check at least one of the K2 to-be-coded bits, and an index sequence number corresponding to the at least C CRC bits is less than a largest index sequence number in the set of the K indexes, where C is an integer greater than or equal to 1.

Specifically, a value of C indexes corresponding to a polar channel on which the at least C CRC bits are placed is less than a value of (L−C) indexes corresponding to a polar channel on which other (L−C) CRC bits are placed.

Optionally, the obtaining unit is further configured to obtain a first bit sequence, where the first bit sequence includes p sub-segments, and p is an integer greater than or equal to 2.

The $i^{th}$ sub-segment corresponds to Si to-be-coded bits, and the K to-be-coded bits are the Si to-be-coded bits of the $i^{th}$ sub-segment. K=Si, i is an integer greater than or equal to 2 and less than or equal to p, and Si is a positive integer.

Figure 19:
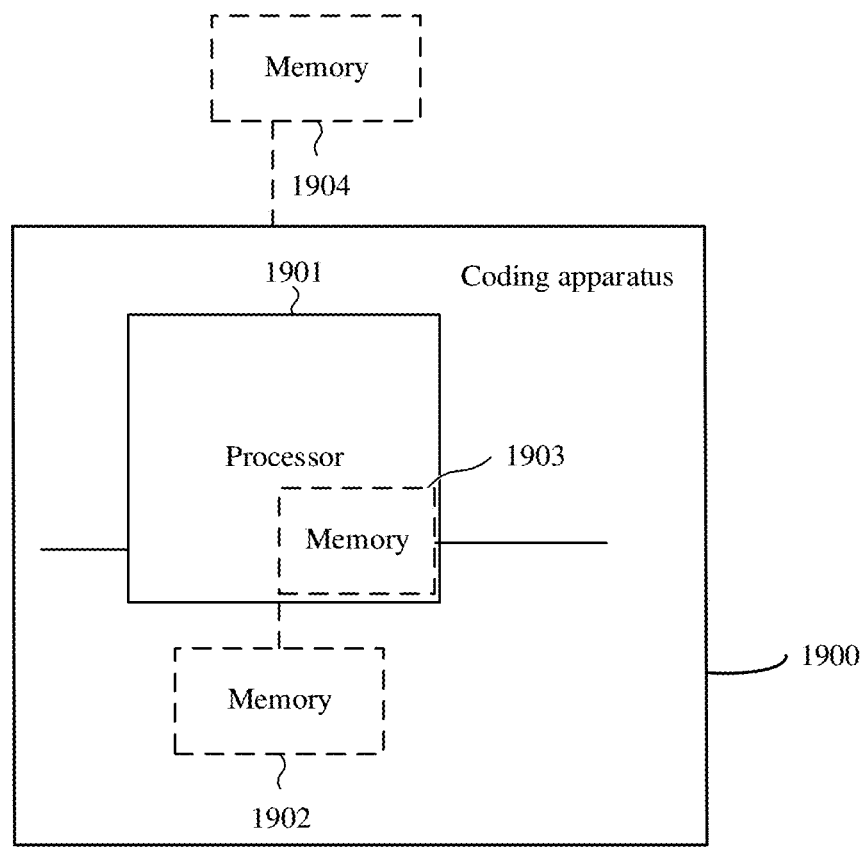
FIG. 19 is a schematic structural diagram of a coding apparatus 1900 according to this application.

Some or all of the polar coding methods in the foregoing embodiments may be implemented by hardware, or may be implemented by software. When software is used for implementation, FIG. 19 is a schematic structural diagram of another coding apparatus 1900 according to this application. The coding apparatus 1900 includes a processor 1901, configured to execute a program stored in a memory 1902, a memory 1903, or a memory 1904, where when the program is executed, the apparatus is enabled to perform the method in any one of the foregoing embodiments.

Alternatively, the memory 1902, the memory 1903, or the memory 1904 may store data generated or used in a process of performing the coding method by the processor. For example, the memory is a cache. The memory may be a physically independent unit, or may be a storage space or network disk on a cloud server, or the like.

Optionally, the memory 1902 is located in the apparatus.

Optionally, the memory 1903 is integrated with the processor 1901.

Optionally, the memory 1904 is located outside the apparatus.

The processor 1901 may be a central processing unit (central processing unit, CPU), a network processor (network processor, NP), or a combination of a CPU and an NP.

The processor 1901 may alternatively be a hardware chip, or may be an application-specific integrated circuit (application-specific integrated circuit, ASIC), a programmable logic device (programmable logic device, PLD), or a combination thereof. The PLD may be a complex programmable logic device (complex programmable logic device, CPLD), a field-programmable gate array (field-programmable gate array, FPGA), a generic array logic (generic array logic, GAL), or any combination thereof.

The memory (or storage unit) in this embodiment of this application may include a volatile memory, for example, a random access memory (RAM). The memory may alternatively include a non-volatile memory, for example, a flash memory, a hard disk drive (HDD) or a solid-state drive (SSD), a cloud storage (cloud storage), a network-attached storage (NAS), or a network disk (network disk). The memory may alternatively include a combination of the foregoing types of memories, or another medium or product that has a storage function and that is in any form.

Optionally, the apparatus is a base station or a terminal.

Optionally, the apparatus is a chip or an integrated circuit.

Figure 20:
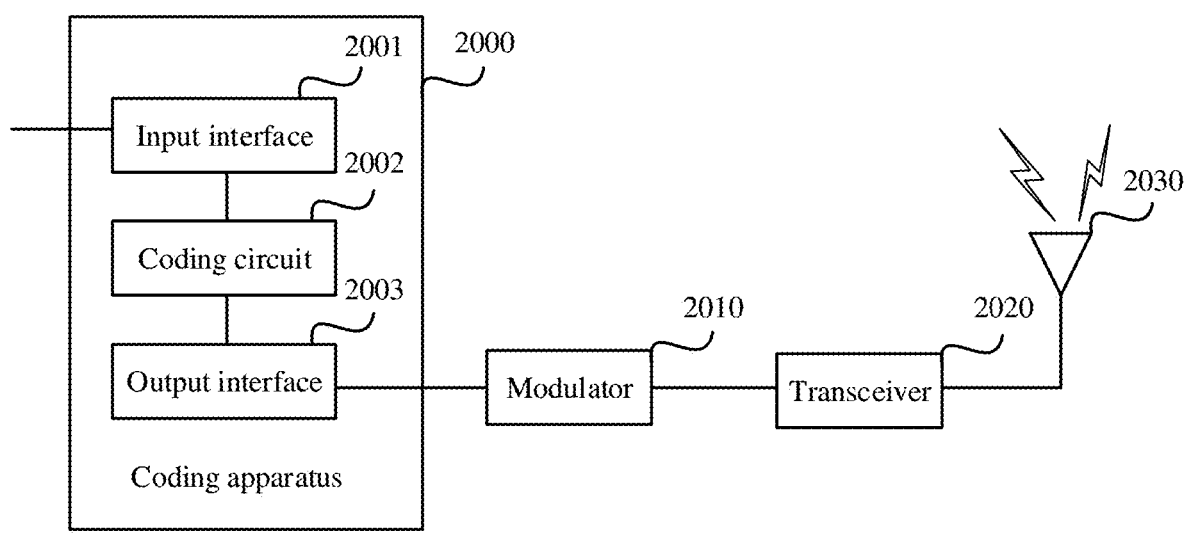
FIG. 20 is a schematic structural diagram of a coding apparatus 2000 according to this application.

When hardware is used for implementation, FIG. 20 is a schematic structural diagram of a coding apparatus 2000 according to this application. The coding apparatus 2000 includes an input interface 2001, configured to obtain K to-be-coded bits and an index set, where the index set includes indexes of K polar channels, a polar channel corresponding to K1 indexes in the index set is used to place K1 of the K to-be-coded bits, a polar channel corresponding to K2 indexes in the index set is used to place K2 preset bits, K=K1+K2, a value set of the K1 indexes or a value set of the K2 indexes is determined based on a value set of K2 of the K to-be-coded bits, and the value set of the K1 indexes and the value set of the K2 indexes are complementary sets of each other, a coding circuit 2002, configured to perform polar coding on the K1 to-be-coded bits to obtain a polar-coded codeword, and an output interface 2003, configured to output the polar-coded codeword.

K, K1, and K2 are all integers, K is less than or equal to N, N is a length of the polar-coded codeword, and N is a positive integral power of 2.

Optionally, if a preset parameter meets a first condition, K2=0, or if a preset parameter meets a second condition, K2 is an integer greater than 0 and less than K. For details, refer to the foregoing embodiments.

Optionally, there are $2^{K2}$ value sets of the K2 of the K to-be-coded bits, and each value set of the K2 to-be-coded bits corresponds to at least one value set of the K1 indexes, or each value set of the K2 to-be-coded bits corresponds to at least one value set of the K2 indexes.

Optionally, K2=1 or K2=2.

Optionally, the K to-be-coded bits include M parity-check bits, and the K1 of the K to-be-coded bits include the M parity-check bits.

Optionally, the circuit is further configured to determine a value of an indication flag based on a value range of a preset parameter, where the indication flag is used to determine a value of K1 or a value of K2.

Specifically, the value of K2 or K1 is determined based on the indication flag, and each value of the indication flag corresponds to one or more values of K2, or each value of the indication flag corresponds to one or more values of K1.

Details are as follows.

When the indication flag is a first value, K2 is greater than 0, or K1 is less than K.

When the indication flag is a second value, K2=0 or K1=K.

Optionally, the output interface is further configured to output the indication flag.

Optionally, the circuit is further configured to determine a value of K1 or K2 based on a value range of the preset parameter.

Optionally, the preset parameter includes a user equipment category. The user equipment category indicates an information processing capability of a terminal, and there is a correspondence between the user equipment category and K2.

Optionally, the preset parameter includes the length of the polar-coded codeword, a length of the to-be-coded bits, and a code rate.

Optionally, the K to-be-coded bits include a distributed CRC bit whose length is L, where L is a positive integer. A preset rule enables at least C CRC bits to check at least one of the K2 to-be-coded bits, and an index sequence number corresponding to the at least C CRC bits is less than a largest index sequence number in the set of the K indexes, where C is an integer greater than or equal to 1.

Specifically, a value of C indexes corresponding to a polar channel on which the at least C CRC bits are placed is less than a value of (L−C) indexes corresponding to a polar channel on which other (L−C) CRC bits are placed.

Optionally, the input interface is further configured to obtain a first bit sequence, where the first bit sequence includes p sub-segments, and p is an integer greater than or equal to 2.

The $i^{th}$ sub-segment corresponds to Si to-be-coded bits, and the K to-be-coded bits are the Si to-be-coded bits of the $i^{th}$ sub-segment. K=Si, i is an integer greater than or equal to 2 and less than or equal to p, and Si is a positive integer.

Further, a coded bit sequence output by the coding apparatus 2000 is modulated by a modulator 2010, and is then output to a transceiver 2020. The transceiver 2020 performs corresponding processing (including but not limited to processing such as digital-to-analog conversion and/or frequency conversion) on the modulated sequence, and then sends the processed sequence by using an antenna 2030.

Optionally, during specific implementation, the coding apparatus 2000 may be a chip or an integrated circuit, for example, a microprocessor, a DSP, or a baseband chip.

This application further provides a coding apparatus, and the coding apparatus includes a unit or means (means) configured to obtain K to-be-coded bits and an index set, where the index set includes indexes of K polar channels, a polar channel corresponding to K1 indexes in the index set is used to place K1 of the K to-be-coded bits, a polar channel corresponding to K2 indexes in the index set is used to place K2 preset bits, K=K1+K2, a value set of the K1 indexes or a value set of the K2 indexes is determined based on a value set of K2 of the K to-be-coded bits, and the value set of the K1 indexes and the value set of the K2 indexes are complementary sets of each other, a unit or means configured to perform polar coding on the K1 to-be-coded bits to obtain a polar-coded codeword, and a unit or means configured to output the polar-coded codeword.

K, K1, and K2 are all integers, K is less than or equal to N, N is a length of the polar-coded codeword, and N is a positive integral power of 2.

Optionally, there are $2^{K2}$ value sets of the K2 of the K to-be-coded bits, and each value set of the K2 to-be-coded bits corresponds to at least one value set of the K1 indexes, or each value set of the K2 to-be-coded bits corresponds to at least one value set of the K2 indexes.

Optionally, K2=1 or K2=2.

Optionally, the K to-be-coded bits include M parity-check bits, and the K1 of the K to-be-coded bits include the M parity-check bits.

Optionally, the coding apparatus further includes a unit or means configured to determine a value of an indication flag based on a value range of a preset parameter, where the indication flag is used to determine a value of K1 or a value of K2.

Specifically, the value of K2 or K1 is determined based on the indication flag, and each value of the indication flag corresponds to one or more values of K2, or each value of the indication flag corresponds to one or more values of K1.

Details are as follows.

When the indication flag is a first value, K2 is greater than 0, or K1 is less than K.

When the indication flag is a second value, K2=0 or K1=K.

Optionally, the coding apparatus further includes a unit or means configured to send the indication flag.

Optionally, the coding apparatus further includes a unit or means configured to determine a value of K1 or K2 based on a value range of the preset parameter.

Optionally, the preset parameter includes a user equipment category. The user equipment category indicates an information processing capability of a terminal, and there is a correspondence between the user equipment category and K2.

Optionally, the preset parameter includes the length of the polar-coded codeword, a length of the to-be-coded bits, and a code rate.

Optionally, the K to-be-coded bits include a distributed CRC bit whose length is L, where L is a positive integer. A preset rule enables at least C CRC bits to check at least one of the K2 to-be-coded bits, and an index sequence number corresponding to the at least C CRC bits is less than a largest index sequence number in the set of the K indexes, where C is an integer greater than or equal to 1.

Specifically, a value of C indexes corresponding to a polar channel on which the at least C CRC bits are placed is less than a value of (L−C) indexes corresponding to a polar channel on which other (L−C) CRC bits are placed.

Optionally, the coding apparatus further includes a unit or means configured to obtain a first bit sequence, where the first bit sequence includes p sub-segments, and p is an integer greater than or equal to 2. The $i^{th}$ sub-segment corresponds to Si to-be-coded bits, and the K to-be-coded bits are the Si to-be-coded bits of the $i^{th}$ sub-segment. K=Si, i is an integer greater than or equal to 2 and less than or equal to p, and Si is a positive integer.

Figure 21:
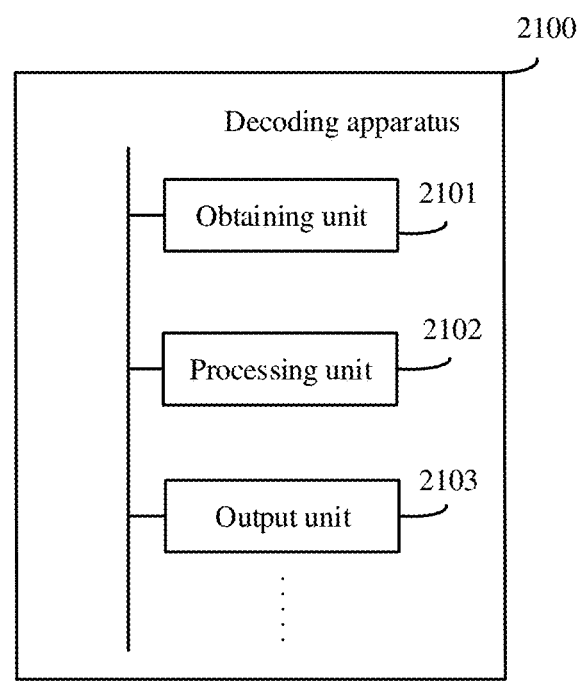
FIG. 21 is a schematic structural diagram of a decoding apparatus 2100 according to this application.

FIG. 21 is a schematic structural diagram of a decoding apparatus 2100 according to this application. The decoding apparatus 2100 includes an obtaining unit 2101, configured to obtain decoding information of K to-be-decoded bits and an index set, where the index set includes indexes of K polar channels, a polar channel corresponding to K1 indexes in the index set is used to carry K1 of the K to-be-decoded bits, a polar channel corresponding to K2 indexes in the index set is used to carry K2 preset bits, K=K1+K2, and the K1 indexes or the K2 indexes are determined based on a value of K2 of the K to-be-decoded bits, a processing unit 2102, configured to determine a decoding result of the K2 to-be-decoded bits based on the K1 indexes or the K2 indexes, where the processing unit 2102 is configured to perform polar decoding on decoding information of the K1 to-bedecoded bits to obtain a decoding result of the K1 to-be-decoded bits, and an output unit 2103, configured to output a decoding result, where the decoding result includes the decoding result of the K1 to-be-decoded bits and the decoding result of the K2 to-be-decoded bits.

Specifically, there are $2^{K2}$ value sets of the K2 of the K to-be-coded bits, and each value set of the K2 to-be-coded bits corresponds to at least one value set of the K1 indexes, or each value set of the K2 to-be-coded bits corresponds to at least one value set of the K2 indexes.

Optionally, K2=1 or K2=2.

Optionally, the K to-be-coded bits include M parity-check bits, and the K1 of the K to-be-coded bits include the M parity-check bits.

Optionally, a value of K1 or a value of K2 is determined based on a received indication flag. Each value of the indication flag corresponds to one or more values of K2, or each value of the indication flag corresponds to one or more values of K1.

Details are as follows.

When the indication flag is a first value, K2 is greater than 0, or K1 is less than K.

When the indication flag is a second value, K2=0 or K1=K.

Figure 22:
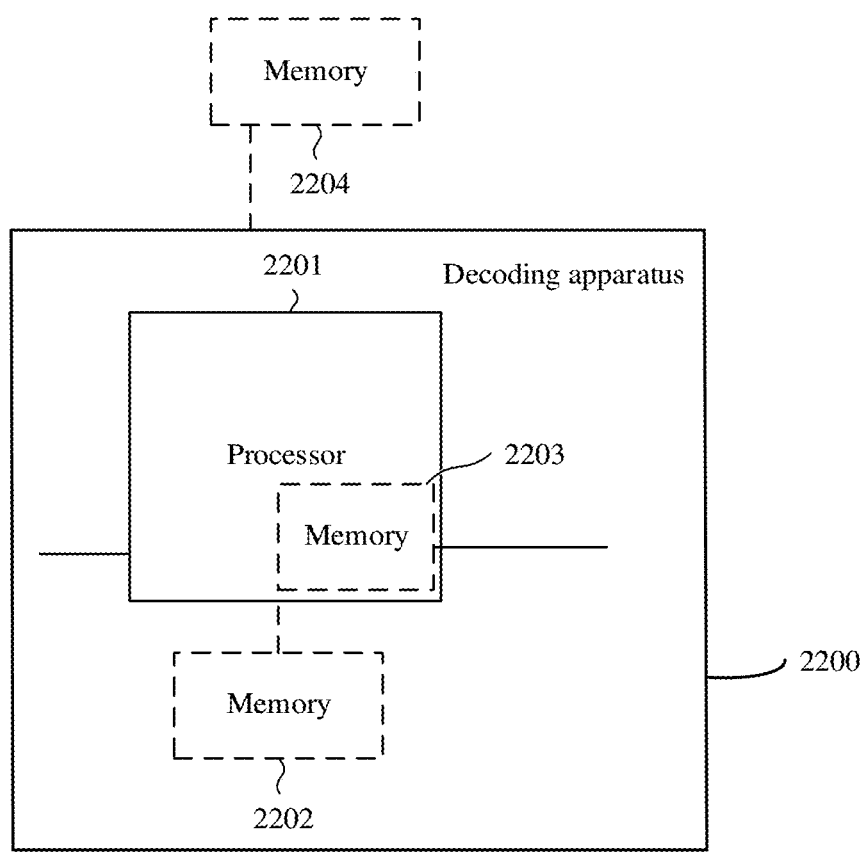
FIG. 22 is a schematic structural diagram of a decoding apparatus 2200 according to this application.

Some or all of the polar decoding methods in the foregoing embodiments may be implemented by hardware, or may be implemented by software. When software is used for implementation, FIG. 22 is a schematic structural diagram of another decoding apparatus 2200 according to this application. The decoding apparatus 2200 includes a processor 2201, configured to execute a program stored in a memory 2202, a memory 2203, or a memory 2204, where when the program is executed, the apparatus is enabled to perform the method in any one of the foregoing embodiments.

Alternatively, the memory 2202, the memory 2203, or the memory 2204 may store data generated or used in a process of performing the decoding method by the processor. For example, the memory is a cache. The memory may be a physically independent unit, or may be a storage space or network disk on a cloud server, or the like.

Optionally, the memory 2202 is located in the apparatus.

Optionally, the memory 2203 is integrated with the processor.

Optionally, the memory 2204 is located outside the apparatus.

The processor 2201 may be a central processing unit (CPU), a network processor (NP), or a combination of a CPU and an NP.

The processor 2201 may alternatively be a hardware chip, or may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory (or a storage unit) in this embodiment of this application may include a volatile memory, for example, a random access memory (RAM). The memory may also include a nonvolatile memory, for example, a flash memory, a hard disk drive (HDD), a solid-state drive (SSD), cloud storage, network attached storage (NAS), and a network drive. The memory may further include a combination of the foregoing types of memories or another medium or product, in any form, that has a storage function.

Optionally, the apparatus is a base station or a terminal.

Optionally, the apparatus is a chip or an integrated circuit.

An embodiment of this application further provides a communications system (not shown in the accompanying drawings), including any coding apparatus and any decoding apparatus provided in the embodiments of this application. The coding apparatus corresponds to a transmit end, and may be a base station or a terminal. The decoding apparatus corresponds to a receive end, and may be a terminal or a base station. For example, the communications system includes a base station used as a transmit end and a terminal used as a receive end. Alternatively, the communications system includes a base station used as a transmit end and another base station or another network device used as a receive end. Alternatively, the communications system includes a terminal used as a transmit end and another terminal used as a receive end. Alternatively, the communications system includes a terminal used as a transmit end, a base station used as a receive end, and the like.

An embodiment of this application further provides a computer-readable storage medium. The computer-readable storage medium stores computer program instructions. When the computer program instructions are executed by a computer, the method according to any one of the foregoing embodiments is implemented.

An embodiment of this application further provides a computer program product. When the computer program product is executed by a computer, the method according to any one of the foregoing embodiments is implemented.

This application provides a chip, including a memory and a processor. The memory is configured to store a computer program, and the processor is configured to invoke the computer program from the memory and run the computer program, to perform the method according to any one of the foregoing embodiments.

Optionally, the chip includes only a processor. The processor is configured to read and execute the computer program stored in the memory. When the computer program is executed, the processor performs the method according to any one of the foregoing embodiments.

Optionally, the memory and the processor may be units physically independent of each other, or the memory may be integrated with the processor.

An embodiment of this application farther provides a system chip. The system chip includes a processing unit and a communications unit. The processing unit may be, for example, a processor. The communications unit may be, for example, an input/output interface, a pin, a circuit, or the like. The processing unit may execute computer instructions, so that a chip in the communications apparatus performs any method provided in the foregoing embodiments of this application.

One or more of the foregoing modules or units may be implemented by software, hardware, or a combination thereof. When any one of the foregoing modules or units is implemented by software, the software exists in a form of computer program instructions, and is stored in a memory. The processor may be configured to execute the program instructions to implement the foregoing method procedures. The processor may include but is not limited to at least one of the following various computing devices that run software: a central processing unit (CPU), a microprocessor, a digital signal processor (DSP), a microcontroller unit (MCU), an artificial intelligence processor, or the like. Each computing device may include one or more cores configured to perform an operation or processing by executing software instructions. The processor may be embedded in an SoC (system-on-a-chip) or an application-specific integrated circuit (ASIC), or may be an independent semiconductor chip. In addition to the core configured to perform an operation or processing by executing software instructions, the processor may further include a necessary hardware accelerator, for example, a field programmable gate array (FPGA), a PLD (programmable logic device), or a logic circuit that implements a dedicated logic operation.

When the foregoing modules or units are implemented by hardware, the hardware may be any one or any combination of a CPU, a microprocessor, a DSP, an MCU, an artificial intelligence processor, an ASIC, an SoC, an FPGA, a PLD, a dedicated digital circuit, a hardware accelerator, or a non-integrated discrete device, and the hardware may run necessary software or does not depend on software to perform the foregoing method procedures.

Although this application is described with reference to specific features and the embodiments thereof, it is clear that various modifications and combinations may be made to them without departing from the scope of this application. Correspondingly, the specification and the accompanying drawings are merely example descriptions of this application defined by the appended claims, and are intended to cover any of or all modifications, variations, combinations, or equivalents within the scope of this application. Clearly, a person skilled in the art can make various modifications and variations to this application without departing from the spirit and scope of this application. In this way, this application is intended to cover these modifications and variations of this application provided that they fall within the scope of the claims of this application and equivalent technologies thereof.

What is claimed is:

1. A polar coding method, comprising:
    obtaining K to-be-coded bits and an index set, wherein the index set comprises indexes of K polar channels, wherein a polar channel corresponding to K1 indexes in the index set is associated with placement of K1 to-be-coded bits of the K to-be-coded bits, wherein a polar channel corresponding to K2 indexes in the index set is associated with placement of K2 preset bits, wherein K=K1+K2, wherein at least one of a value set of the K1 indexes or a value set of the K2 indexes is determined based on a value set of K2 to-be-coded bits of the K to-be-coded bits, and wherein the value set of the K1 indexes and the value set of the K2 indexes are complementary sets of each other;
    performing polar coding on the K1 to-be-coded bits to obtain a polar-coded codeword; and
    outputting the polar-coded codeword and wirelessly transmitting the outputted polar coded codeword, wherein K, K1, and K2 are all integers, K is less than or equal to N, N is a length of the polar-coded codeword, and N is a positive integral power of 2.

2. The method according to claim 1, wherein there are $2^{K2}$ value sets of the K2 to-be-coded bits of the K to-be-coded bits, and wherein each value set of the K2 to-be-coded bits corresponds to at least one value set of the K1 indexes, or each value set of the K2 to-be-coded bits corresponds to at least one value set of the K2 indexes.

3. The method according to claim 1, wherein the K to-be-coded bits comprise M parity-check bits, and wherein the K1 to-be-coded bits of the K to-be-coded bits comprise the M parity-check bits.

4. The method according to claim 1, further comprising:
    determining a value of K2 based on an indication flag S, wherein each value of the indication flag S corresponds to one or more values of K2.

5. The method according to claim 4, wherein the indication flag S is a first value, and wherein K2 is an integer greater than 0 and less than K.

6. The method according to claim 1, further comprising:
    obtaining a first bit sequence, wherein the first bit sequence comprises p sub-segments, and wherein p is an integer greater than or equal to 2;
    wherein an $i^{th}$ sub-segment of the first bit sequence corresponds to Si to-be-coded bits, wherein the K to-be-coded bits are the Si to-be-coded bits of the $i^{th}$ sub-segment, wherein K=Si, i is an integer greater than or equal to 2 and less than or equal to p, and Si is a positive integer.

7. The method according to claim 1, wherein the K2 indexes are K2 indexes that are in the index set and that correspond to a polar channel with comparatively low reliability.

8. The method according to claim 1, wherein K2=1 or K2=2.

9. A polar coding apparatus, comprising:
    a processor; and
    a non-transitory computer readable memory storing a program for execution by the processor, the program including instructions to:
        obtain K to-be-coded bits and an index set, wherein the index set comprises indexes of K polar channels, wherein a polar channel corresponding to K1 indexes in the index set is associated with placement of K1 to-be-coded bits of the K to-be-coded bits, wherein a polar channel corresponding to K2 indexes in the index set is associated with placement of K2 preset bits, wherein K=K1+K2, wherein at least one of a value set of the K1 indexes or a value set of the K2 indexes is determined based on a value set of K2 to-be-coded bits of the K to-be-coded bits, and wherein the value set of the K1 indexes and the value set of the K2 indexes are complementary sets of each other;
    perform polar coding on the K1 to-be-coded bits to obtain a polar-coded codeword; and
    output the polar-coded codeword and cause a transmitter to wirelessly transmit the outputted polar coded codeword, wherein K, K1, and K2 are all positive integers, K is less than or equal to N, N is a length of the polar-coded codeword, and N is a positive integral power of 2.

10. The apparatus according to claim 9, wherein there are $2^{K2}$ value sets of the K2 to-be-coded bits of the K to-be-coded bits, and wherein each value set of the K2 to-be-coded bits corresponds to at least one value set of the K1 indexes, or each value set of the K2 to-be-coded bits corresponds to at least one value set of the K2 indexes.

11. The coding apparatus according to claim 9, wherein program further includes instructions to determine a value of K1 based on an indication flag S, wherein each value of the indication flag S corresponds to one or more values of K1.

12. The coding apparatus according to claim 11, wherein the indication flag S is a first value, and wherein K2 is an integer greater than 0 and less than K.

13. The coding apparatus according to claim 9, wherein the program further includes instructions to obtain a first bit sequence, wherein the first bit sequence comprises p sub-segments, and p is an integer greater than or equal to 2; and
    wherein an $i^{th}$ sub-segment of the first bit sequence corresponds to Si to-be-coded bits, wherein the K to-be-coded bits are the Si to-be-coded bits of the $i^{th}$ sub-segment, wherein K=Si, i is an integer greater than or equal to 2 and less than or equal to p, and Si is a positive integer.

14. The coding apparatus according to claim 9, wherein K2=1 or K2=2.

15. A coding apparatus, comprising:
an input interface circuit, configured to obtain K to-be-coded bits and an index set, wherein the index set comprises indexes of K polar channels, wherein a polar channel corresponding to K1 indexes in the index set is associated with placement of K1 to-be-coded bits of the K to-be-coded bits, a polar channel corresponding to K2 indexes in the index set is associated with placement of K2 preset bits, wherein K=K1+K2, wherein a value set of at least one of the K1 indexes or a value set of the K2 indexes is determined based on a value set of K2 to-be-coded bits of the K to-be-coded bits, and wherein the value set of the K1 indexes and the value set of the K2 indexes are complementary sets of each other;
a coding circuit, configured to perform polar coding on the K1 to-be-coded bits to obtain a polar-coded codeword; and
an output interface circuit, configured to output the polar-coded codeword and cause a transmitter to wirelessly transmit the outputted polar coded codeword, wherein K, K1, and K2 are all positive integers, K is less than or equal to N, N is a length of the polar-coded codeword, and N is a positive integral power of 2.

16. The coding apparatus according to claim 15, wherein there are $2^{K2}$ value sets of the K2 to-be-coded bits of the K to-be-coded bits, and wherein each value set of the K2 to-be-coded bits corresponds to at least one value set of the K1 indexes, or each value set of the K2 to-be-coded bits corresponds to at least one value set of the K2 indexes.

17. The coding apparatus according to claim 15, wherein the coding circuit is further configured to determine a value of K1 based on an indication flag S, wherein each value of the indication flag S corresponds to one or more values of K1.

18. The coding apparatus according to claim 17, wherein the indication flag S is a first value, and wherein K2 is an integer greater than 0 and less than K.

19. The coding apparatus according to claim 15, wherein the input interface circuit is further configured to obtain a first bit sequence, wherein the first bit sequence comprises p sub-segments, and wherein p is an integer greater than or equal to 2; and
wherein an $i^{th}$ sub-segment of the first bit sequence corresponds to Si to-be-coded bits, the K to-be-coded bits are the Si to-be-coded bits of the $i^{th}$ sub-segment, K=Si, i is an integer greater than or equal to 2 and less than or equal to p, and Si is a positive integer.

20. The coding apparatus according to claim 15, wherein K2=1 or K2=2.

* * * * *